United States Patent
Komatsu et al.

[19]

[11] Patent Number: 6,125,424

[45] Date of Patent: *Sep. 26, 2000

[54] METHOD OF WRITING, ERASING, AND CONTROLLING MEMORY AND MEMORY DEVICE HAVING ERASING AND MOVING COMPONENTS

[75] Inventors: Shinpei Komatsu; Yumi Ishii; Tomohiro Hayashi; Shogo Shibazaki, all of Yokohama; Hiroyuki Itoh, Kawasaki; Masaru Takehara, Yokohama, all of Japan

[73] Assignee: Fujitsu Limited, Kawasaki, Japan

[*] Notice: This patent is subject to a terminal disclaimer.

[21] Appl. No.: 09/010,795

[22] Filed: Jan. 22, 1998

Related U.S. Application Data

[63] Continuation of application No. 08/292,213, Aug. 19, 1994, Pat. No. 5,802,551.

[30] Foreign Application Priority Data

Oct. 1, 1993 [JP] Japan ................................. 5-246547

[51] Int. Cl.⁷ .................................................. G06F 13/00
[52] U.S. Cl. .............................................................. 711/103
[58] Field of Search ................................................ 711/103

[56] References Cited

U.S. PATENT DOCUMENTS

| | | | |
|---|---|---|---|
| 5,341,339 | 8/1994 | Wells | 365/185.11 |
| 5,357,475 | 10/1994 | Hasbun et al. | 711/103 |
| 5,437,020 | 7/1995 | Wells | 714/6 |
| 5,459,850 | 10/1995 | Clay et al. | 711/171 |
| 5,473,753 | 12/1995 | Wells et al. | 714/5 |
| 5,479,633 | 12/1995 | Wells et al. | 711/103 |
| 5,802,551 | 9/1998 | Komatsu et al. | 711/103 |

FOREIGN PATENT DOCUMENTS

| | | |
|---|---|---|
| 62-283496 | 12/1987 | Japan . |
| 62-283497 | 12/1987 | Japan . |

*Primary Examiner*—David L. Robertson
*Attorney, Agent, or Firm*—Staas & Halsey, LLP

[57] ABSTRACT

Data transferred from a host computer to a memory device is written into sectors whose addresses in a memory area are decoded by a decode table. Old data to be updated by the above data is erased or marked with erase flags. At a predetermined point of time, in order to create free areas, necessary data is evacuated to a primary memory media and unnecessary data indicated by erase flags is erased by a unit of predetermined memory size. Part of the memory media which has become defective is marked with a defect flag, and is replaced by an alternate area. In doing so, the decode table is rewritten to rearrange the memory area.

29 Claims, 56 Drawing Sheets

FIG.10E

| BLOCK1 | BLOCK2 | BLOCK3 | BLOCK4 | BLOCK5 | BLOCK6 |
|---|---|---|---|---|---|
| A | G |  |  | O | H |
| B | ERASABLE |  |  | I | J |
| ERASABLE | ERASABLE |  |  | K | L |
| ERASABLE | C |  |  | M | N |
| E | D |  |  |  |  |
| F | ERASABLE |  |  |  |  |

FIG.10F

| BLOCK1 | BLOCK2 | BLOCK3 | BLOCK4 | BLOCK5 | BLOCK6 |
|---|---|---|---|---|---|
| A | G |  |  | O | H |
| B | ERASABLE |  |  | I | J |
| ERASABLE | ERASABLE |  |  | K | L |
| ERASABLE | ERASABLE |  |  | M | N |
| E | ERASABLE |  |  | C |  |
| F | ERASABLE |  |  | D |  |

FIG.10G

| BLOCK1 | BLOCK2 | BLOCK3 | BLOCK4 | BLOCK5 | BLOCK6 |
|---|---|---|---|---|---|
| A | G | | | O | ERASABLE |
| B | ERASABLE | | | ERASABLE | J |
| ERASABLE | ERASABLE | | | K | L |
| ERASABLE | ERASABLE | | | M | N |
| E | ERASABLE | | | C | H |
| F | ERASABLE | | | D | I |

FIG.10H

| BLOCK1 | BLOCK2 | BLOCK3 | BLOCK4 | BLOCK5 | BLOCK6 |
|---|---|---|---|---|---|
| A | | G | J | O | |
| B | | L | N | ERASABLE | |
| ERASABLE | | H | I | K | |
| ERASABLE | | | | M | |
| E | | | | C | |
| F | | | | D | |

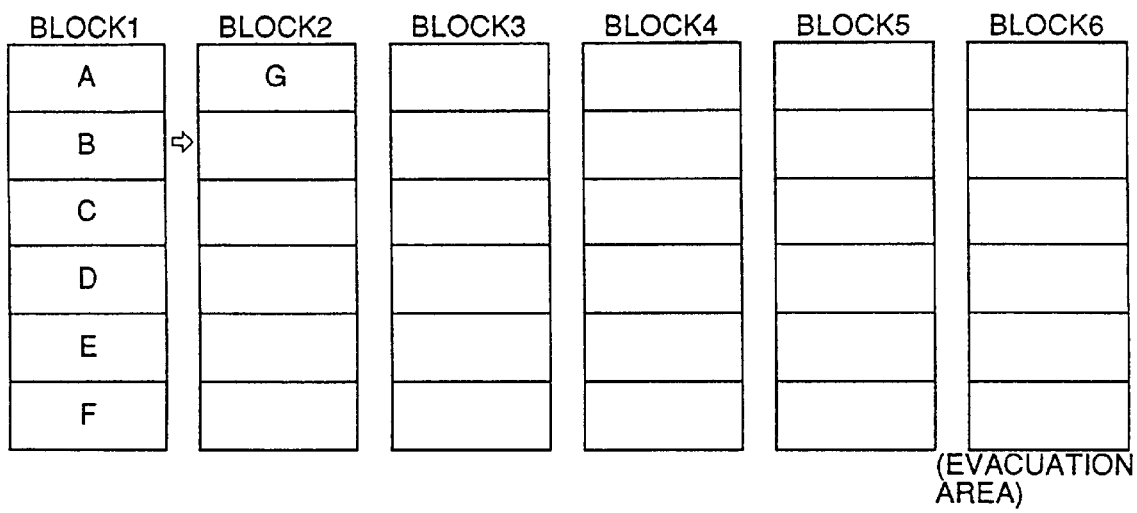
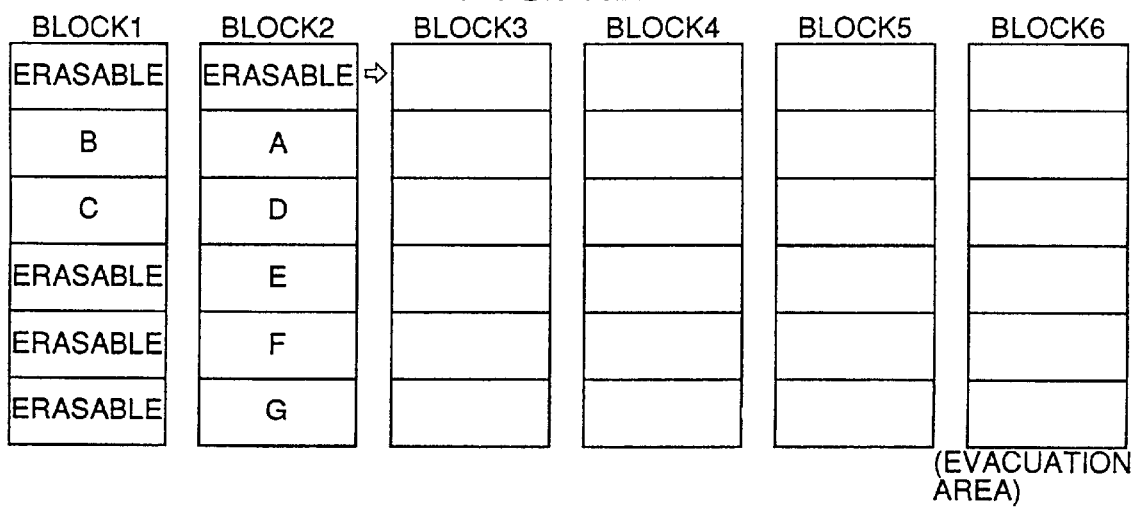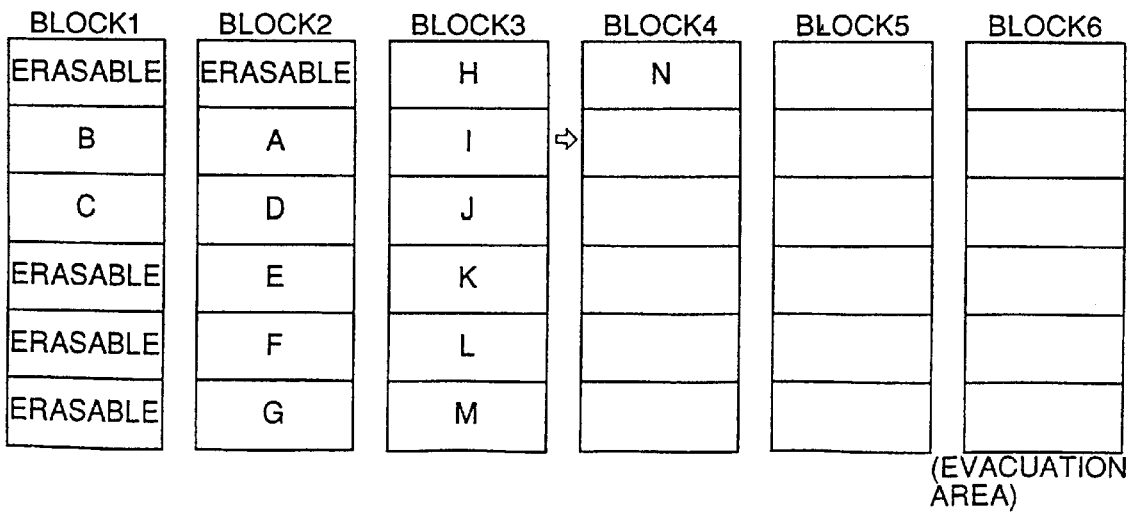

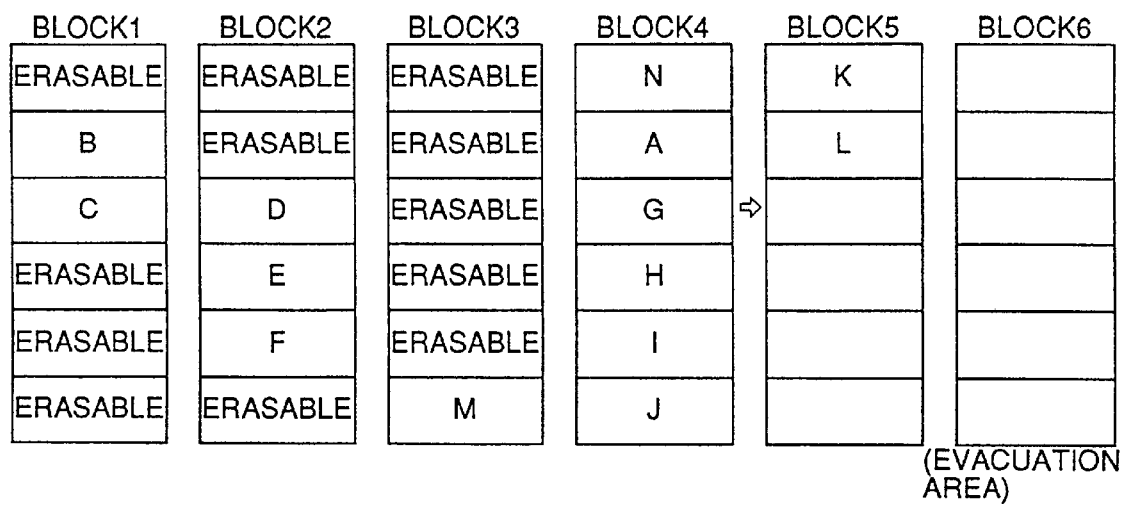
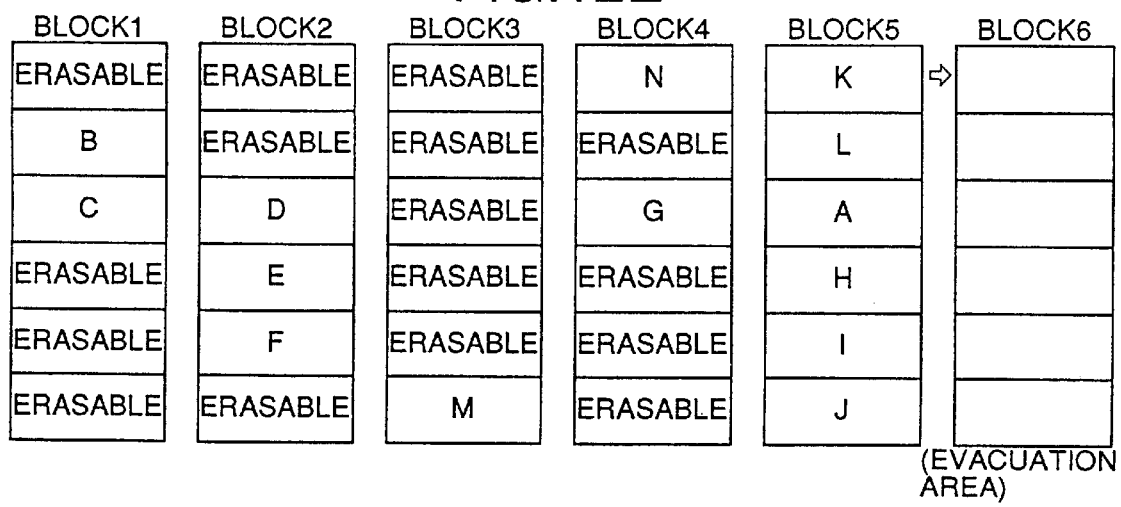
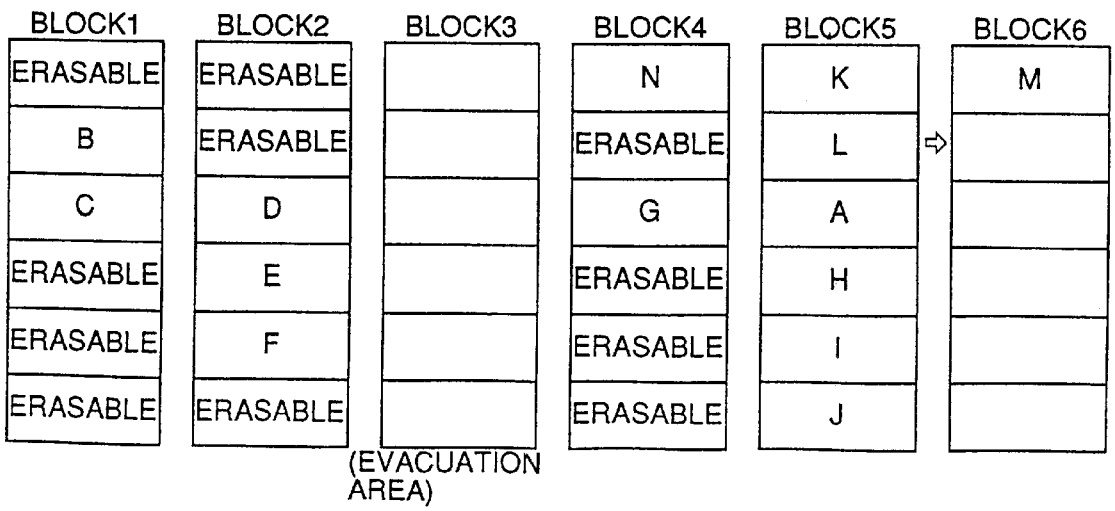

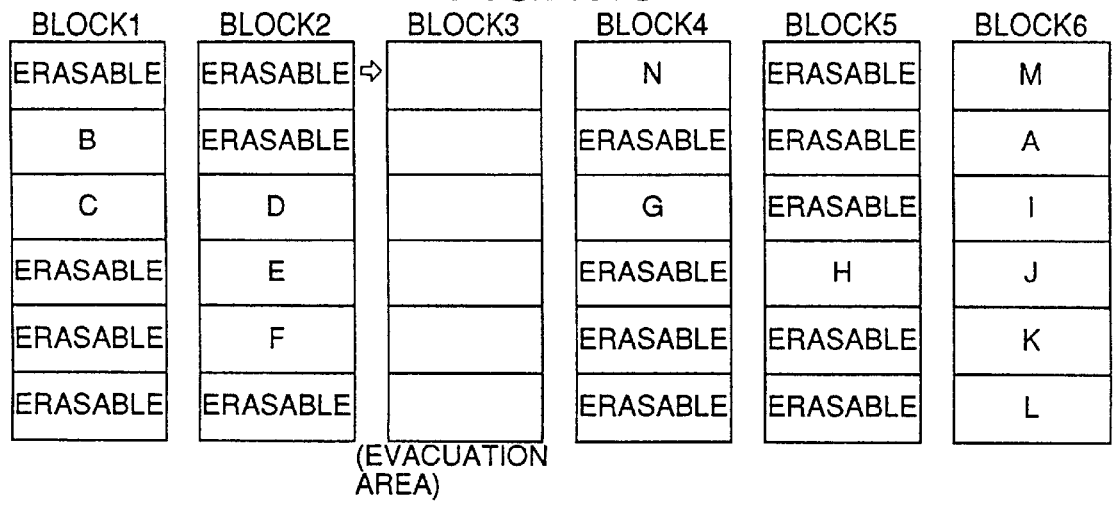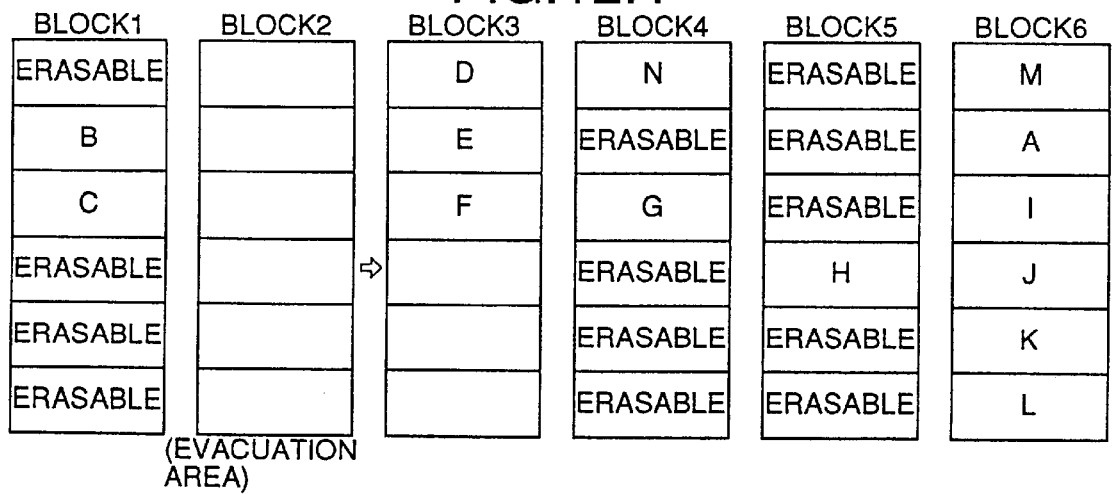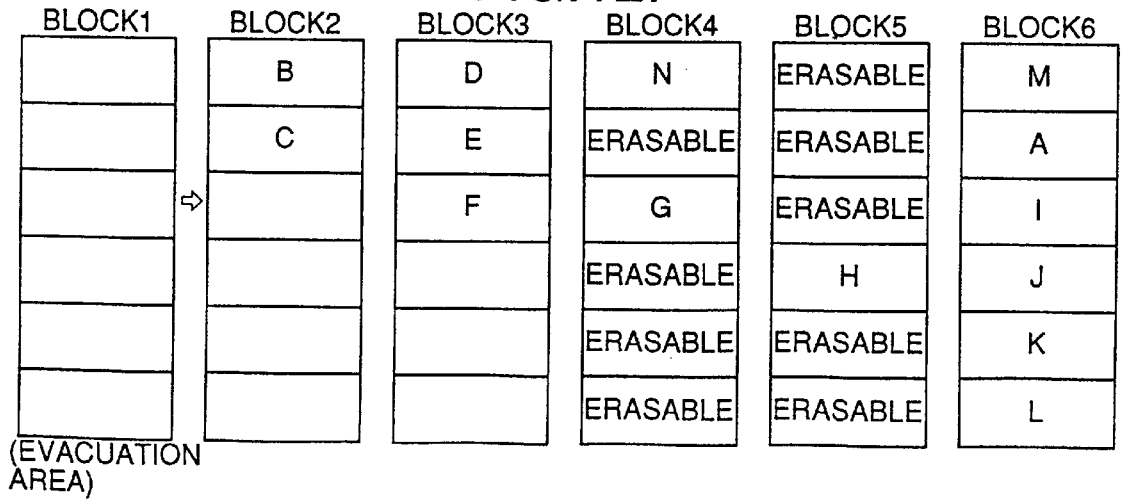

FIG.14A

| BLOCK0 | BLOCK1 | BLOCK2 | BLOCK3 | BLOCK4 | BLOCK5 | BLOCK6 |
|---|---|---|---|---|---|---|
|  | A | G |  |  |  |  |
|  | B |  |  |  |  |  |
|  | C |  |  |  |  |  |
|  | D |  |  |  |  |  |
|  | E |  |  |  |  |  |
|  | F |  |  |  |  |  |

(BACKUP AREA)     (EVACUATION AREA)

FIG.14B

| BLOCK0 | BLOCK1 | BLOCK2 | BLOCK3 | BLOCK4 | BLOCK5 | BLOCK6 |
|---|---|---|---|---|---|---|
|  | ERASABLE | ERASABLE |  |  |  |  |
|  | B | A |  |  |  |  |
|  | C | D |  |  |  |  |
|  | ERASABLE | E |  |  |  |  |
|  | ERASABLE | F |  |  |  |  |
|  | ERASABLE | G |  |  |  |  |

(BACKUP AREA)     (EVACUATION AREA)

FIG.14C

| BLOCK0 | BLOCK1 | BLOCK2 | BLOCK3 | BLOCK4 | BLOCK5 | BLOCK6 |
|---|---|---|---|---|---|---|
|  | ERASABLE | ERASABLE | H | N |  |  |
|  | B | A | I |  |  |  |
|  | C | D | J |  |  |  |
|  | ERASABLE | E | K |  |  |  |
|  | ERASABLE | F | L |  |  |  |
|  | ERASABLE | G | M |  |  |  |

(BACKUP AREA)     (EVACUATION AREA)

FIG.14D

| BLOCK0 | BLOCK1 | BLOCK2 | BLOCK3 | BLOCK4 | BLOCK5 | BLOCK6 |
|---|---|---|---|---|---|---|
|  | ERASABLE | ERASABLE | ERASABLE | N | K |  |
|  | B | ERASABLE | ERASABLE | A | L |  |
|  | C | D | ERASABLE | G |  |  |
|  | ERASABLE | E | ERASABLE | H |  |  |
|  | ERASABLE | F | ERASABLE | I |  |  |
|  | ERASABLE | G | M | J |  |  |

(BACKUP AREA)      (EVACUATION AREA)

FIG.14E

| BLOCK0 | BLOCK1 | BLOCK2 | BLOCK3 | BLOCK4 | BLOCK5 | BLOCK6 |
|---|---|---|---|---|---|---|
|  | ERASABLE | ERASABLE | ERASABLE | N | K |  |
|  | B | ERASABLE | ERASABLE | ERASABLE | L |  |
|  | C | D | ERASABLE | G | A |  |
|  | ERASABLE | E | ERASABLE | ERASABLE | H |  |
|  | ERASABLE | F | ERASABLE | ERASABLE | I |  |
|  | ERASABLE | ERASABLE | M | ERASABLE | J |  |

(BACKUP AREA)      (EVACUATION AREA)

FIG.14F

| BLOCK0 (BACKUP AREA) | BLOCK1 | BLOCK2 (EVACUATION AREA) | BLOCK3 | BLOCK4 | BLOCK5 | BLOCK6 |
|---|---|---|---|---|---|---|
|  | ERASABLE | ERASABLE |  | N | K | M |
|  | B | ERASABLE |  | ERASABLE | L |  |
|  | C | D |  | G | A |  |
|  | ERASABLE | E |  | ERASABLE | H |  |
|  | ERASABLE | F |  | ERASABLE | I |  |
|  | ERASABLE | ERASABLE |  | ERASABLE | J |  |

FIG.14G

| BLOCK0 (BACKUP AREA) | BLOCK1 | BLOCK2 (EVACUATION AREA) | BLOCK3 | BLOCK4 | BLOCK5 | BLOCK6 |
|---|---|---|---|---|---|---|
|  | ERASABLE | ERASABLE |  | N | ERASABLE | M |
|  | B | ERASABLE |  | ERASABLE | ERASABLE | A |
|  | C | D |  | G | ERASABLE | I |
|  | ERASABLE | E |  | ERASABLE | H | J |
|  | ERASABLE | F |  | ERASABLE | ERASABLE | K |
|  | ERASABLE | ERASABLE |  | ERASABLE | ERASABLE | L |

FIG.14H

| BLOCK0 (BACKUP AREA) | BLOCK1 | BLOCK2 | BLOCK3 | BLOCK4 (EVACUATION AREA) | BLOCK5 | BLOCK6 |
|---|---|---|---|---|---|---|
|  | ERASABLE | ERASABLE | H | N |  | M |
|  | B | ERASABLE |  | ERASABLE |  | A |
|  | C | D |  | G |  | I |
|  | ERASABLE | E |  | ERASABLE |  | J |
|  | ERASABLE | F |  | ERASABLE |  | K |
|  | ERASABLE | ERASABLE |  | ERASABLE |  | L |

FIG. 14I

| BLOCK0 | BLOCK1 | BLOCK2 | BLOCK3 | BLOCK4 | BLOCK5 | BLOCK6 |
|---|---|---|---|---|---|---|
| B | | ERASABLE | H | N | | M |
| C | | ERASABLE | | ERASABLE | | A |
| | | D | | G | | I |
| | | E | | ERASABLE | | J |
| | | F | | ERASABLE | | K |
| | | ERASABLE | | ERASABLE | | L |
| (BACKUP AREA) | (EVACUATION AREA) | | | | (UNABLE TO BE USED) | |

FIG. 14J

| BLOCK0 | BLOCK1 | BLOCK2 | BLOCK3 | BLOCK4 | BLOCK5 | BLOCK6 |
|---|---|---|---|---|---|---|
| | | ERASABLE | H | N | | M |
| | | ERASABLE | B | ERASABLE | | A |
| | | D | C | G | | I |
| | | E | | ERASABLE | | J |
| | | F | | ERASABLE | | K |
| | | ERASABLE | | ERASABLE | | L |
| (BACKUP AREA) | (EVACUATION AREA) | | | | (UNABLE TO BE USED) | |

FIG. 14K

| BLOCK0 | BLOCK1 | BLOCK2 | BLOCK3 | BLOCK4 | BLOCK5 | BLOCK6 |
|---|---|---|---|---|---|---|
| | | ERASABLE | H | ERASABLE | | ERASABLE |
| | | ERASABLE | B | ERASABLE | | ERASABLE |
| | | D | C | G | | I |
| | | E | A | ERASABLE | | J |
| | | F | M | ERASABLE | | K |
| | | ERASABLE | N | ERASABLE | | L |
| (BACKUP AREA) | (EVACUATION AREA) | | | | (UNABLE TO BE USED) | |

FIG.14L

| BLOCK0 | BLOCK1 | BLOCK2 | BLOCK3 | BLOCK4 | BLOCK5 | BLOCK6 |
|---|---|---|---|---|---|---|
|  | G | ERASABLE | H |  |  | ERASABLE |
|  |  | ERASABLE | B |  |  | ERASABLE |
|  |  | D | C |  |  | I |
|  |  | E | A |  |  | J |
|  |  | F | M |  |  | K |
|  |  | ERASABLE | N |  |  | L |
| (BACKUP AREA) |  |  |  | (EVACUATION AREA) | (UNABLE TO BE USED) |  |

FIG.14M

| BLOCK0 | BLOCK1 | BLOCK2 | BLOCK3 | BLOCK4 | BLOCK5 | BLOCK6 |
|---|---|---|---|---|---|---|
|  | ERASABLE | ERASABLE | ERASABLE |  |  | ERASABLE |
|  | A | ERASABLE | B |  |  | ERASABLE |
|  | G | D | C |  |  | I |
|  | H | E | ERASABLE |  |  | J |
|  | O | F | M |  |  | K |
|  | P | ERASABLE | N |  |  | L |
| (BACKUP AREA) |  |  |  | (EVACUATION AREA) | (UNABLE TO BE USED) |  |

FIG.14N

| BLOCK0 | BLOCK1 | BLOCK2 | BLOCK3 | BLOCK4 | BLOCK5 | BLOCK6 |
|---|---|---|---|---|---|---|
|  | ERASABLE |  | ERASABLE | D |  | ERASABLE |
|  | A |  | B | E |  | ERASABLE |
|  | G |  | C | F |  | I |
|  | H |  | ERASABLE |  |  | J |
|  | O |  | M |  |  | K |
|  | P |  | N |  |  | L |
| (BACKUP AREA) |  | (EVACUATION AREA) |  |  | (UNABLE TO BE USED) |  |

FIG.14O

| BLOCK0 | BLOCK1 | BLOCK2 | BLOCK3 | BLOCK4 | BLOCK5 | BLOCK6 |
|---|---|---|---|---|---|---|
| B | ERASABLE | | | D | | ERASABLE |
| C | A | | | E | | ERASABLE |
| M | G | | | F | | I |
| N | H | | | | | J |
| | O | | | | | K |
| | P | | | | | L |
| (BACKUP AREA) | | (UNABLE TO BE USED) | (EVACUATION AREA) | | (UNABLE TO BE USED) | |

FIG.14P

| BLOCK0 | BLOCK1 | BLOCK2 | BLOCK3 | BLOCK4 | BLOCK5 | BLOCK6 |
|---|---|---|---|---|---|---|
| B | ERASABLE | | K | D | | |
| C | A | | L | E | | |
| M | G | | | F | | |
| N | H | | | | | |
| I | O | | | | | |
| J | P | | | | | |
| (BACKUP AREA) | | (UNABLE TO BE USED) | | | (UNABLE TO BE USED) | (EVACUATION AREA) |

FIG.14Q

| BLOCK0 | BLOCK1 | BLOCK2 | BLOCK3 | BLOCK4 | BLOCK5 | BLOCK6 |
|---|---|---|---|---|---|---|
| ERASABLE | ERASABLE |  | K | D |  |  |
| ERASABLE | A |  | L | E |  |  |
| ERASABLE | G |  | B | F |  |  |
| ERASABLE | H |  | C |  |  |  |
|  | O |  | M |  |  |  |
|  | P |  | N |  |  |  |
| (BACKUP AREA) |  | (UNABLE TO BE USED) |  |  | (UNABLE TO BE USED) | (EVACUATION AREA) |

FIG.14R

| BLOCK0 | BLOCK1 | BLOCK2 | BLOCK3 | BLOCK4 | BLOCK5 | BLOCK6 |
|---|---|---|---|---|---|---|
|  | ERASABLE |  | K | D |  |  |
|  | A |  | L | E |  |  |
|  | G |  | B | F |  |  |
|  | H |  | C | I |  |  |
|  | O |  | M | J |  |  |
|  | P |  | N |  |  |  |
| (BACKUP AREA) |  | (UNABLE TO BE USED) |  |  | (UNABLE TO BE USED) | (EVACUATION AREA) |

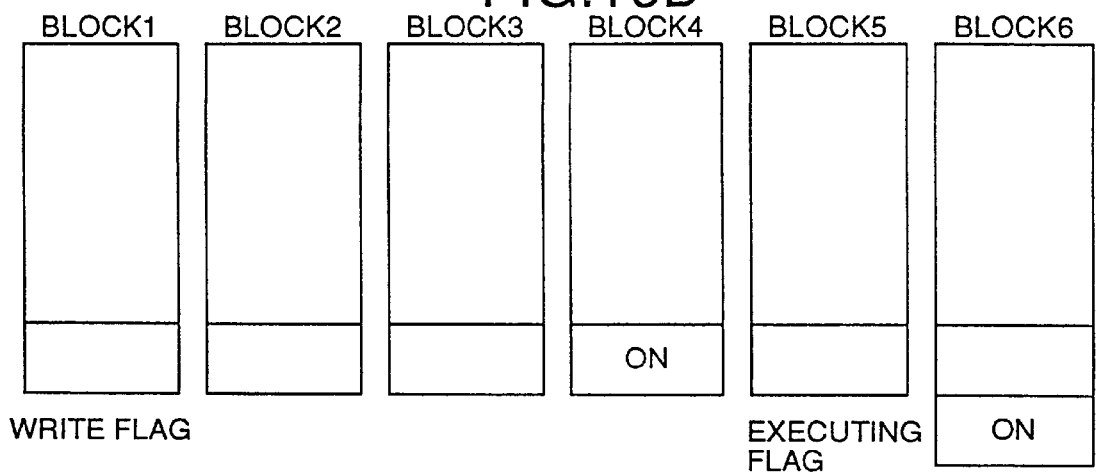
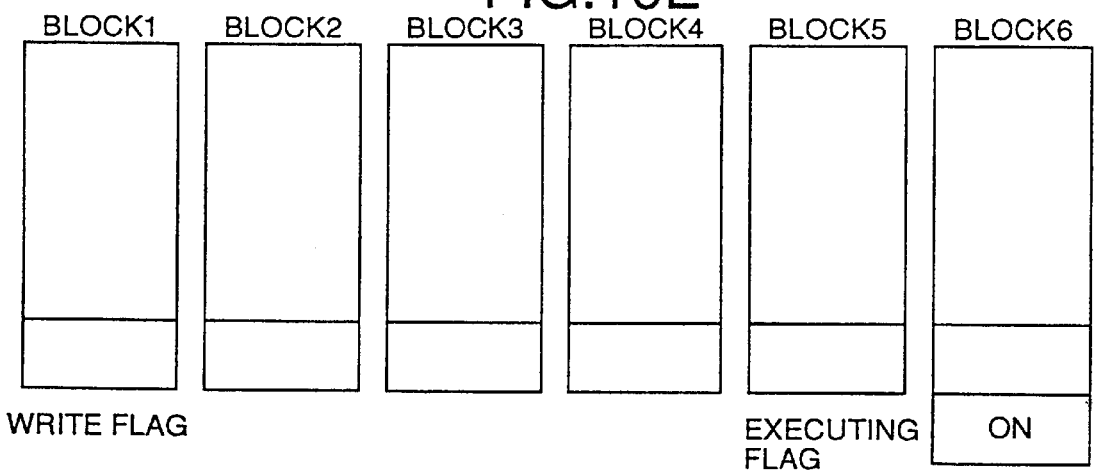
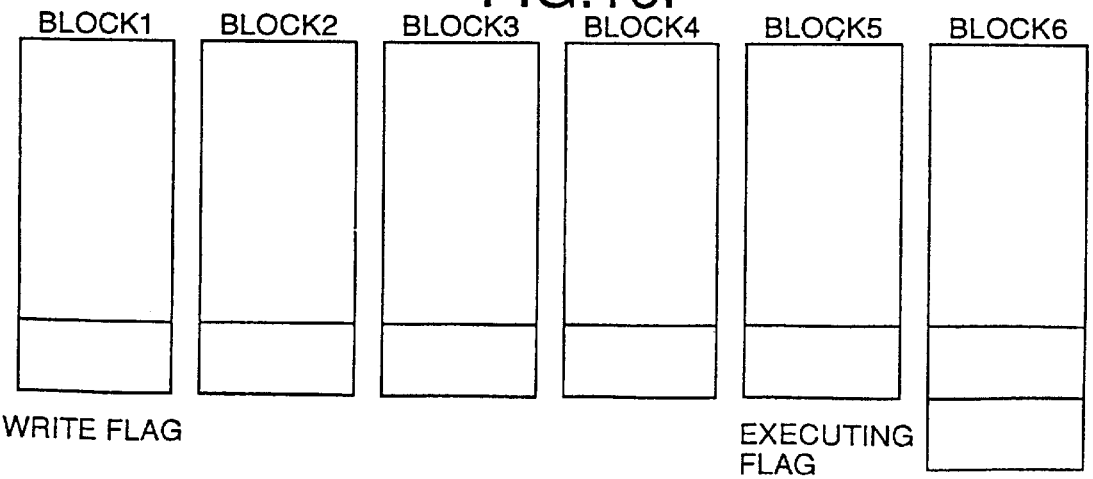

FIG.28A
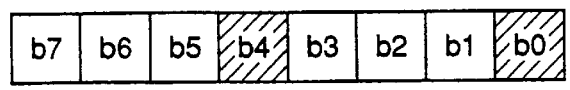
FIG.28B
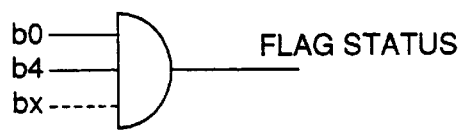
FIG.28C
|   | b4 | b0 | OUTPUT |
|---|----|----|--------|
| 1 | 0  | 0  | 0      |
| 2 | 0  | 1  | 0      | ← b0 OF PERMANENT HIGH LEVEL
| 3 | 1  | 0  | 0      | ← b4 OF PERMANENT HIGH LEVEL
| 4 | 1  | 1  | 1      |

FIG.31A

| CHIP NO.00 | | | | | | | | | | | | |
|---|---|---|---|---|---|---|---|---|---|---|---|---|
| WORK01 | WORK02 | WORK03 | WORK04 | | | | | | | | .. | |

| CHIP NO.01 | | | | | | | | | | | | |
|---|---|---|---|---|---|---|---|---|---|---|---|---|
| WORK01 | WORK02 | WORK03 | WORK04 | | | | | | | | .. | |

| CHIP NO.02 | | | | | | | | | | | | |
|---|---|---|---|---|---|---|---|---|---|---|---|---|
| WORK01 | WORK02 | WORK03 | WORK04 | | | | | | | | .. | |

| CHIP NO.03 | | | | | | | | | | | | |
|---|---|---|---|---|---|---|---|---|---|---|---|---|
| WORK01 | WORK02 | WORK03 | WORK04 | | | | | | | | .. | |

| CHIP NO.04 | | | | | | | | | | | | |
|---|---|---|---|---|---|---|---|---|---|---|---|---|
| WORK01 | WORK02 | WORK03 | WORK04 | | | | | | | | .. | |

FIG.31B

| CHIP NO.00 | 000~007SEC | WORK02 | WORK03 | WORK04 | WORK01 | | | | | | .. | |
|---|---|---|---|---|---|---|---|---|---|---|---|---|

| CHIP NO.01 | 008~015SEC | WORK02 | WORK03 | WORK04 | WORK01 | | | | | | .. | |
|---|---|---|---|---|---|---|---|---|---|---|---|---|

| CHIP NO.02 | 016~023SEC | WORK02 | WORK03 | WORK04 | WORK01 | | | | | | .. | |
|---|---|---|---|---|---|---|---|---|---|---|---|---|

| CHIP NO.03 | 024~031SEC | WORK02 | WORK03 | WORK04 | WORK01 | | | | | | .. | |
|---|---|---|---|---|---|---|---|---|---|---|---|---|

| CHIP NO.04 | 032~039SEC | WORK02 | WORK03 | WORK04 | WORK01 | | | | | | .. | |
|---|---|---|---|---|---|---|---|---|---|---|---|---|

FIG.31C

CHIP NO.00

| 000~007SEC | 120~127SEC | 160~167SEC | WORK04 | WORK01 | WORK02 | WORK03 | | | | .. | |

CHIP NO.01

| 008~015SEC | 128~135SEC | 168~175SEC | WORK04 | WORK01 | WORK02 | WORK03 | | | | .. | |

CHIP NO.02

| 016~023SEC | 136~143SEC | 176~183SEC | WORK04 | WORK01 | WORK02 | WORK03 | | | | .. | |

CHIP NO.03

| 024~031SEC | 144~151SEC | 184~191SEC | WORK04 | WORK01 | WORK02 | WORK03 | | | | .. | |

CHIP NO.04

| 032~039SEC | 152~159SEC | WORK03 | WORK04 | WORK01 | WORK02 | | | | | .. | |

FIG.31D

| CHIP NO.00 | CHIP NO.01 | CHIP NO.02 | CHIP NO.03 | CHIP NO.04 |
|---|---|---|---|---|
| WORK04 | 008~015SEC | 016~023SEC | 024~031SEC | 032~039SEC |
| 120~127SEC | 128~135SEC | 136~143SEC | 144~151SEC | 152~159SEC |
| 160~167SEC | 168~175SEC | 176~183SEC | 184~191SEC | WORK03 |
| 000~007SEC | WORK04 | WORK04 | WORK04 | WORK04 |
| WORK01 | WORK01 | WORK01 | WORK01 | WORK01 |
| WORK02 | WORK02 | WORK02 | WORK02 | WORK02 |
| WORK03 | WORK03 | WORK03 | WORK03 | |

FIG.31E

| CHIP NO.00 | 120~127SEC | 160~167SEC | 000~007SEC | WORK01 | WORK02 | WORK03 | WORK04 | | | | .. | |

| CHIP NO.01 | 008~015SEC | 128~135SEC | 168~175SEC | WORK01 | WORK02 | WORK03 | WORK04 | | | | .. | |

| CHIP NO.02 | 016~023SEC | 136~143SEC | 176~183SEC | WORK01 | WORK02 | WORK03 | WORK04 | | | | .. | |

| CHIP NO.03 | 024~031SEC | 144~151SEC | 184~191SEC | WORK01 | WORK02 | WORK03 | WORK04 | | | | .. | |

| CHIP NO.04 | 032~039SEC | 152~159SEC | WORK01 | WORK02 | WORK03 | WORK04 | | | | | .. | |

METHOD OF WRITING, ERASING, AND CONTROLLING MEMORY AND MEMORY DEVICE HAVING ERASING AND MOVING COMPONENTS

Continuation of prior application Ser. No: 08/292,213, filed Aug. 19, 1994 now U.S. Pat. No. 5,802,551.

BACKGROUND OF THE INVENTION

1. Field of the Invention

The present invention relates to a method of controlling the writing and erasing of information in flash memories and the like used as an external storage device for personal computers. This type of memory is incapable of having information written over existing information.

2. Description of the Prior Art

In recent years, there has been wide attention on external storage devices which use flash memory. The flash memory does not require a backup power supply because of its non-volatile characteristic, can be rewritten electrically, and, also, is inexpensive. However, the flash memory has shortcomings as follows.

First, it is impossible to write information over existing information. Also, it is impossible to erase information by the unit of byte, but possible by the unit of sector, block, or chip. Thus, a rewrite can not be done byte by byte as in the conventional memory so that the rewriting speed as well as the erasing speed is relatively slow compared to the reading speed.

Second, there is a limit in the number of erasures that the flash memory can tolerate, and a typical flash memory can not be used after a hundred thousand to one million erasures. Thus, areas which experience a larger number of erasures become defective faster than other areas so that the total area available for storing information decreases unless the numbers of erasures are roughly averaged across all the sectors or all the blocks, whichever is used as the unit of erasing.

Since the flash memory has shortcomings as listed above, various counter measures should be taken in using the flash memory, which are ranging from preparing an evacuation area and evacuating data at the time of rewriting, providing a control table for controlling the writing and erasing of information, to preparing a way to save the situation when defective sectors or defective blocks are generated.

As described above, the flash memory has such advantages as a non-volatile characteristic and electrical rewrite capability, but also has many inadequacies as well, so that those inadequacies must be surmounted before using it for a practical purpose.

Accordingly, there is a need in the flash memory field for a method of writing, erasing, and controlling a memory so that those shortcomings are obviated to facilitate use of flash memory for practical purposes.

SUMMARY OF THE INVENTION

Accordingly, it is a general object of the present invention to provide a method of writing, erasing, and controlling a flash memory, which method satisfies the need described above.

It is another and more specific object of the present invention to provide an efficient method of writing, erasing, and controlling a memory for a memory device whose memory can not write information over existing information and can not erase information by the unit of byte.

It is yet another object of the present invention to provide a method of writing, erasing, and controlling the memory, which method can average the numbers of erasures all over the memory area.

In order to achieve those objects, a method of writing and erasing data in a memory device with a memory area having a plurality of blocks each with a plurality of sectors, with the memory device erasing data by the unit of one block, comprises the steps of selecting a first predetermined number of blocks from a top of a first list in which the blocks are ranked in a descending order of a number of necessary sectors in each of the blocks, selecting a second predetermined number of blocks from a top of a second list in which the blocks are ranked in a ascending order of a number of necessary sectors in each of the blocks, and evacuating the necessary sectors from the first predetermined number of blocks and a second predetermined number of blocks to other blocks which have free sectors.

It is still another object of the present invention to provide a method of writing, erasing, and controlling the memory, which method can increase its writing speed.

In order to achieve this object, a management method of writing data in a memory device with a memory area having a plurality of sectors unable to be overwritten, with a memory device erasing data by the unit of one sector, comprises the steps of providing at least two sectors for each sector number, writing data into one of the two sectors, the noted one being a free sector, and erasing data in the other sector of the two sectors simultaneously with the step of writing data, if there is data in the other sector.

It is a further object of the present invention to provide a method of writing, erasing, and controlling the memory, by a method which can increase the reliability of the memory management.

It is a yet further object of the present invention to provide a method of writing, erasing, and controlling the memory, by a method which can provide a counter measure when defective areas are generated.

In order to achieve those objects, a method of managing a memory device with a memory area having a possibility that part of the memory area is destroyed, and having a decoder able to be rewritten for indicating locations where data is stored in the memory area, comprises the steps of arranging two decoders in a series to form the decoder, and rewriting at least one of the two decoders when part of the memory area or part of the two decoders is destroyed, so that this part of the memory area or this part of the two decoders is not accessed.

Other objects and further features of the present invention will be apparent from the following detailed description when read in conjunction with the accompanying drawings.

BRIEF DESCRIPTION OF THE DRAWINGS

FIGS. 10A to 10J are illustrative drawings showing an embodiment of averaging the numbers of erasures according to the present invention;

FIGS. 12A to 12L are illustrative drawings showing an embodiment of erasing unnecessary data according to the present invention;

FIGS. 14A to 14R are illustrative drawings showing an embodiment of creating a free area according to the present invention;

FIGS. 16A to 16F are illustrative drawings showing an embodiment of a erasing process according to the present invention;

FIGS. 28A to 28C are illustrative drawings showing a first embodiment of a flag check process;

FIGS. 31A to 31E are illustrative drawings showing an embodiment of reducing the size of a management table.

DESCRIPTION OF THE PREFERRED EMBODIMENTS

In the rest of the description, the following topics will be described in the following order: A. Structure of System Serving as Basis for Present Invention, B. Writing/Erasing Process for Data Evacuation and Free Area Creation, C. Enhancement of Erasing Process, D. Enhancement of Writing Speed and Allocation of Backup Areas in Case of Defect Sectors, E. Enhancement of Reliability of Decoding Unit for Address Conversion, F. Process of Estimating Writing Time, G. Enhancement of Reliability of Flag Check Process, and H. Memory Management Method of Reducing Size of Management Table.

A. Structure of System Serving as Basis for Present Invention

Figure 1:
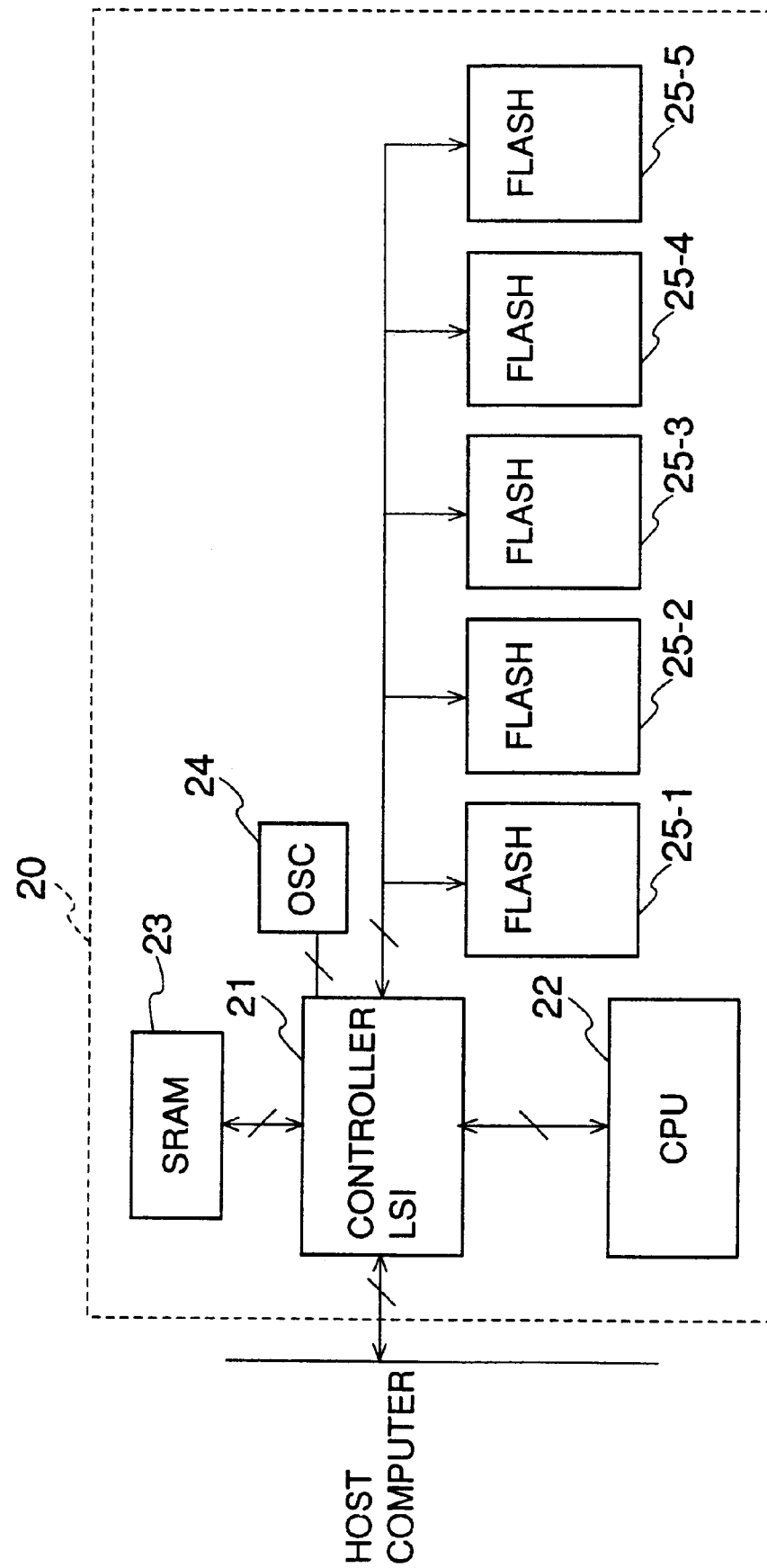
FIG. 1 is a block diagram showing a structure of a memory device serving as a basis for the present invention.

FIG. 1 is a block diagram showing the structure of a memory device 20 which uses flash memories and serves as a basis of the present invention.

In FIG. 1, a memory device 20 such as a memory card comprises a control LSI (Large Scale Integrated Circuit) 21, a processor 22 for controlling the rewriting and erasing of data, a SRAM (Static Random Access Memory) 23 for storing various types of tables and serving as a data evacuation buffer at the time of writing data, a clock generator 24, and flash memories 25-1 to 25-5. The memory device is connected to a host computer.

In FIG. 1, when the data transferred from the host computer to the SRAM 23 is written to the flash memories 25-1 to 25-5, the data should be written to a vacant area because the flash memories 25-1 to 25-5 can not write information over existing information. Thus, such a measure should be taken as putting up an erase flag on old data whose new data has been written into a vacant area. When erase flags are used, contents of the memory are cleaned up and put in order by evacuating data having no erase flags to the evacuation area of the SRAM 23 by the unit of a predetermined size, erasing the areas of the memory to which data is to be written, and writing the evacuated data back to the memory.

Figure 2:
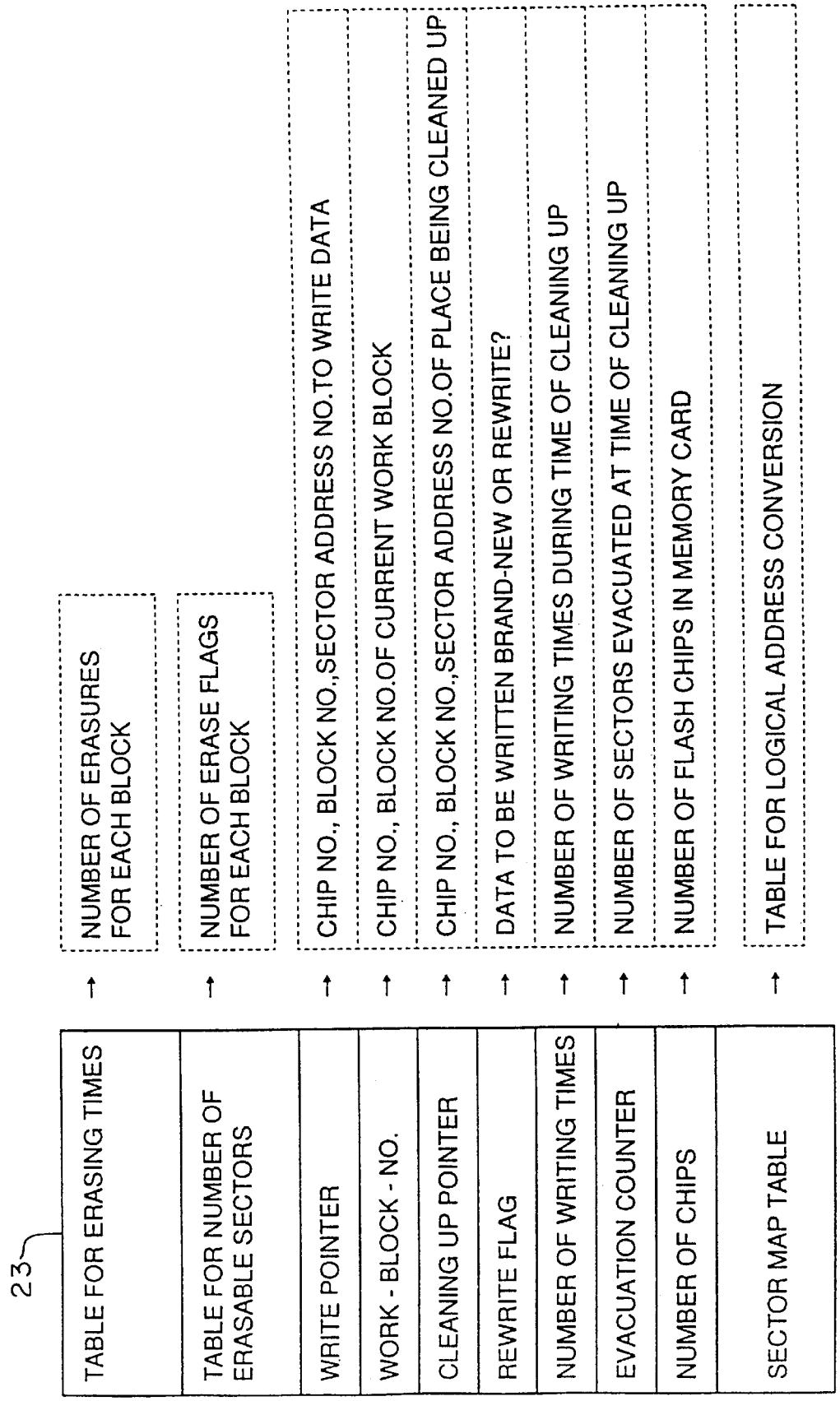
FIG. 2 is an illustration showing contents of an SRAM of the memory device of FIG. 1.

FIG. 2 shows memory contents of the SRAM 23. As shown in FIG. 2, data stored in the SRAM 23 are as follows;

(1) Table for Erasing Times

This holds the number of erasures for each block of the flash memory.

(2) Table for Number of Erasable Sectors

This holds the number of erase flags (i.e., the number of erasable sectors) for each block.

(3) Write Pointer

This holds the chip No., the block No. and the sector address No. of the starting point to write data into the flash memory.

(4) Work Block No.

This holds the chip No. and the block No. indicating the current work-block No.

(5) Cleaning Up Pointer

This holds the chip No., the block No., and the sector address No. of the place which is being cleaned up.

(6) Rewrite Flag

This shows whether the data to be written is brand-new or replacing a corresponding old data.

(7) Number of Writing Times

This holds the number of times that writing is carried out during the time of cleaning up.

(8) Evacuation Counter

This holds the number of sectors evacuated at the time of cleaning up.

(9) Number of Chips

This holds the number of the flash chips in the memory card.

(10) Sector Map Table

This holds chip numbers, block numbers, and sector address numbers for logical address conversion.

Figure 3:
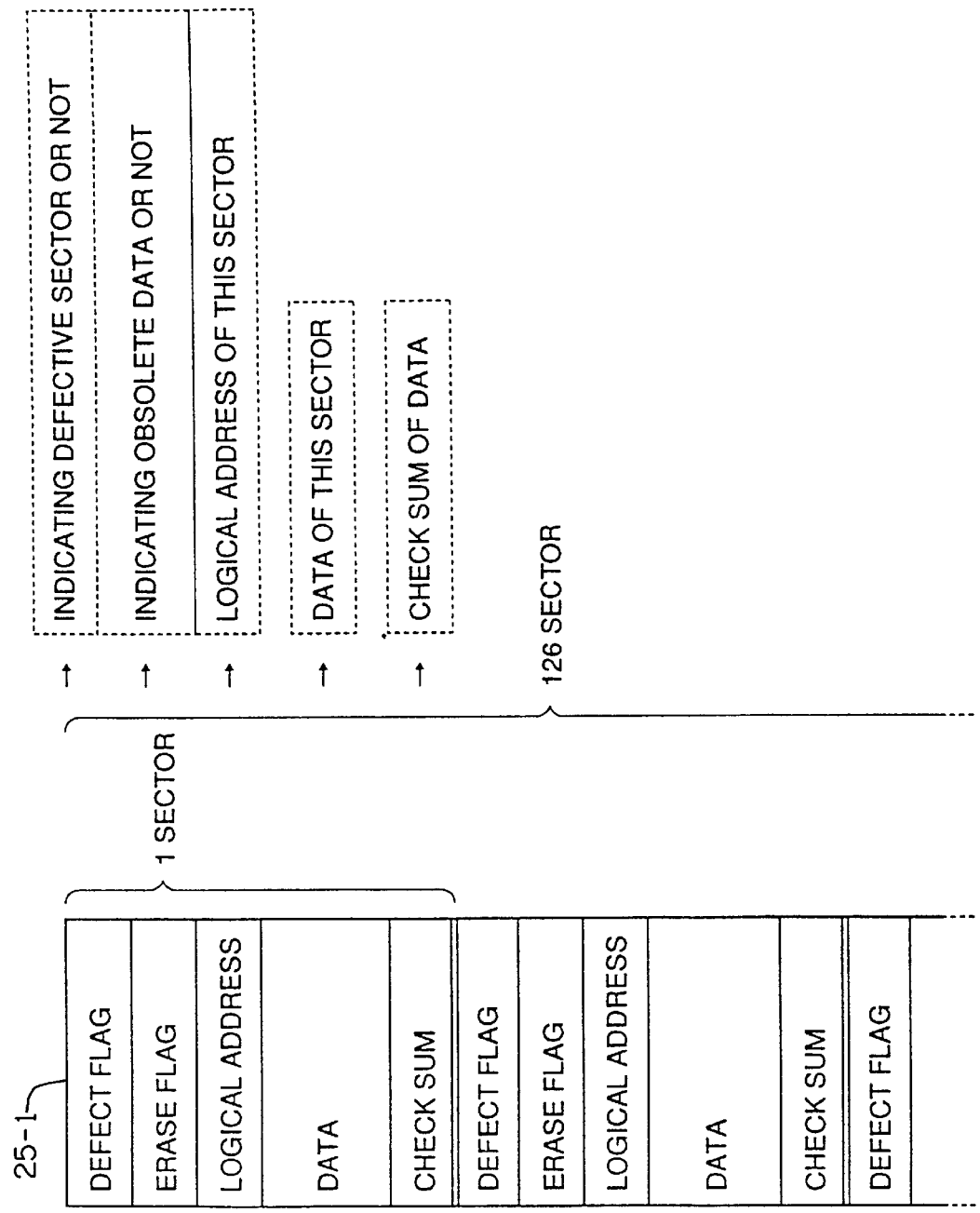
FIGS. 3 to 4 are illustrations showing contents of flash memories of 25-1 to 25-5 of the memory device of FIG. 1.
Figure 4:
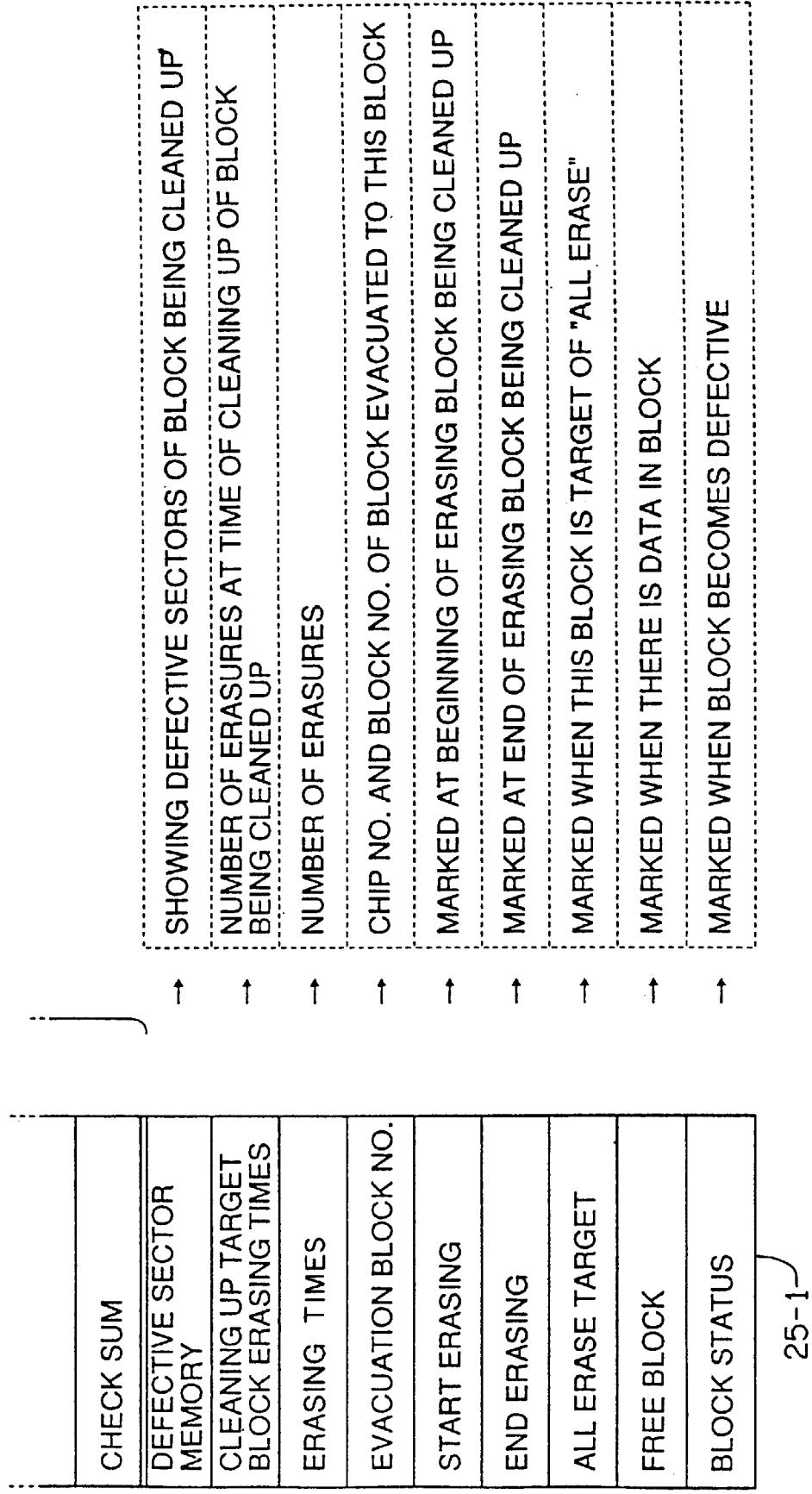

FIGS. 3 and 4 show memory contents of the flash memory 25-1 to 25-5, whose each sector stores the management information and data shown in the followings as (1) through (5). In this example, there are 126 sectors, each of which stores the management information and data of (1) through (5), and, also, the management information of (6) through (14) is stored in the area entailing the 126th sector.

(1) Defect Flag

This shows the status of the sector, and is marked when the sector becomes defective and cannot be used any more.

(2) Erase Flag

This shows the data status of the sector, and is marked when data of the sector becomes obsolete, for example, after a rewrite.

(3) Logical Address

This shows the logical address of the sector.

(4) Data

This holds data of the sector.

(5) Check Sum

This holds the check sum of data written in the sector.

(6) Defective Sector Memory

This shows defective sectors of the block in the process of being cleaned up.

(7) Cleaning Up Target Block Erasing Times

This shows how many times the block in the process of being cleaned up is erased at the time of cleaning up.

(8) Erasing Times

This shows how many times the block is erased.

(9) Evacuation Block No.

This holds the chip No. and the block No. of the block whose data is evacuated.

(10) Start Erasing

This flag is marked at the beginning of erasing the block in the process of being cleaned up.

(11) End erasing

This flag is marked at the end of erasing the block in the process of being cleaned up.

(12) All Erase Target

This flag is marked when this block is the target of "all erase".

(13) Free Block

This flag is marked when there is data in the block.

(14) Block Status

This shows the status of the block, and is marked when the block becomes defective and cannot be used any more.

FIGS. 5 to 10 are a flow chart of a process of the processor 22 in writing data to the flash memories 25-1 to 25-5. With reference to FIGS. 5 to 10, the writing operation will be described in detail.

Figure 5:
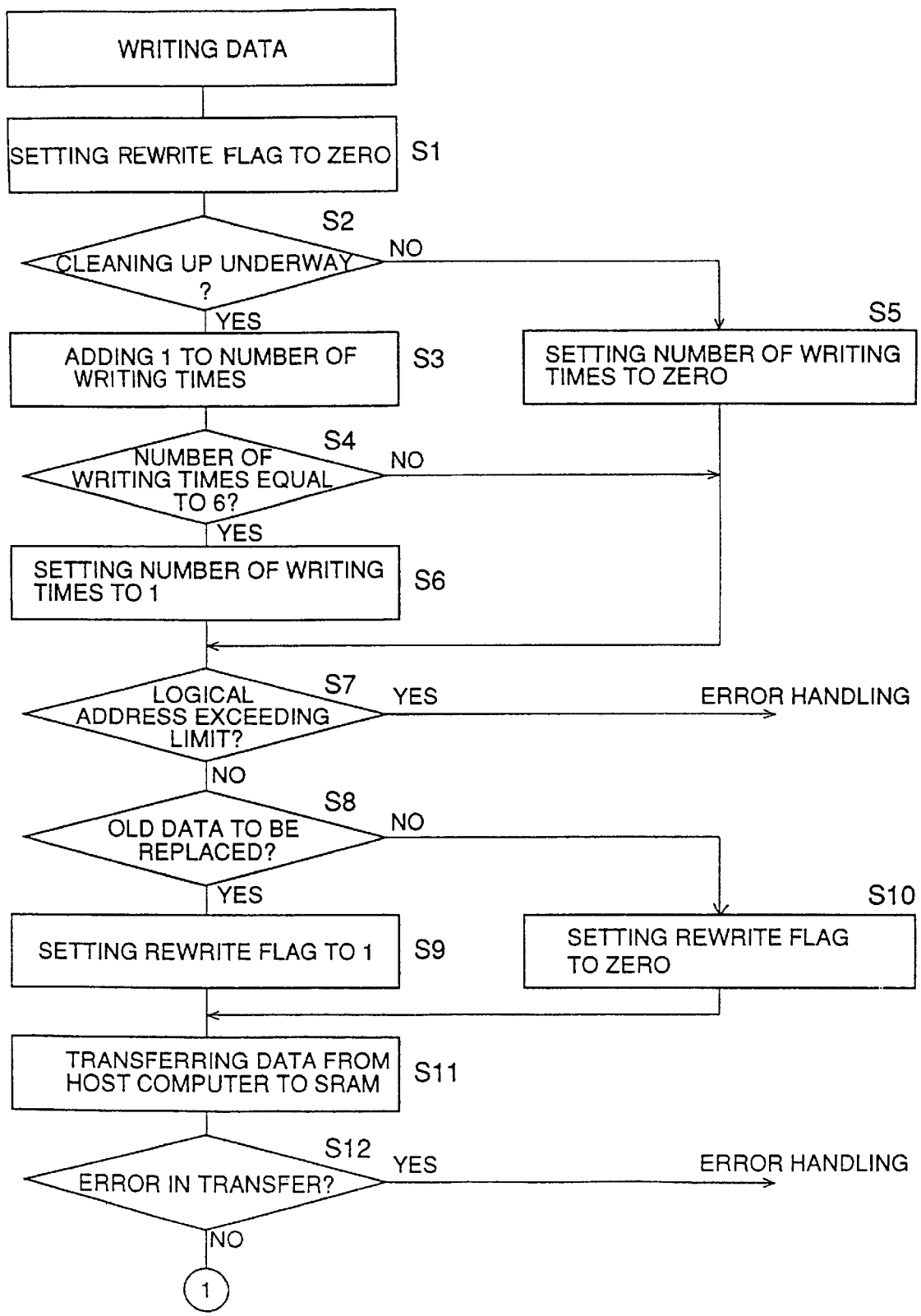
FIGS. 5 to 9 are a flow chart showing a writing process according to the present invention.

At a step S1 of FIG. 5, Rewrite Flag of the SRAM 23 which shows the data to be written is brand-new or replacing the old data is set to 0. At a step S2, it is determined whether cleaning up is underway. If it is not, go to a step S5, where Number of Writing Times of the SRAM 23 showing the number of times that writing is carried out during the time of cleaning up is set to 0, and, then, a step S7 is the next step to proceed.

If cleaning up is underway, go to a step S3, where Number of Writing Times is added 1. At a step S4, a check is made if Number of Writing Times is equal to 6. If it is 6, go to a step S6, where Number of Writing Times is set to 1. If it is not 6, go to the step S7.

The process described above makes sure that cleaning up is not carried out when Number of Writing Times is from 2 to 5, but is carried out only when Number of Writing Times is 1, so that cleaning up occurs after five times writing data to the flash memory to avoid excessive occurrence of cleaning up.

At the step S7, a check is made whether the logical address of the data to be written exceeds its limit, and if it does, error handling should be carried out.

If the logical address does not exceed its limit, go to a step S8, where a check is made if there is old data, i.e., if the data to be written is brand-new or replacing the old data. If it is not brand-new, the Rewrite Flag of the SRAM 23 is set to 1 at a step S9, and, then, a step S11 is the next step to proceed. If the data to be written is. brand-new, the Rewrite Flag of the SRAM 23 is set to 0 at a step S10, and, then, the step S11 is the next step to proceed.

At the step S11, data is transferred from the host computer to the SRAM 23, and a check is made at a step S12 whether an error occurred during the transfer. If it did, error handling must be carried out. If there is no error, go to a step S13 of FIG. 6, where Rewrite Flag is checked to see if the data to be written is brand-new. If it is not brand-new, i.e., the data is to be rewritten, Erase Flag is marked at the sector holding the old data at a step S14, and, then, a step S15 is the next step to proceed.

At the step S15, a check is made whether Number of Writing Times of the SRAM 23 is 1. If it is 1, the flash memory is cleaned up at the steps following the step S15. If Number of Writing Times is not 1, go to a step S46 of FIG. 9 and the data stored in the SRAM 23 is written into the flash memory.

Figure 8:
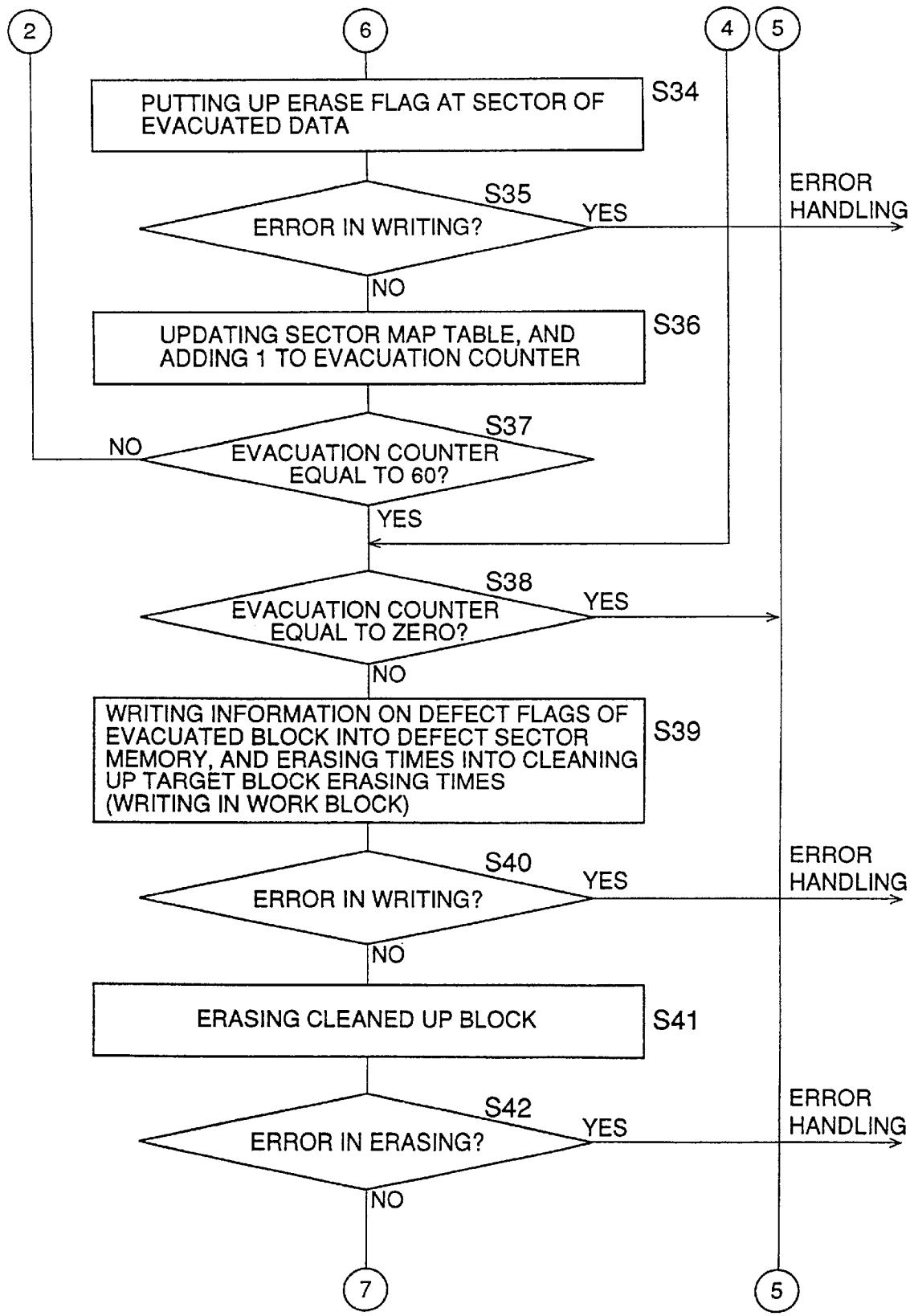
Figure 9:
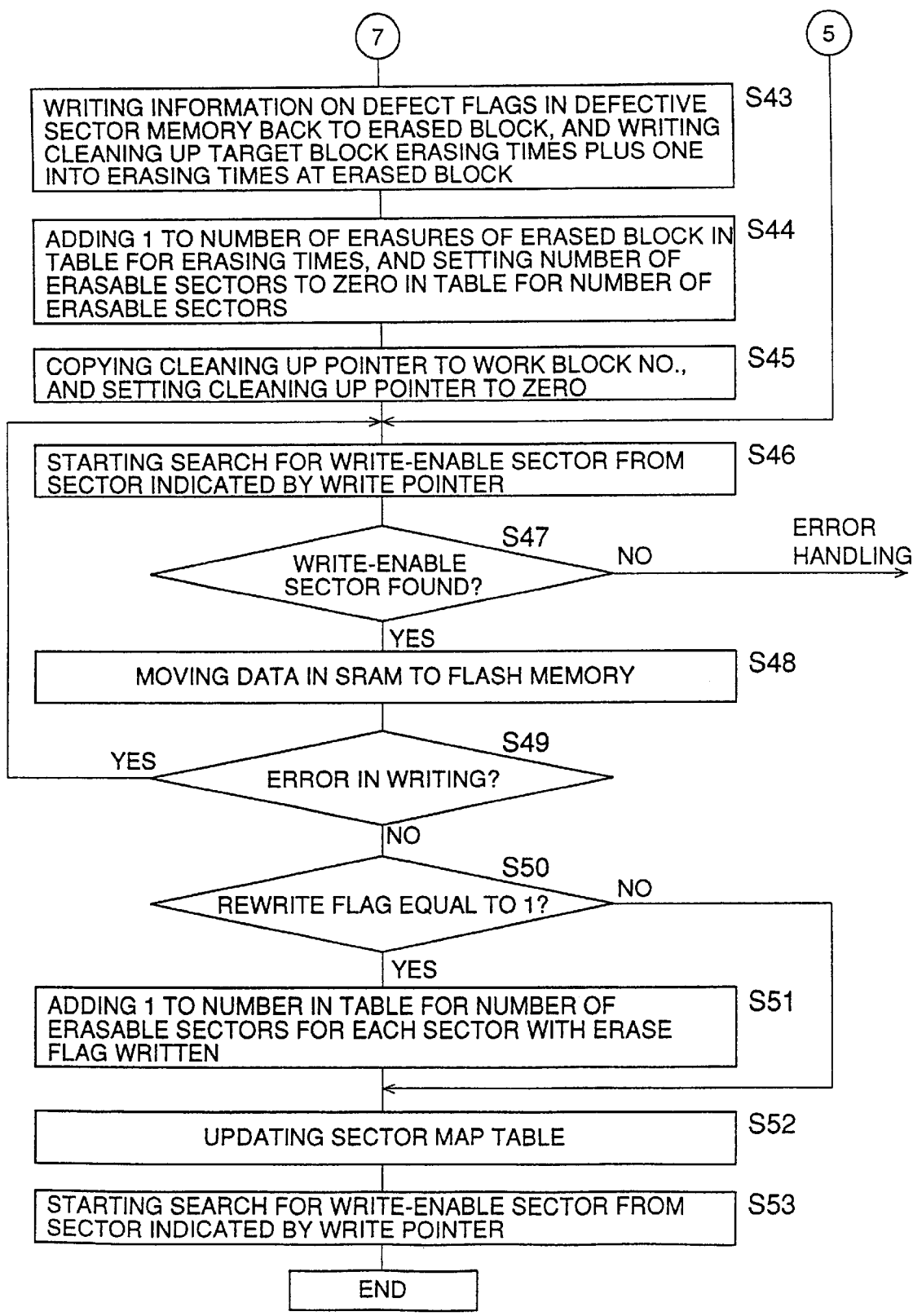

At a step S16, Evacuation Counter of the SRAM 23, which holds the number of sectors evacuated at the time of cleaning up, is set to 0. At a step S17, a check is made whether a Cleaning Up Pointer indicating the address of the sector being cleaned up is smaller than 126. If it is not smaller than 126, cleaning up is finished, and a step S38 of FIG. 8 is the next step to proceed. If Cleaning Up Pointer is smaller than 126, proceed to a step S18, where a check is made if Cleaning Up Pointer is 0. If it is not 0, go to a step S22.

If Cleaning Up Pointer is 0, the target of cleaning up is selected by using the numbers of erasures and erasable sectors of each block obtained from the tables of the SRAM 23. At a step 20, the chip No. and the block No. of the target of cleaning up is written into Evacuation Block No. of the Work Block in the flash memory.

At a step S21, a check is made if there occurred an error in writing the chip No. and the block No., and if it did, error handling must be carried out. If there occurred no errors, go to the step S22.

At the step S22, a search is made for data to be evacuated. That is, if Erase Flag of the current sector is marked, go to the next sector. If there is no logical address written, Erase Flag is marked at the current sector, and the next vector is the next to search for. If the logical address is anomalous, Erase Flag and Defect Flag are both marked, and the next sector is the next to search for.

Figure 7:
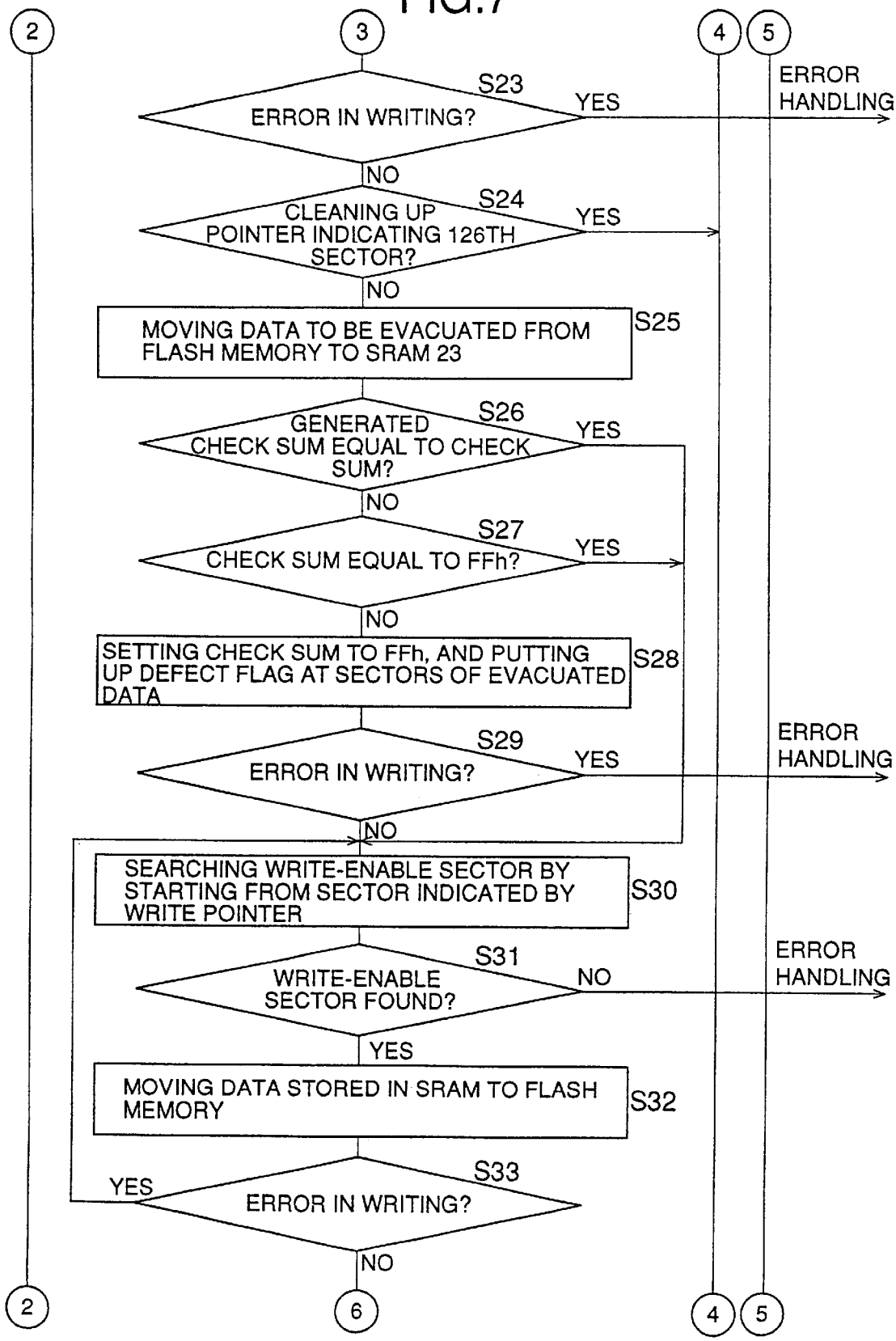

At a step S23 of FIG. 7, a check is made whether there has been an error. If not, it is checked whether Cleaning Up Pointer indicates the 126th sector, and if it does, cleaning up is finished, and a step S38 of FIG. 8 is the next step to go.

If Cleaning Up Pointer is not 126, proceed to a step S25, where data to be evacuated is moved from the flash memory to the SRAM 23. At a step S26, it is checked whether the check sum generated corresponds to Check Sum of the sector in the flash memory (refer to FIG. 3). If it does not correspond, a check is made at a step S27 whether the check sum is FFh.

If the check sum is not FFh, Check Sum is set to FFh and Defect Flag is marked at a step S28 for the sector of the data attempted to be evacuated, and, a step S29 is the next step to proceed. At the step S29, a check is made if there occurred an error, and if not, proceed to a step S30.

If the check sum corresponds to Check Sum at the step S26 or turns out to be FFh at the step S27, go to the step S30. At the step S30, a search for a write-enable sector is started from the sector indicated by Write Pointer. Then, at a step S31, it is checked whether there is a write-enable sector. If there is not, error handling must be carried out. If there is a write-enable sector, go to a step S32, where the data stored in the SRAM 23 is moved to the flash memory.

At a step S33, a check is made whether an error occurred in writing the data, and if it did, go back to the step S30. If no errors occurred, go to a step S34 of FIG. 8, where Erase Flag of the sector whose data has been evacuated is marked.

At a step S35, a check is made whether an error occurred in writing Erase Flag. If no error occurred, Sector Map Table is updated at a step S36, and Evacuation Counter is incremented by 1 in the SRAM 23.

Then, at the step S37, it is checked whether evacuation has occurred a predetermined number of times (60 times in the preferred embodiment). If it did, stop the cleaning up of the flash memory to go to the step S38. If the number of times of evacuation is less than 60, go back to the step S22 of FIG. 6 to repeat the process described above.

Figure 6:
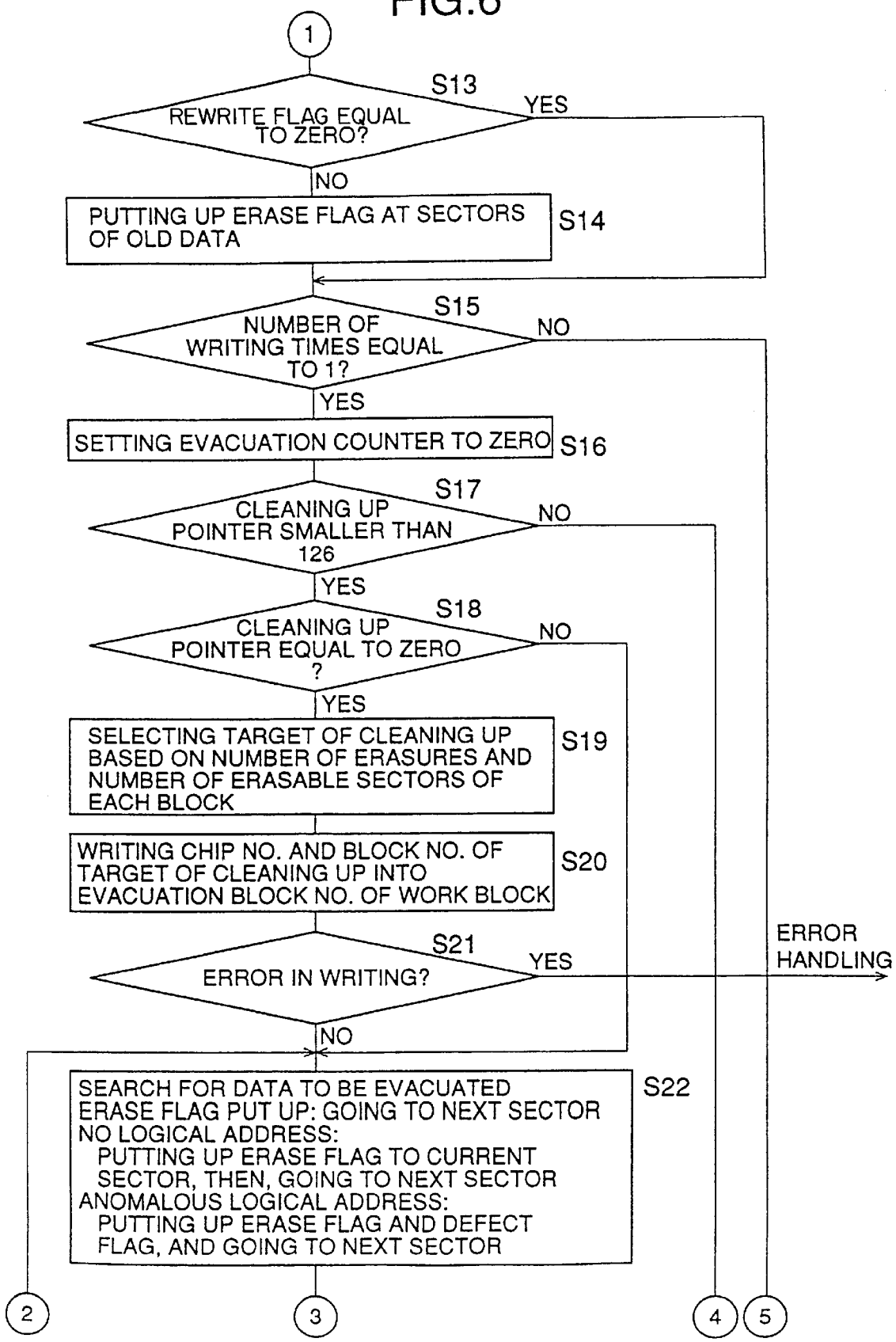

If Evacuation Counter is 60 or Cleaning Up Counter turns out to be no less than 126 at the step S17 of FIG. 6, a check is made at the step S38 whether Evacuation Counter is 0.

If Evacuation Counter is 0, i.e., if Cleaning Up Counter is no less than 126 and there has been no evacuation, go to a step S39, and processes like writing Defect Flags to defective sector memories are carried out at the successive steps starting from the step S39.

In other words, if Evacuation Counter is 0, it means that the processing time was short enough to carry out pending processing, so that processes like writing Defect Flags to defective sector memories are carried out at the steps starting with S38. If Evacuation Counter is not 0, go to a step S46 of FIG. 9. Moving the data in the SRAM 23 to the flash memory and following processes are carried out from that point.

At the step S39, information on Defect Flags of the evacuated block is written into Defect Sector Memory (FIG. 4) and Erasing Times of the evacuated block is written into Cleaning Up Target Block Erasing Times (FIG. 4) both at the block of the evacuation destination (Work-Block). At a step S40, a check is made whether an error occurred in writing those. If no error occurred, go to a step S41, where the cleaned up block is erased. At a step S42, a check is made whether an error occurred in erasing the block, and if there is no errors, go to a step S43 of FIG. 9, where information on Defect Flags stored in Defect Sector Memory is written back to the erased block and Cleaning Up Target Block Erasing Times plus one is written into Erasing Times of the erased block.

At a step S44, the number of erasures of the erased block is incremented by 1 in Table for Erasing Times, and the number of erasable sectors is set to 0 in Table for Number of Erasable Sectors. At a step S45, Cleaning Up Pointer is copied to Work Block No., and, then, set to 0.

Then, at the step S46, a search for a write-enable sector is started from the sector indicated by Write Pointer. At a step S47, a check is made whether there is a write-enable sector. If there is, go to a step S48, where the data stored in the SRAM 23 is moved to the flash memory. At a step S49, it is checked if an error occurred in writing the data.

If an error occurred, go back to the step S46, and if it did not, go to a step S50. At the step S50, a check is made whether Rewrite Flag is 1, i.e., whether the data written is brand-new. If Rewrite Flag is 1, a number in Table for Number of Erasable Sectors (FIG. 2) is added 1 at a step S51 for each sector into which Erase Flag was written. The step S52 is the next step to proceed.

In the case that Rewrite Flag turns out to be 0 at the step S50, Sector Map Table (FIG. 2) is updated at the step 52, and a search is made for a write-enable sector by starting from the sector indicated by Write Pointer in preparation for the next writing process. This is the end of the process.

B. Writing/Erasing Process for Data Evacuation and Free Area Creation

As described above, the flash memory has a limit in the number of times that erasing can be carried out, so that the numbers of erasures need to be averaged across the memory area for an effective use of the entire memory.

Also, it is not possible to write data over existing data so that data for rewrite needs to be written into new sectors while the old data is marked by flags and the like so as to be erased later at a convenient time.

Thus, it is necessary to set aside free memory areas for new data to be written by erasing old erasable data in the memory. Also, when the free areas become dysfunctional due to defective blocks and the like, it is necessary to take a counter measure to create new free areas.

The the processing of memory areas according to preferred embodiments of the present invention will be described, such as, the averaging of the number of erasures (first embodiment), the creation of free areas by erasing erasable data (second embodiment), and a counter measure for creating free areas in the case of defective blocks (third embodiment).

(1) First Embodiment (Averaging of Number of Erasing Times)

As described above, the flash memory has a limit in the number of times that erasing can be carried out, so that the numbers of erasures need to be averaged across the memory area for an effective use of the entire memory.

This embodiment shows a method that can reduce a variation in the numbers of erasures across the memory area without explicitly taking into account those numbers. In this embodiment, with a memory in which writing can be done by the unit of sector and erasing can be done by the unit of block, the numbers of erasures can be averaged over by moving sectors to new blocks from blocks with a relatively large number of erasable sectors and blocks with a relatively small number of erasable sectors.

This embodiment will be described in the following.

FIGS. 10A to 10J show a writing process of this embodiment and an example of writing logical sectors A to O into a flash memory which has six blocks each with six sectors.

Also, in the following description, M blocks (2 in this embodiment) are evacuated when a number of blocks having free sectors becomes N (2 in this embodiment), and m block in a descending order of the number of erasable sectors (1 block in this embodiment) and n block in a ascending order of the number of erasable sectors (1 block in this embodiment) are selected and evacuated simultaneously.

In evacuating blocks, as described above, sectors with no Erase Flag attached are moved to the SRAM 23 of FIG. 1, and, then, are moved from the SRAM 23 to new blocks.

Figure 10A:
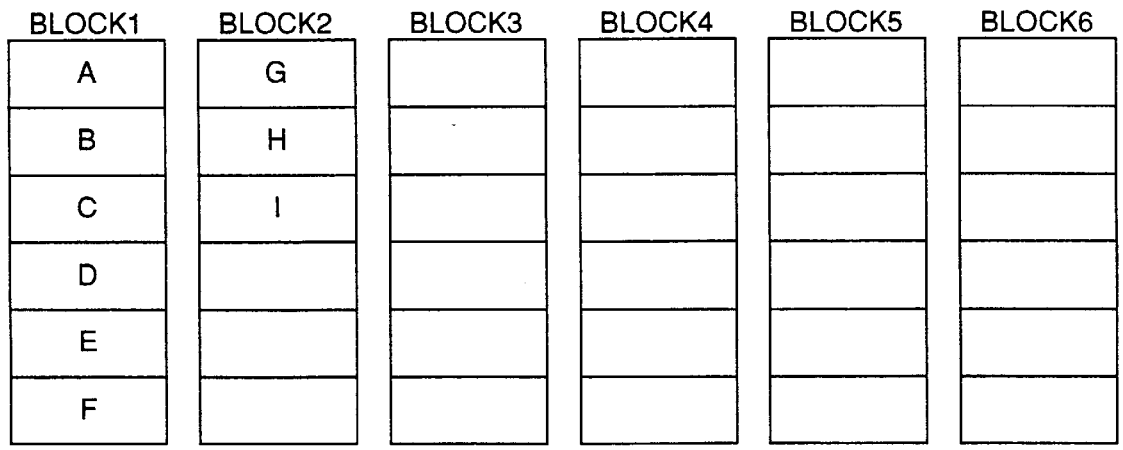

In FIG. 10A, sectors A, B, C, D, E, F, G, H, and I are written into blocks 1 and 2 successively by starting from the first sector.

Figure 10B:
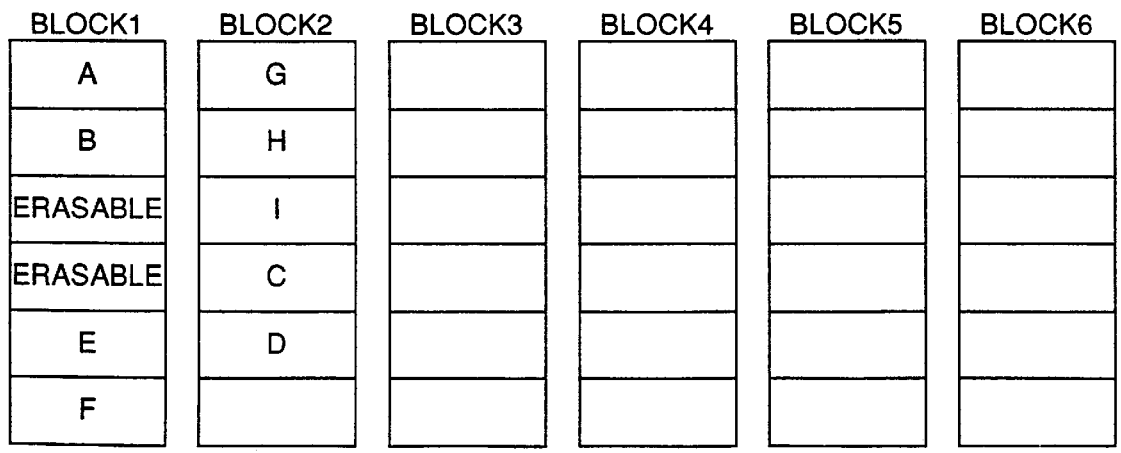

In FIG. 10B, the sectors C and D are written again. Since the same sectors C and D already exist, Erase Flags are marked at the existing sector C and D, and the new sector C and D are written into the places following the sector I.

Figure 10C:
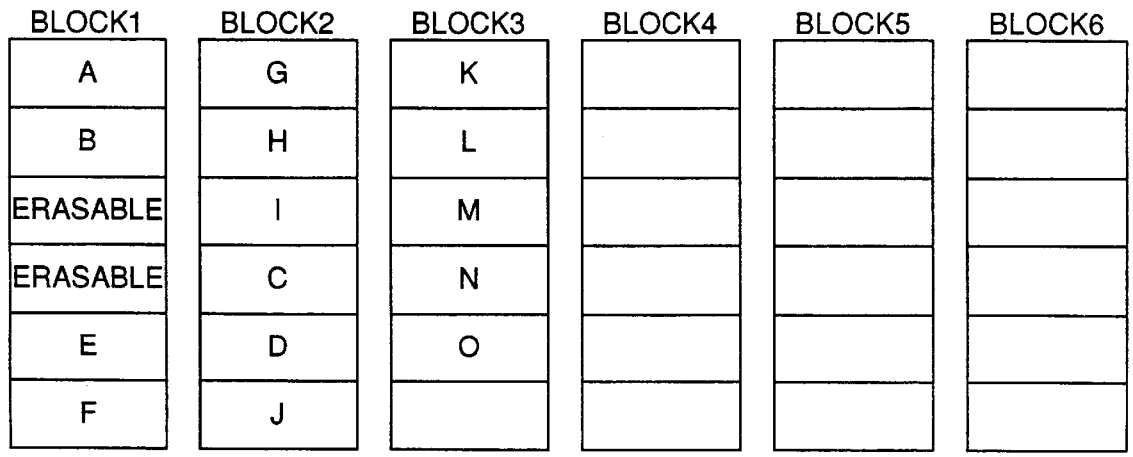

Then, in FIG. 10C, sectors J, K, L, M, N, and O are written into the blocks 3 and 4. Since there are no existing sectors identical to the sectors to be newly written, those sectors are written into the places following the last written sector.

Figure 10D:
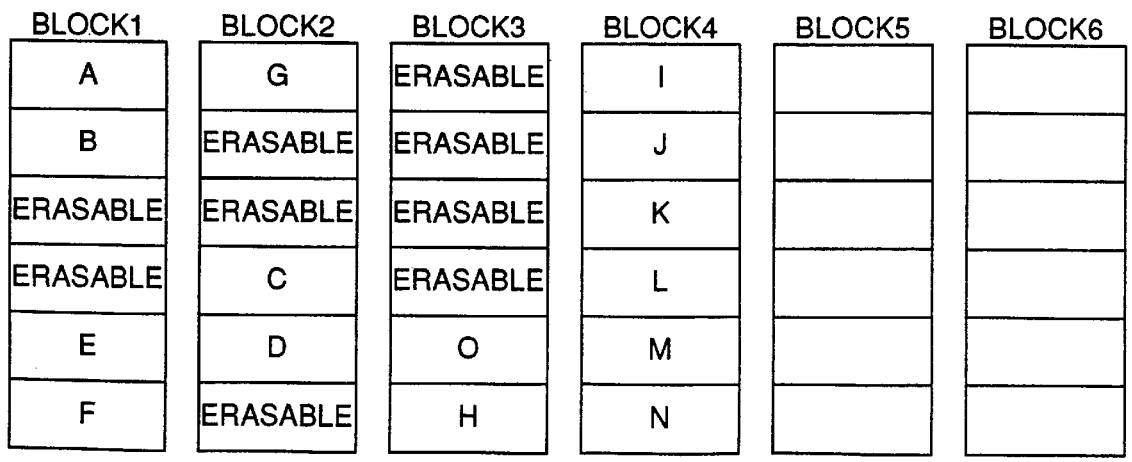

In FIG. 10D, sectors H, I, J, K, L, M, and N are written. Since there exist the identical sectors, Erase Flags are marked, and the new sectors H, I, J, K, L, M, and N are written into the places following the last entry.

In FIG. 10E and 10F, the sectors C and D are written again. At this time, however, as the number of free blocks is 2, an evacuation process has to take place.

For evacuation, two blocks are selected which are the block 3 with the largest number of erasable sectors and the block 4 with the smallest number of erasable sectors, and the sectors of those two blocks are mixed and written into the free blocks 5 and 6 in such a way that the sectors are distributed evenly in each destination block.

As a result, as shown in FIG. 10F, the sector O, I, K, and M are written into the block 5, and the sector H, J, L, and N in the block 6, which frees the block 3 and 4.

In FIG. 10F, the sector C and D are written into the block 5 after putting up Erase Flags in the block 2 of the existing sectors C and D.

In FIG. 10G, sectors H, I, and J are written. As in the previous cases, Erase Flags are marked in the blocks 5 and 6 since there are existing sectors identical to the sectors to be newly written. The sectors H and I are first written into the block 6, but only two free blocks are left at this point of time so that an evacuation process has to take place again.

As shown in FIG. 10H, two blocks are selected which are the block 2 with the largest number of erasable sectors and the block 6 with the smallest number of erasable sectors, and the sectors of those two blocks are mixed and written into the free blocks 3 and 4 in such a way that the sectors are distributed evenly in each destination block.

Figure 10I:
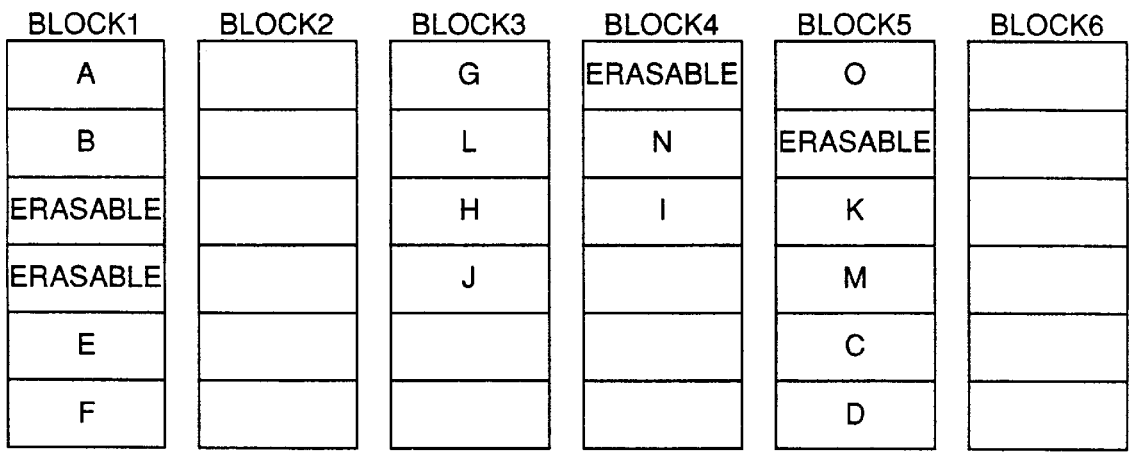

Then, as shown in FIG. 10I, the sector J is written. Since there is an existing identical sector again, Erase Flag is marked in the block 4 of the existing sector J, and the new sector J is written into the block 3.

Figure 10J:
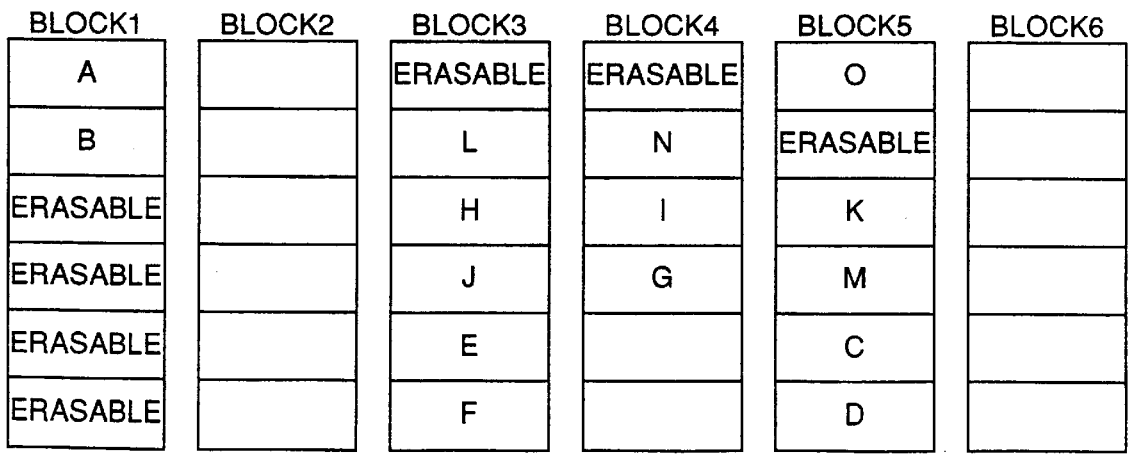

In FIG. 10J, sectors E, F, and G are written. As in the previous cases, there are identical sectors so that Erase Flags are put up in the block 1 and 3. Then, the sector E, F, and G are written into the block 3 and 4.

Figure 11:
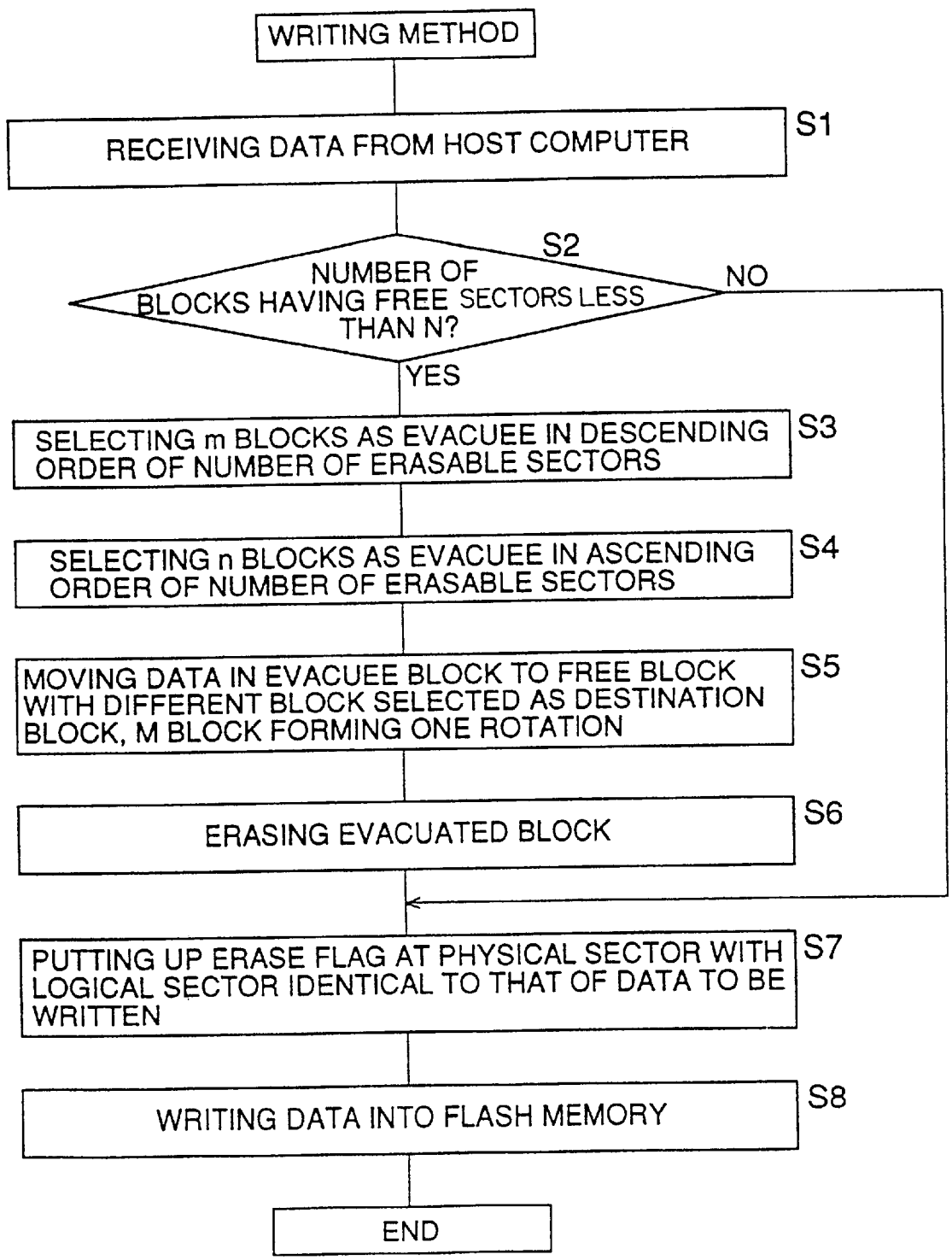
FIG. 11 is a flow chart showing a process of averaging the numbers of erasures.

FIG. 11 is a flow chart of the process of this embodiment, which will be described below.

At a step S1, data is received from the host computer. At a step S2, a check is made whether the number of blocks having at least one free sector is less than N. If it is not less than N, go to a step S7. If it is less than N, m blocks are selected as an evacuee at a step S3 in a descending order of the number of erasable sectors, and n blocks are also selected as an evacuee at a step S4 in an ascending order of the number of erasable sectors.

At a step S5, data in the evacuee blocks are moved to free blocks. A different block is selected as a destination block each time one sector is written, and the M blocks form each rotation for M sectors so that the M+1th sector is written into the first block of the second rotation. At a step S6, the blocks which are evacuated are erased.

At the step S7, if there are existing logical sectors identical to the logical sectors to be newly written, Erase Flags are marked at the old identical sectors. At a step S8, data received from the host computer is written into the flash memory.

In general, there are sectors storing such data which are rarely rewritten as data for system programs, and sectors storing data which are often rewritten. Thus, data evacuation without taking this into account may lead to that the blocks with sectors rarely rewritten end up having a small number of erasures.

In this embodiment, as described above, blocks with a large number of erasable sectors (i.e., blocks with a large number of sectors often rewritten) and blocks with a small number of erasable sectors (i.e., blocks with a large number of sectors rarely rewritten) are selected for evacuation, and the sectors from those blocks are mixed to be distributed to new blocks. This results in that each block has a mixture of sectors often rewritten and sectors rarely rewritten so that the numbers of erasures across blocks can be averaged over.

This embodiment carries out a writing process by using the method described above so that a variation in the numbers of erasures across the memory area can be reduced without explicitly taking into account those numbers, which leads to a longer life of such memories as the flash memory having a limited number of tolerable erasures. Also, since a variation in the numbers of erasures can be reduced without counting those numbers, it is possible to manage the memory space without setting aside a memory area for a counting use.

(2) Second Embodiment (Creation of Free Areas by Erasing Erasable Data)

As described above, flash memories cannot write data over existing data before erasing the existing data. Thus, it is required to mark Erase Flags at the existing identical sectors, which should be erased later on at a time of convenience.

This embodiment shows area processing for erasing out erasable data with Erase Flags from a memory. This area processing can be carried out during a free time interval among other processes so that free areas can be set aside beforehand to reduce the processing time required for writing.

FIGS. 12A to 12L show a writing/erasing process of this embodiment, which will be described below. First of all, this embodiment has the following as its basis.

1. There are six blocks each with six sectors. Reading/writing is carried out by the unit of sector and erasing by unit of block.
2. The method of writing is of add-on writing, i.e., when writing a logical sector having the same address as that of logical sector existing in the memory, the physical sector of the existing logical sector is marked with Erase Flag.
3. The area for add-on writing is 5 blocks plus an evacuation area block (blocks 1 through 6).
4. When there are no more writing areas, data in the unerasable physical sectors of the block which has the largest number of physical sectors with Erase Flags are moved to an evacuation area, and this block is erased. Then, the block just erased is used as an evacuation area block, and the previous evacuation area is in turn used as a writing area. (This whole process is called evacuation process.)
5. The addresses of the sectors sent from the host computer are A through N.
6. When there are more than m erasable sectors in a block, this block is the target of area processing of this embodiment.

In FIGS. 12A to 12L, an arrow shown to the left of a block shows the location of Write Pointer indicating the point of writing data.

In FIG. 12A, logical sectors A through G are written. Since there are no identical logical sectors, the logical sectors A through G are written into the points successively indicated by Write Pointer. In FIG. 12A, after writing the logical sectors A through G, Write Pointer indicates the sector following the last entry of the logical sector G.

In FIG. 12B, the logical sectors A and D through G are written. Since there exist the identical logical sectors A, D, E, F, and G, the logical sectors A and D through G are written in the same manner as in FIG. 12A after putting up Erase Flags at those identical logical sectors.

In FIG. 12C, logical sectors H through N are written. Since there are no identical logical sectors, the logical sectors H through N are written into the points successively indicated by Write Pointer without taking any other action.

In FIG. 12D, the logical sectors A and G through L are written. Since there exist the identical logical sectors A, G, H, I, J, K, and L, the logical sectors A and G through L are written after putting up Erase Flags at those identical logical sectors.

In FIG. 12E, the logical sectors A and H through J are written. Since there exist the identical logical sectors A, H, I, and J, the logical sectors A and H through J are written after putting up Erase Flags at those identical logical sectors.

In FIG. 12F, it is attempted to write the logical sectors A and I through L. Since there are no writing areas left, however, an evacuation process has to take place. That is, data in the block with the largest number of physical sectors with Erase Flag (block 3) are moved to the evacuation area block (block 6), and the block 3 which has just been evacuated is erased. Then, the block 3 is used as an evacuation area, and the previous evacuation area (block 6) is newly used as a writing area.

FIG. 12F shows the result of the above described process.

Then, as shown in FIG. 12G, the logical sectors A and I through L are written. Since there exist the identical logical sectors A, I, J, K, and L, the logical sectors A and I through L are written after putting up Erase Flags at those identical logical sectors. At this point of time, Write Pointer indicates the first sector of the evacuation area block (block 3).

As a result of the process described above, there are many erasable sectors so that the evacuation processing of this embodiment is carried out.

First, by taking as a target the block (block 2) which is located immediately before the evacuation area (block 3) in the writing direction, an evacuation process is carried out between the blocks 2 and 3. As a result, as shown in FIG. 12H, the block 2 becomes an evacuation area, and the block 3 has unerasable data transferred from the block 2.

Then, an evacuation process is carried out between the blocks 1 and 2 in the same manner as above. As a result, as shown in FIG. 12I, the block 1 becomes an evacuation area, and the block 2 has unerasable data transferred from the block 1.

Figure 12J:
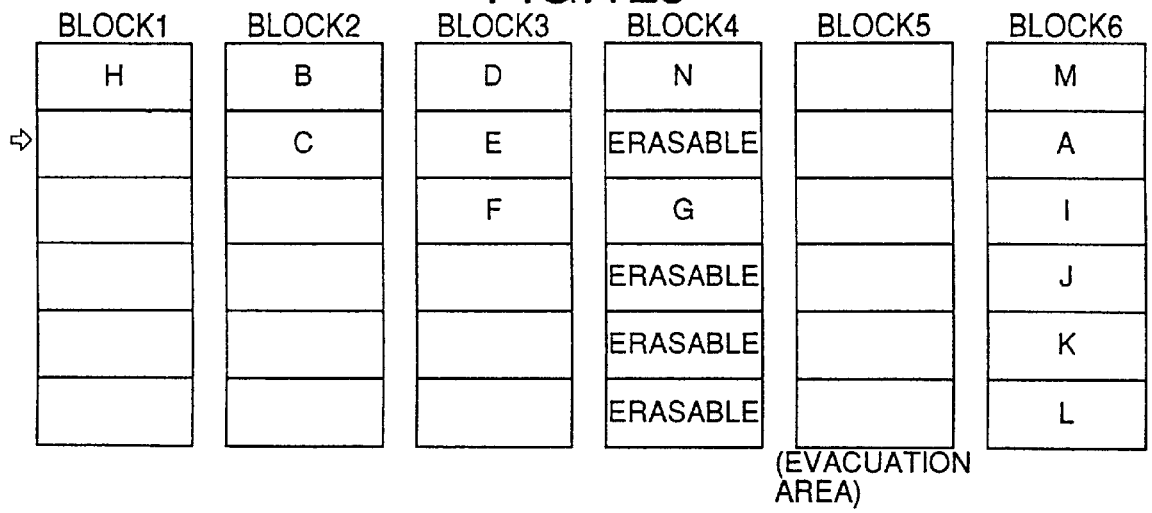

Furthermore, an evacuation process is carried out between the blocks 5 and 1 in the same manner as above. As a result, as shown in FIG. 12J, the block 5 becomes an evacuation area, and the block 1 has unerasable data transferred from the block 5. Here, the block 6 is not a target of area processing since the block 6 does not have erasable data.

Figure 12K:
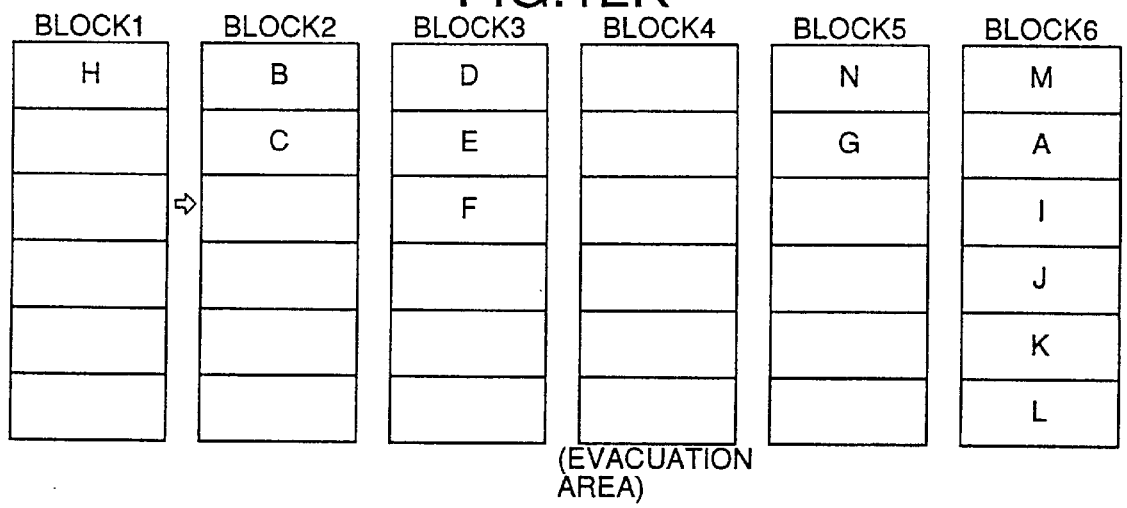

Similarly, an evacuation process also is carried out between the blocks 4 and 5 in the same manner as above. As a result, as shown in FIG. 12K, the block 4 becomes an evacuation area, and the block 5 has unerasable data transferred from the block 4. At this point, the location of the evacuation area has reached the location of the initial evacuation area so that the process is finished.

With the process described above, erasable data is all deleted from the memory space.

Figure 12L:
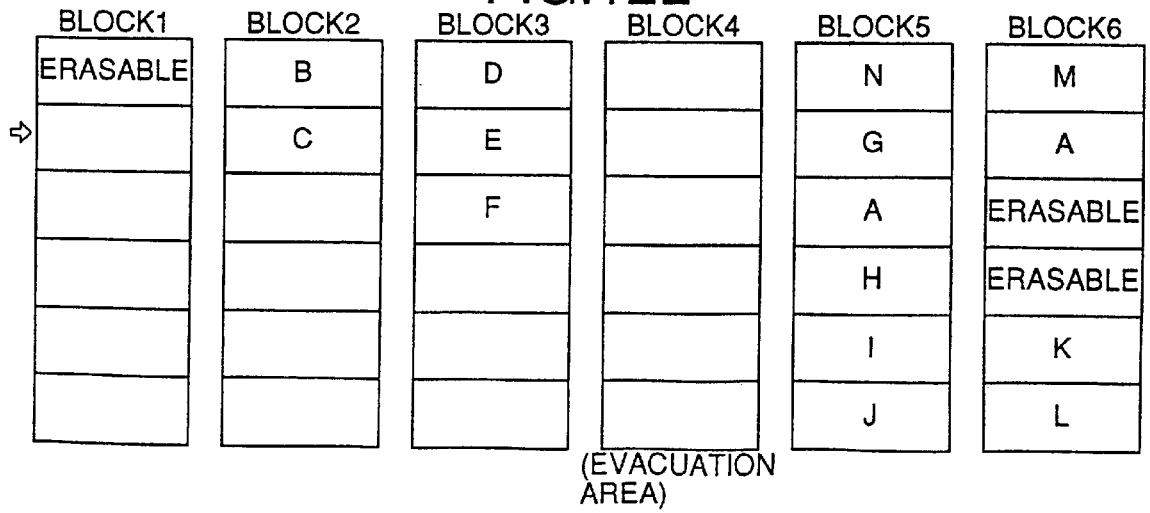

When writing the logical sectors A and H through J, as shown in FIG. 12L, those sectors are written in the same manner as before after putting up Erase Flags since there are identical sectors.

Figure 13:
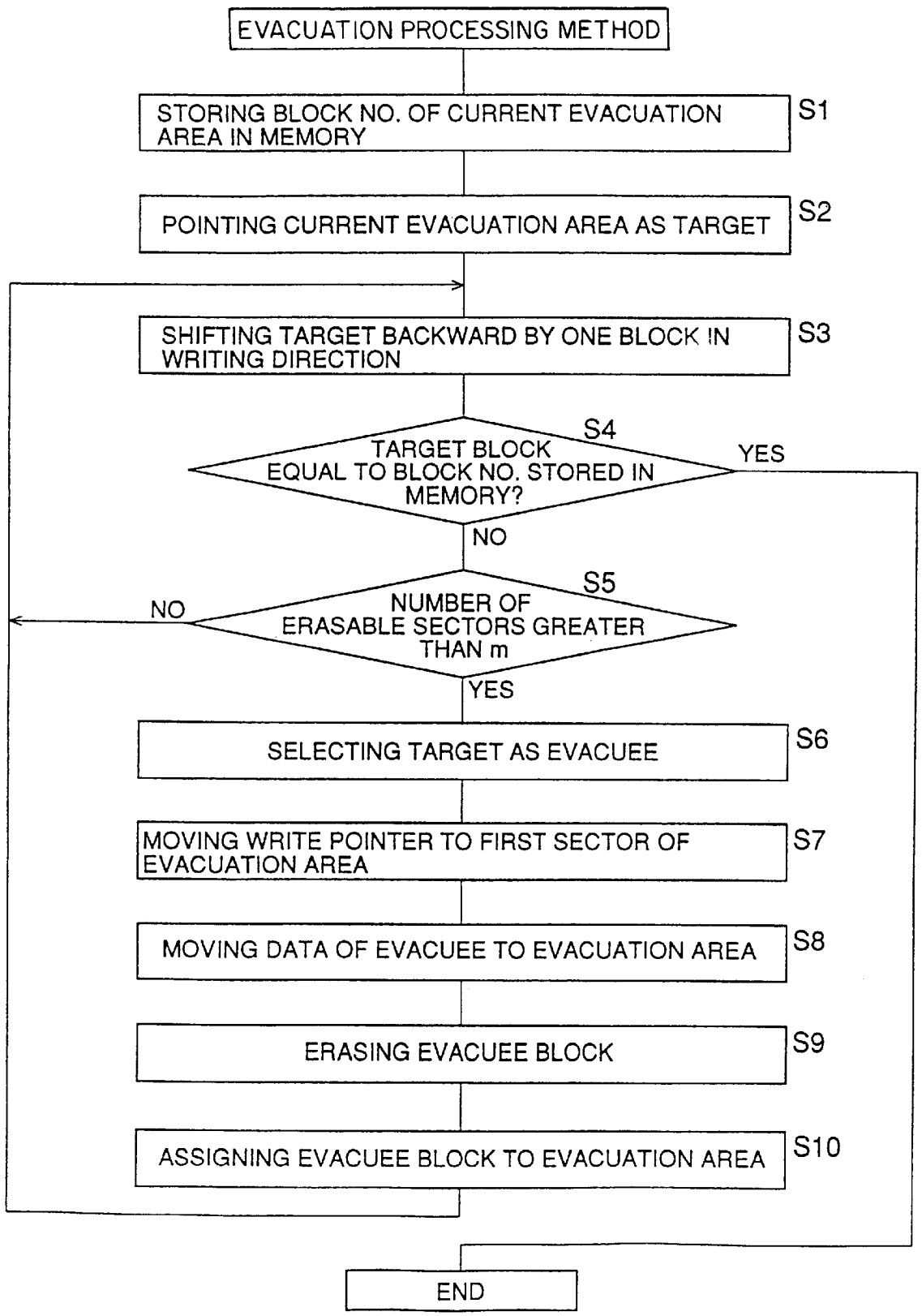
FIG. 13 is a flow chart showing a process of erasing unnecessary data.

FIG. 13 shows a flow chart of a process of this second embodiment, which will be described below.

At a step S1, the block No. of the current evacuation area is stored in a memory. At a step S2, the current evacuation area is pointed to as a target. At a step S3, a new target is pointed to by going backward by one block in a writing direction.

At a step S4, a comparison is made between the target block and the block No. stored in the memory at the step S1. If they are the same, this is the end of the process.

If these two blocks are different, go to a step S5, where a comparison is made between the number of erasable sectors of the target block and a predetermined number m. If the number of the erasable sectors is no more than m, go back to the step S3 and repeat the above process. If the number of the erasable sectors is more than m, go to a step S6, where the target is selected as an evacuee. Then, at a step S7, Write Pointer is moved to the first sector of the evacuation area.

At a step S8, data of the evacuee is moved to the evacuation area. At a step S9, the evacuee block is erased. At a step S10, the evacuee. block is assigned to a new evacuation area. Then, go to the step S3 to repeat the process.

In this embodiment, area processing described above can eliminate all the erasable data. Thus, performing this area processing beforehand can reduce the time required for the writing process.

Also, since the target is selected so as to move backward in a writing direction, all the free space exists between the evacuation area and Write Pointer indicating the point of writing data. Thus, no matter when the process is terminated, it is possible to write data from the point indicated by Write Pointer. Also, the procedure required to take care of a situation after the termination of the process can be made minimum, and the termination of the process without going all the way does not become a problem.

(3) Third Embodiment (Counter Measure for Creating Free Areas)

As described above, the flash memory needs a free area in the memory space for writing data. This embodiment shows a counter measure for creating free areas, when free areas prepared before become unable to be used any more due to defective blocks and the like.

FIGS. 14A to 14R show a process of creating free areas according to this third embodiment of the present invention, and this embodiment will be described by using FIGS. 14A to 14R. First of all, this embodiment has the following as its basis.

1. There are seven blocks each with six sectors. Reading/writing is carried out by the unit of sector, and erasing by the unit of block.
2. The method of writing is of add-on writing, i.e., when writing a logical sector having the same address as that of logical sector existing in the memory, the physical sector of the existing logical sector is marked with Erase Flag.
3. One block is set aside as a backup area (block 0) in case of a malfunction. The area for add-on writing is 5 blocks plus a evacuation area block (blocks 1 through 6).
4. When there are no writing areas any more, data in the unerasable physical sectors of the block which has the largest number of physical sectors with Erase Flags attached are moved to an evacuation area, and this block is erased. Then, the block just erased is used as an evacuation area block, and the previous evacuation area is in turn used as a writing area. (This whole process is called evacuation process.)
5. The addresses of sectors sent from the host computer are A through P.

In FIG. 14A, sectors A through G are written. Since there are no identical logical sectors, the logical sectors A through G are written without taking any other action.

In FIG. 14B, the logical sectors A and D through G are written. Since there exist the identical logical sectors A, D, E, F, and G, the logical sectors A and D through G are written after putting up Erase Flags at those identical logical sectors.

In FIG. 14C, logical sectors H through N are written. Since there are no identical logical sectors, the logical sectors H through N are written without taking any other action.

In FIG. 14D, the logical sectors A and G through L are written. Since there exist the identical logical sectors A, G, H, I, J, K, and L, the logical sectors A and G through L are written after putting up Erase Flags at those identical logical sectors.

In FIG. 14E, the logical sectors A and H through J are written. Since there exist the identical logical sectors A, H, I, and J, the logical sectors A and H through J are written after putting up Erase Flags at those identical logical sectors.

In FIG. 14F, it is attempted to write the logical sectors A and I through L. Since there are no writing areas left, however, an evacuation process has to be carried out. That is, unerasable data in the block with the largest number of data with Erase Flags (block 3) are moved to the evacuation area block (block 6), and the block 3 which has been just evacuated is erased. Then, the block 3 is used as an evacuation area, and the previous evacuation area (block 6) is newly used as a writing area.

Then, in FIG. 14G, the logical sectors A and I through L are written into the block 6.

In FIG. 14H, it is attempted to write the logical sectors A, M, and N. Since there are no writing areas left, however, an evacuation process has to be carried out. That is, unerasable data in the block with the largest number of data with Erase Flags (block 5) are moved to the evacuation area block (block 3), and the block 5 which has been just evacuated is erased. Then, the block 5 is used as an evacuation area, and the previous evacuation area (block 3) is newly used as a writing area.

At this point, assume that the block 5 becomes unable to be used any more due to a failure of erasing the block 5. There are no evacuation areas in this case, so that a counter measure has to be taken.

As shown in FIG. 14I, an evacuation process is carried out by taking the backup block 0 as an acting evacuation area. That is, unerasable data in the block with the largest number of erasable data in FIG. 14H (block 1) are moved to the acting evacuation area block (block 0), and the block 1 which has been just evacuated is erased. Then, the block 1 is used as an evacuation area. Then, as shown in FIG. 14J, the backup block (block 0) is evacuated. That is, the logical sectors B and C of the backup area (block 0) used as an acting evacuation area are moved to the block 3.

Through the above process, a backup area and an evacuation area are created, and the logical sectors A, M, and N are written into the block 3 as shown in FIG. 14K.

Then, it is attempted to write the logical sectors A, G, H, O, and P. Since there are no writing areas left, however, an evacuation process is carried out as shown in FIG. 14L. That is, unerasable data in the block with the largest number of erasable data (block 4) are moved to the evacuation area block (block 1), and the block 4 which has been just evacuated is erased. Then, the block 4 is used as an evacuation area.

In FIG. 14M, the logical sectors A, G, H, O, and P are written. Since there exist the identical logical sectors A, G, and H, the logical sectors A, G, and H are written into the block 1 after putting up Erase Flags. The logical sectors O and P are just written into the block 1 without doing anything else.

Then, in FIG. 14N, writing the logical sector A is attempted. Since there are no writing areas left, an evacuation process is carried out. As a result, the block 2 becomes a new evacuation area, and the sectors D, E, and F in the block 2 are moved to the block 4.

If the block 2 then becomes unable to be used any more due to a failure of erasing the block, no evacuation area is left so that the counter measure same as before is taken. That is, data in the block with the largest number of erasable data (block 3) are moved to the acting evacuation area block (block 0), and the block 3 which has been just evacuated is erased. Then, the block 3 is used as an evacuation area. FIG. 14O shows the result of this.

Should this ongoing process be stopped at this point of time due to a power failure and the like, the host computer upon the restart of the process can conclude that this process was on the way to creating a free area since there is some data but no erasable sectors in the backup area.

As continuation of the process, a counter measure to create free areas is taken so that the sectors I and J of the block 6 are moved to the backup area (block 0), and the sectors K and L of the block 6 are moved to the block 3. FIG. 14P shows the result of this action.

At this point, the number of free sectors other than the sectors of the evacuation area has become larger than the number of data in the backup area (block 0), a search is made for a free sector by moving Write Pointer from the last sector of the evacuation area. Then, the data of the backup area (block 0) are moved to the free areas found by the search.

In case that this ongoing process is stopped due to a power failure and the like at the moment when the sectors B, C, M, and N of the backup area (block 0) are moved to the block 3 as shown in FIG. 14Q, the host computer upon the restart of the process can conclude that the process of creating a free block is at the step of moving data out of the backup area since there are some erasable data left therein.

As a continuation of the process, the logical sector I and J of the backup area (block 0) are moved to the block 4 in FIG. 14R. This is the end of the process.

Figure 15:
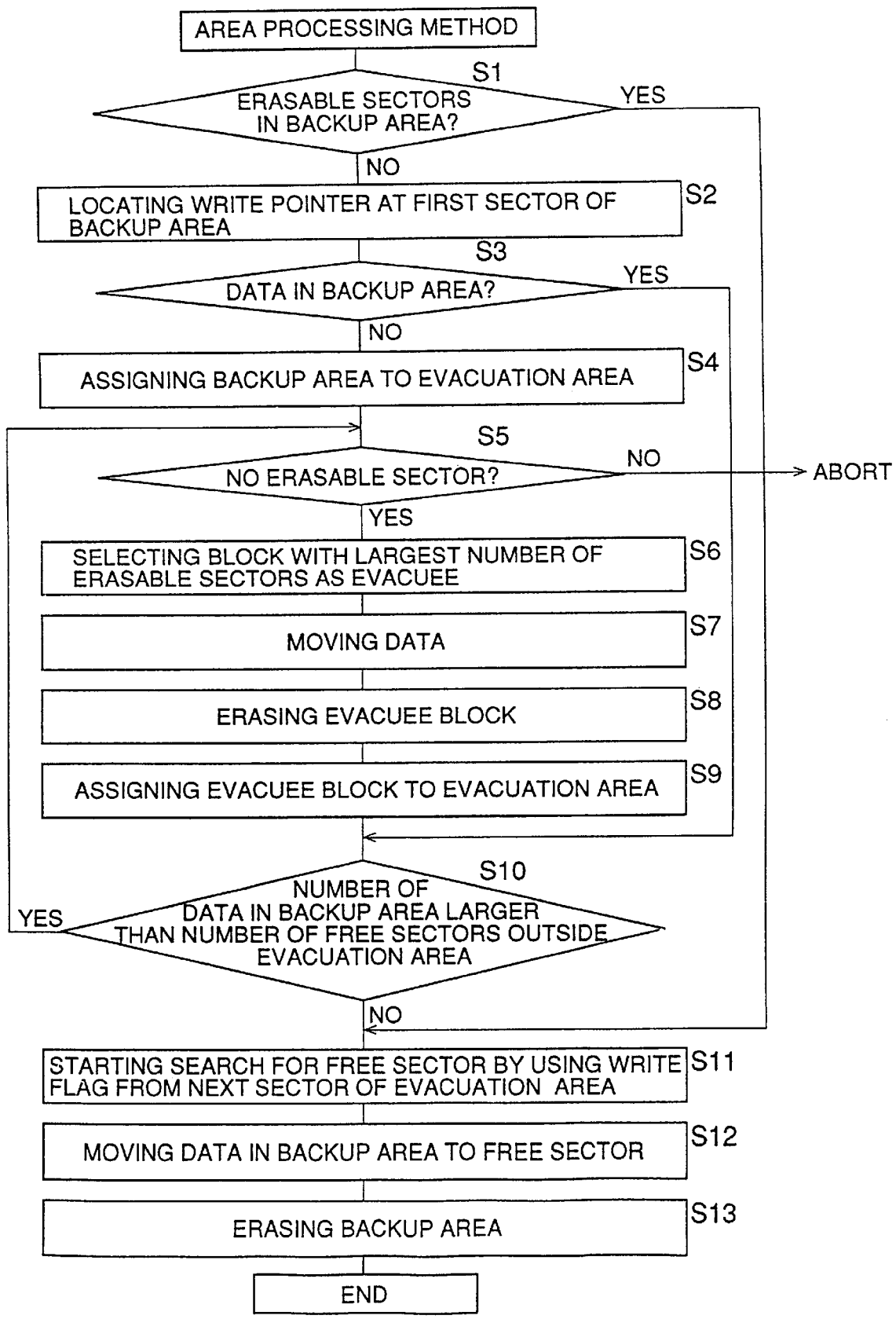
FIG. 15 is a flow chart showing a process of creating a free area.

FIG. 15 shows a flow chart of the process of creating free areas according to the second embodiment of the present invention. The process of the second embodiment will be described below by using this flow chart.

At a step S1, a check is made whether there are erasable sectors in the backup area, and if there are, go to a step S11. If there are no erasable sectors, go to a step S2, where Write Pointer is located at the first sector of the backup area. At a step S3, then, a check is made if there is data in the backup area. If there is data, go to a step S10, and if there is no data, proceed to a step S4, where the backup area is assigned to the evacuation area.

At a step S5, a check is made whether there are no erasable sectors in all the blocks. If there are no erasable sectors, free areas cannot be created so that the process is aborted at the step S5. If there are erasable sectors, proceed to a step S6, where the block with the largest number of erasable sectors is selected as an evacuee. At a step S7, data in the block of the evacuee are moved to the backup area serving as the evacuation area.

At a step S8, the block of the evacuee is erased, and at a step S9, the block of the evacuee is in turn newly assigned to the evacuation area.

At the step S10, a check is made whether the number of data in the backup area is larger than the number of free sectors outside the evacuation area. If it is larger, go back to the step S5 to repeat the above process. If the number of data in the backup area is not larger, proceed to a step S11, where a free sector is searched for by moving Write Flag in the writing direction starting from the next sector of the evacuation area. At a step S12, data in the backup area are moved to the free sectors found at the step S11. At a step S13, the backup area is erased. This is the end of the process.

In this embodiment, free areas are created as described above. Thus, even if some blocks become unable to be used in the memory space, a counter measure can be taken to create a free area. This prevents the memory device from stopping to function in such a case.

Also, even if the process is terminated during processing due to a power failure and the like, it is easy to decide at what step the process was terminated so that this decision making process can be simplified.

C. Enhancement of Erasing Process

As described above, flash memories cannot write data over existing data before erasing the existing data. This embodiment shows a method that can perform an efficient erasing process for erasing the entire memory space and that can restart the erasing process in the case of process termination by providing both Write Flag for indicating that there is written data and Executing Flag for indicating that an erasing process for erasing the entire memory space is underway.

Figure 16A:
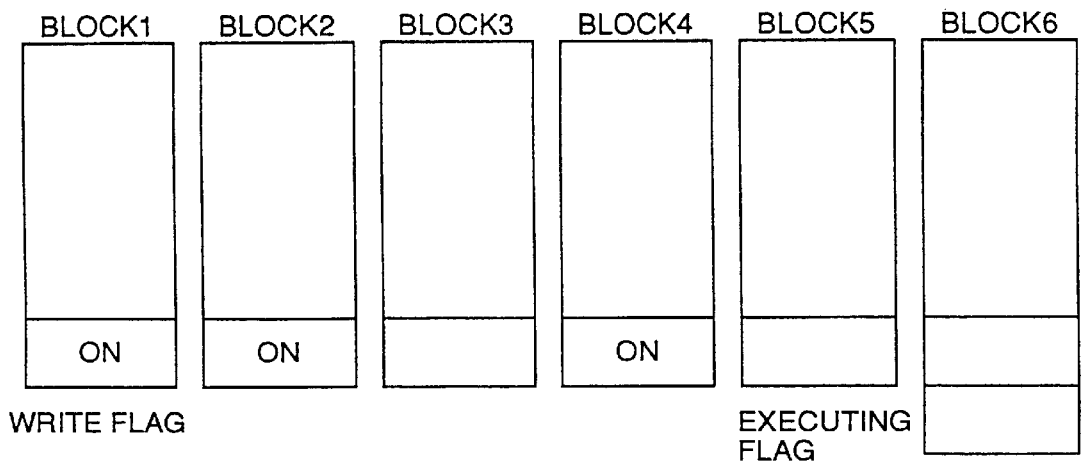

With reference to FIGS. 16A and 16F, the process of this embodiment will be described below. In this embodiment, there are six blocks, where each block is provided with an area for storing Write Flag and the block 6 is provided with an area for storing Executing Flag indicating that an entire space erasing process is underway.

In FIG. 16A, the blocks 1, 2, and 4 have Write Flags which were written into the block 1, 2, and 4 at the time of writing data into those blocks.

Figure 16B:
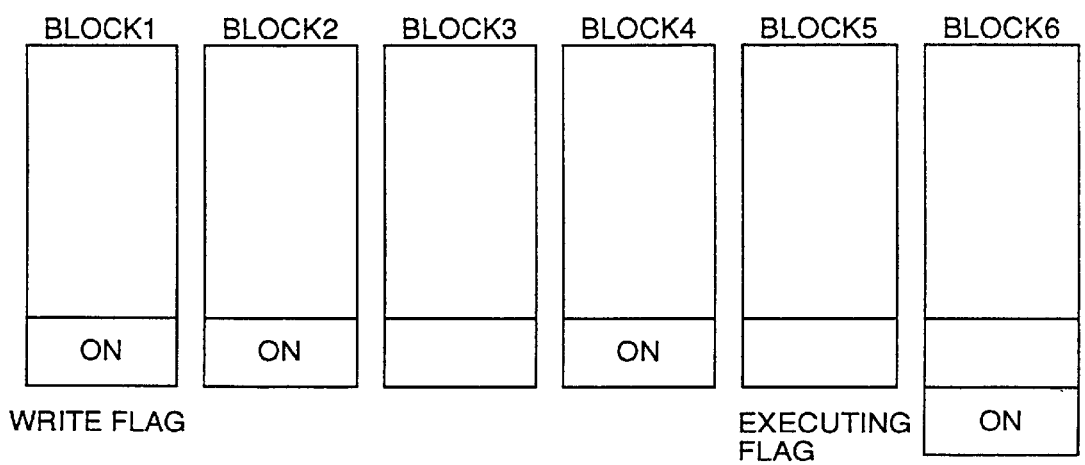

Then, before starting the initialization process of erasing the entire memory space, Executing Flag is written into the block 6 as shown in FIG. 16B.

Figure 16C:
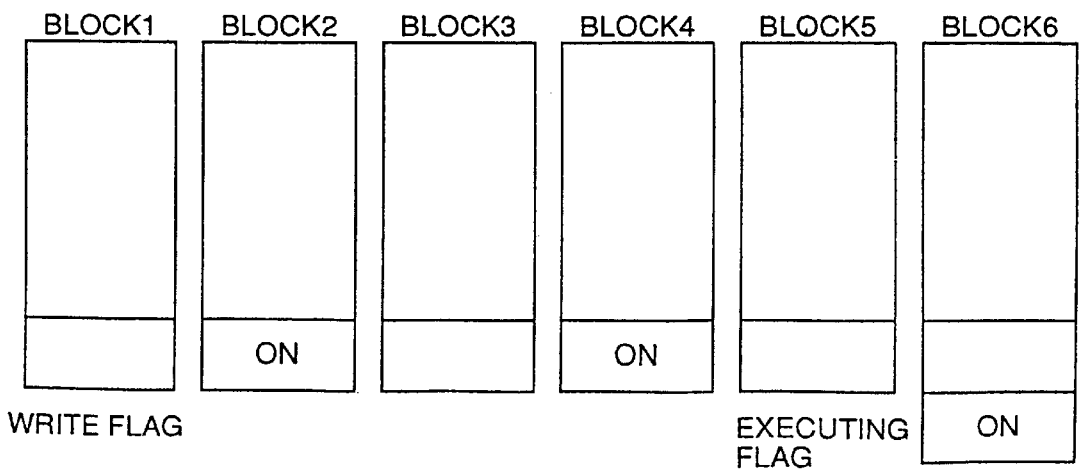

In FIG. 16C, the block 1 which has Write Flag is erased, and Write Flag is deleted also.

In FIG. 16D, the block 2 which has Write Flag is erased, and Write Flag is deleted also.

Even if the process moves to a stop sequence by some reason and, then, is restarted later on, it can be concluded straightaway that an initialization process is underway since there is Executing Flag written in the block 6. Thus, the initialization process can be resumed.

In FIG. 16E, since there are no Write Flags written in the block 1, 2, and 3, the block 4 is erased and the Write Flag thereof is deleted also.

In FIG. 16F, since there are no Write Flags written in the block 1 through 5, the block 6 is erased to delete Executing Flag thereof.

Figure 17:
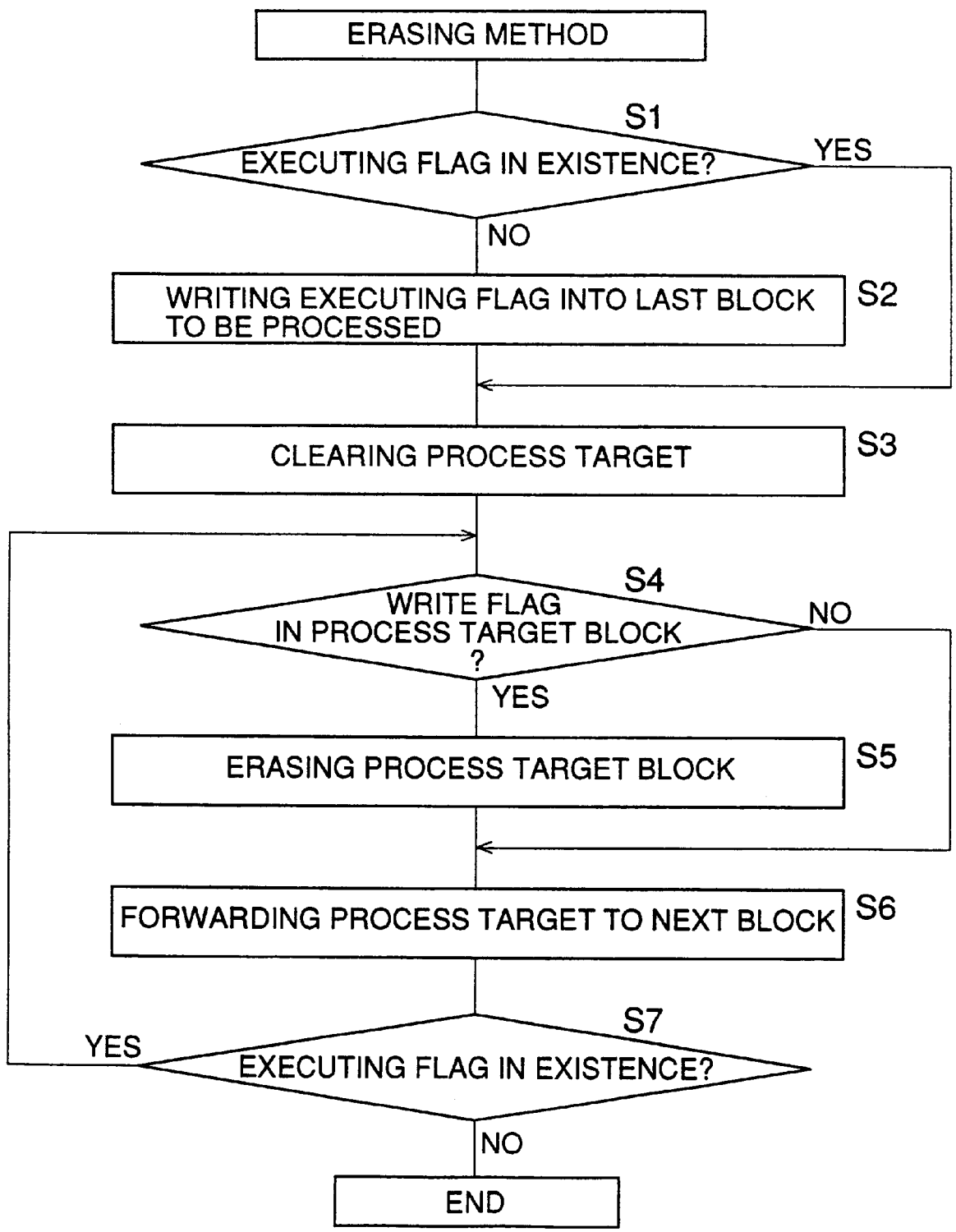
FIG. 17 is a flow chart showing an erasing process.

FIG. 17 shows a flow chart of this embodiment, which will be described below.

At a step S1, a check is made whether there is Executing Flag, and if there is, go to a step S3. if there is no Executing Flag, Executing Flag is written into the last block to be processed.

At the step S3, the process target is cleared. At a step S4, a check is made whether Write Flag is set in the process target block. If it is not set, go to a step S6, and if it is set, go to a step S5 to erase the process target block. At the step S6, the process target is proceeded to the next block.

At a step S7, it is checked if Executing Flag is set, and if it is set, go back to the step S4 to repeat the above process. If no Executing Flag is set, end the process.

Since Write Flag is provided as described above in this embodiment, unnecessary erasing can be avoided, which leads to a shorter processing time and a longer life of the memory media.

Also, Executing Flag is provided to indicate that the initialization process is underway, so that an unexpected termination of the process can be handled.

D. Enhancement of Writing Speed and Allocation of Backup Areas in Case of Defective Sectors As described above, flash memories cannot write data over existing data before erasing the existing data. Thus, it is necessary to mark sectors with Erase Flags when there are identical sectors and to erase sectors marked with Erase Flags later on at a time of convenience. This means that a writing process takes a relatively long time.

Also, the flash memory has a limit in the number of erasures, and cannot be erased anymore after experiencing erasing this limiting number of times. Thus, when there occurred defective sectors, it is required that a counter measure be taken by allocating backup areas.

This embodiment which will be described below shows a method of assigning backup areas in the case of defective sectors and enhancing the memory writing speed by eliminating the time lag at the time of writing in the memory to which data cannot be written over existing data and cannot be erased by the unit of sector.

Figure 18:
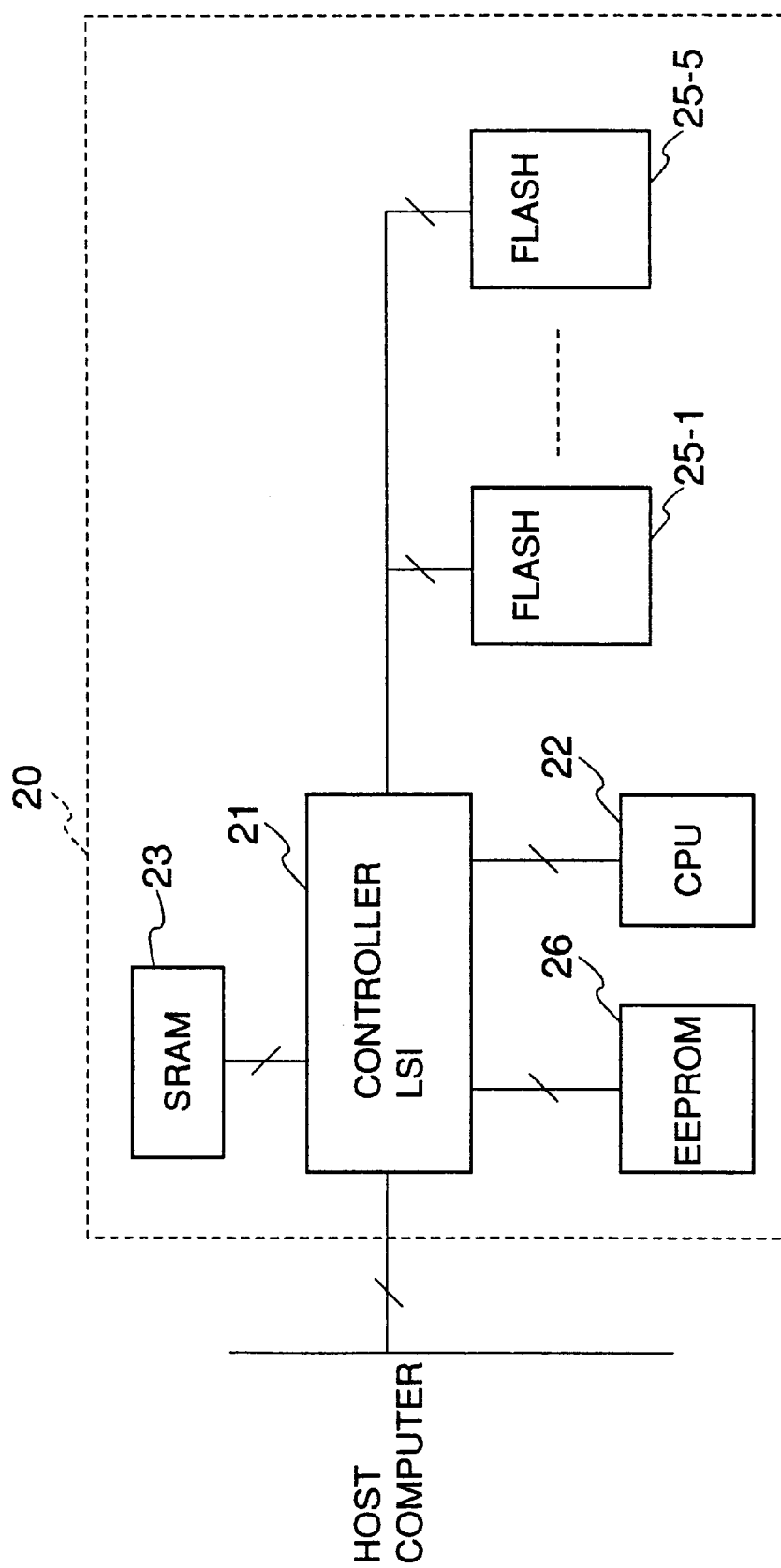
FIG. 18 is a block diagram of a system structure of an embodiment for enhancing a writing speed according to the present invention.

FIG. 18 shows a block diagram showing the structure of a system according to this embodiment. The system of FIG. 18 differs from the system of FIG. 1 only in an additional EEPROM 26. The EEPROM 26 contains a decoding table for address conversion. When part of the flash memory becomes defective, a counter measure is taken by rewriting the EEPROM 26. In FIG. 18, the EEPROM 26 is used for storing a decoding table, but any memories capable of rewrite, e.g., the flash memory, can be used for that purpose.

(1) First Embodiment

Figure 19A:
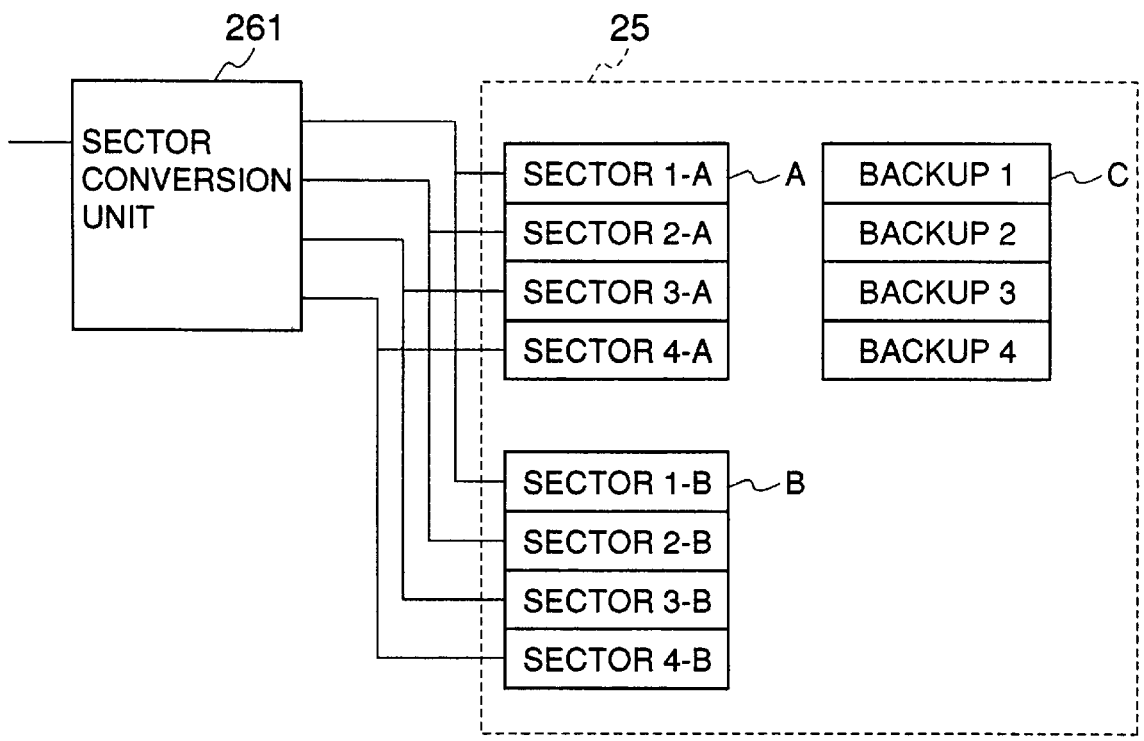
FIGS. 19A and 19B are illustrative drawings showing a first embodiment of enhancing a writing speed according to the present invention.
Figure 19B:
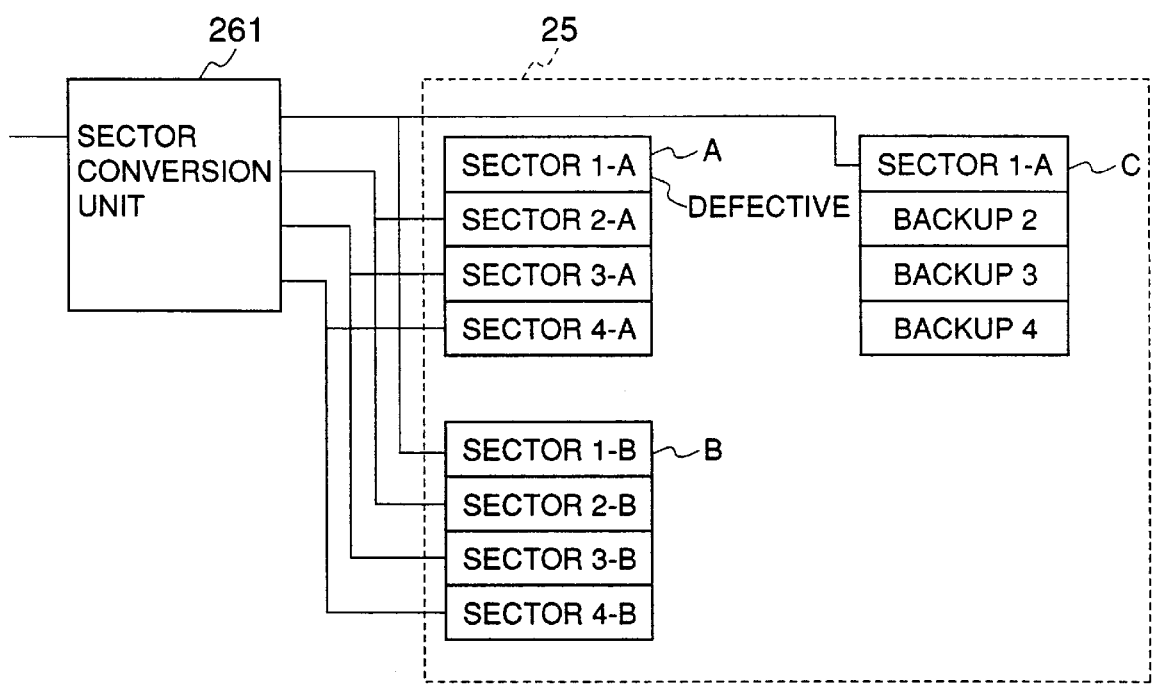

FIGS. 19A and 19B show block diagrams of a system according to a first embodiment. In FIG. 19A, a sector conversion unit 261 includes the EEPROM 26 (or ROM capable of rewrite, e.g., a flash memory). A flash memory 25 includes a first area A, a second area B, and a backup area C. The first area A and the second area B are provided with four sectors 1 through 4.

In FIG. 19A, when writing data into the sector 1, a check is made on the first area A and the second area B. If the first area A already has other data therein, the data is written into the second area B. At the same time, the sector 1-A of the first area A is erased.

If an error occurred in writing the data, a sector of the backup area C is used as an alternate sector.

That is, ROM in the sector conversion unit 261 is rewritten in order to use a sector of the backup area C substituting for the sector 1-A of the first area A, which had an error in writing the data. The result is shown in FIG. 19B, where one sector of the backup area C is allocated for the sector 1-A.

As described above, when errors occur, sectors of the backup area are allocated as long as there remain sectors in the backup area. When there are no more sectors in the backup area, all the data in the flash memory 25 are evacuated to external areas like the SRAM 23 of FIG. 18. The ROM in the sector conversion unit 261 are rewritten to divide an available space into a data space and a backup space. By excluding defective sectors, sectors are allocated successively in a descending order or an ascending order of the address depending on the type of the system.

In this embodiment, the writing and erasing of data can be performed simultaneously so that the time lag at the time of writing can be eliminated and a writing speed can be increased. Also, since backup areas are provided to substitute for defective sectors, the development of defective sectors is not a problem.

(2) Second Embodiment

Figure 20A:
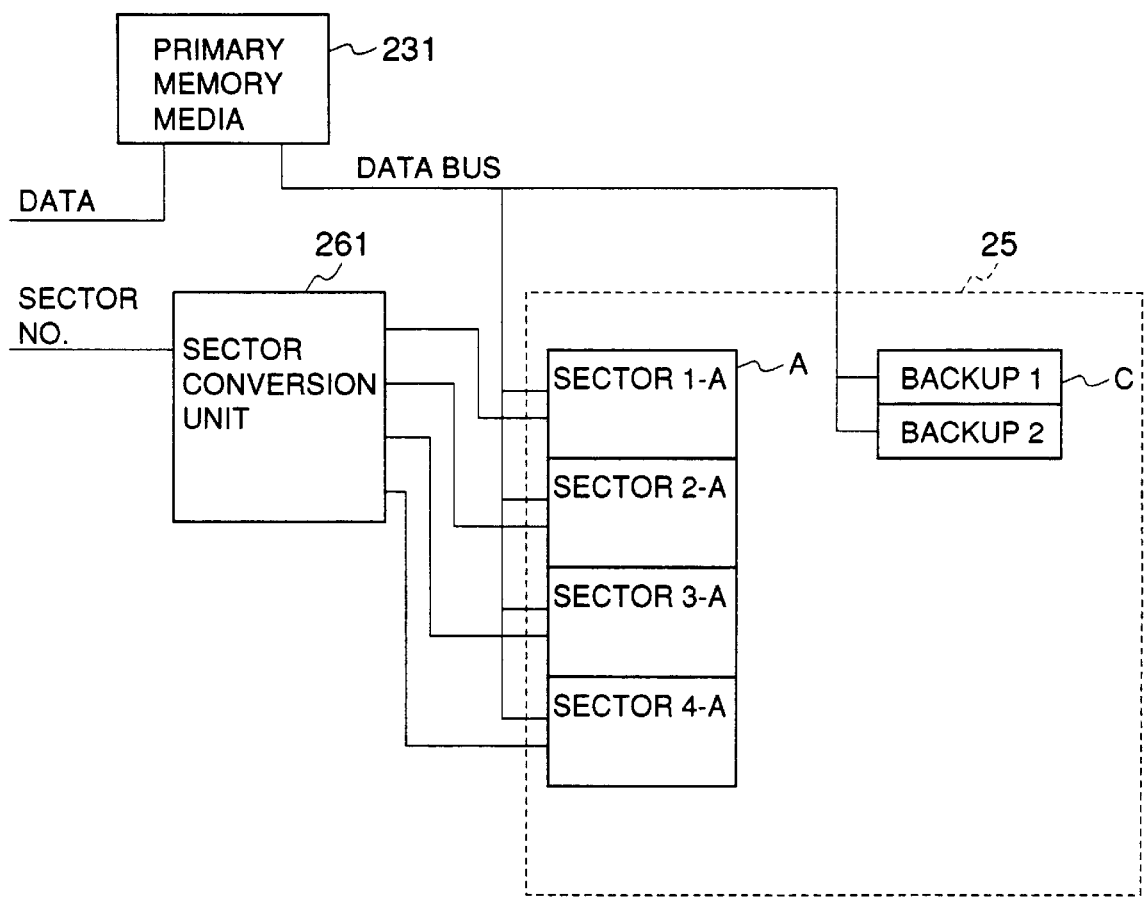
FIGS. 20A and 20B are illustrative drawings showing a second embodiment of enhancing a writing speed according to the present invention.
Figure 20B:
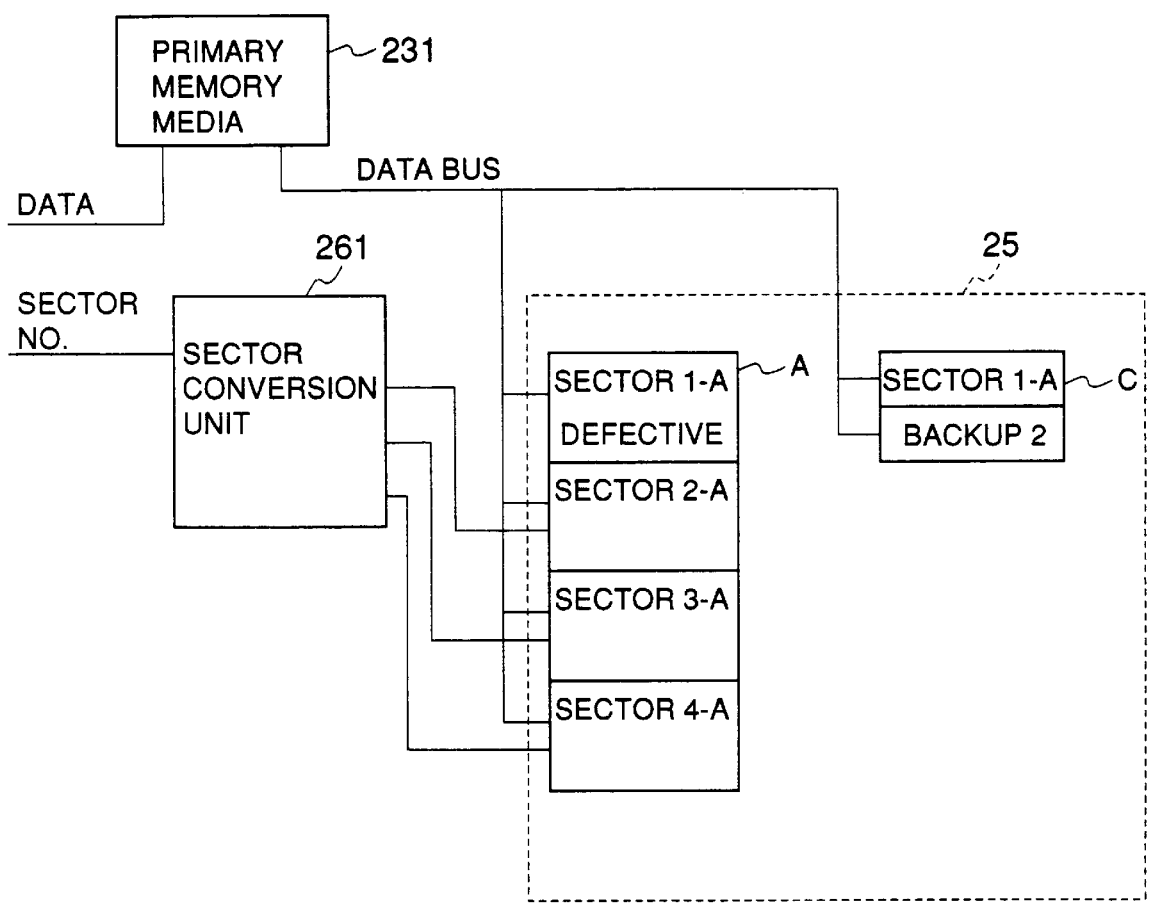

FIGS. 20A and 20B are block diagrams of a system according to a second embodiment. In FIG. 20A, a sector conversion unit 261 includes an EEPROM or other ROM capable of rewrite, e.g., a flash memory. A flash memory 25 includes a first area A and a backup area C. The first area A is provided with four sectors 1 through 4. A primary memory media 23 is the SRAM 23 of FIG. 18 and the like.

In FIG. 20A, while data is being transferred to the primary memory media 231, a check is made on a sector into which the data is to be written. If the sector already has data, the sector is erased. If the transfer of the data is completed before finishing erasing the sector, the system waits until the erasing of the sector is finished. If the transfer of the data is completed after finishing erasing the sector, the data is written upon the end of transfer.

If an error occurs during the writing of the data, the ROM of the sector conversion unit 261 is rewritten, and a sector 1-A is written into the backup area C as shown in FIG. 20B (showing the case that an error occurred in the sector 1-A). Unless there occurs an error in sectors, the backup area C is not used for writing data.

In this embodiment as described above, a sector is erased when it already has data while data to be written is being transferred to the primary memory media 231. Thus, the time lag at the time of writing can be eliminated as in the first embodiment, and a writing speed can be enhanced. Also, since backup areas are provided to substitute for defective sectors, the development of defective sectors is not a problem.

(3) Third Embodiment

Figure 21A:
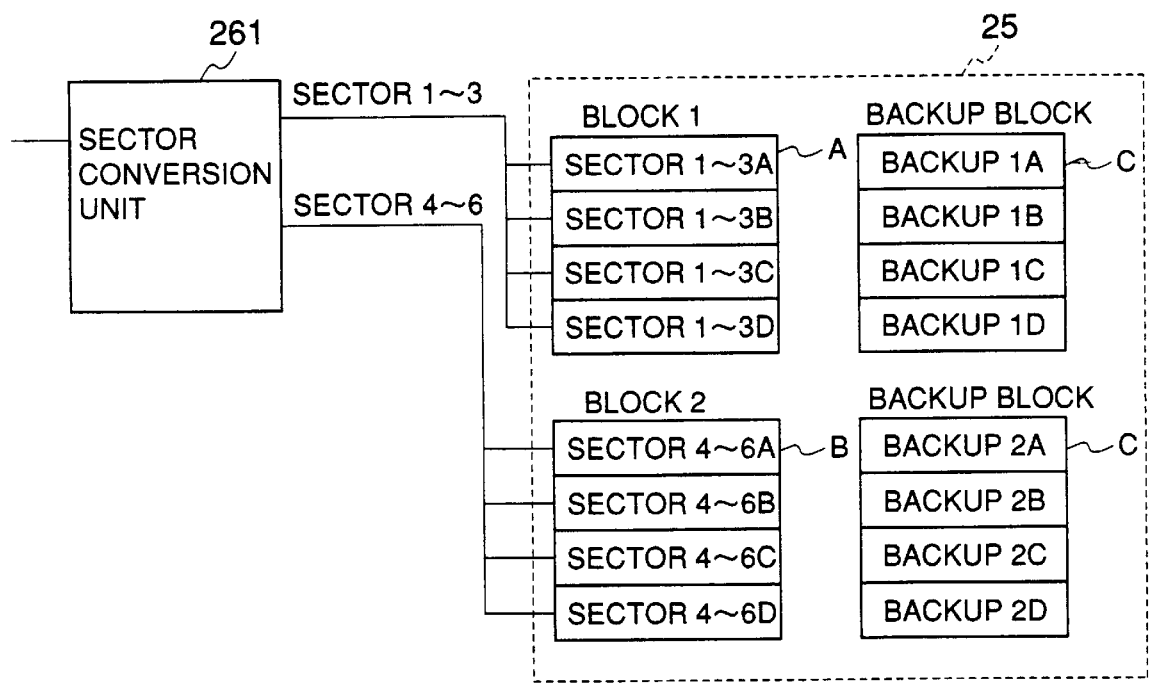
FIGS. 21A and 21B are illustrative drawings showing a third embodiment of enhancing a writing speed according to the present invention.
Figure 21B:
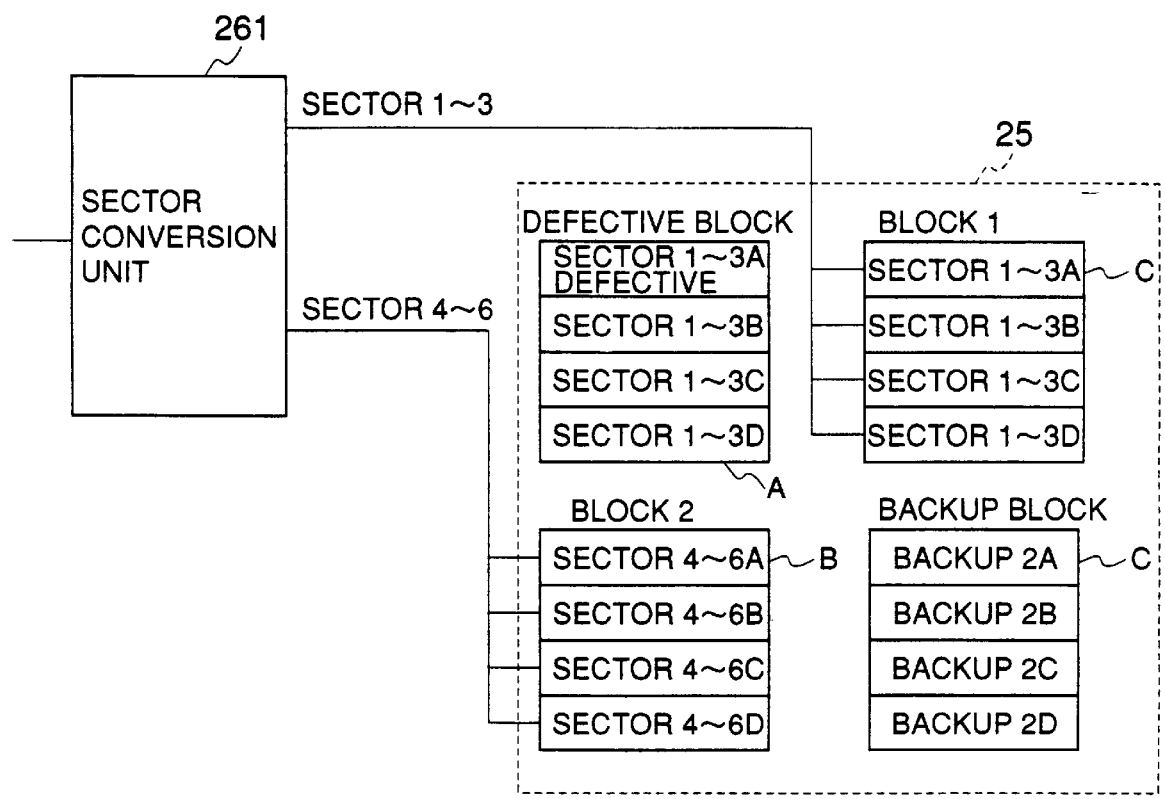

FIGS. 21A and 21B are block diagrams of a system according to a third embodiment. In FIG. 21A, a sector conversion unit 261 includes an EEPROM or other ROM capable of rewrite, e.g., a flash memory. A flash memory 25 includes a block 1, a block 2, a backup block1, and a backup block2. The blocks 1 and 2 are provided with sectors 1-to-3A to 1-to-3D and sectors 4-to-6A to 4-to-6D, respectively.

Each of the sectors 1-to-3A, . . . , and 1-to-3D is one sector having one physical address, and data with a logical address of 1, 2, or 3 can be written into any of those sectors. That is, the four sectors referred to as A to D are provided as areas into which data with a logical address of 1, 2, or 3 is written. When data is written into those sectors, a free area among A to D is used.

The sectors 4-to-6A, . . . , and 4-to-6D are the same as above, and a free area among A to D is used for writing data with a logical address of 4, 5, or 6.

In this embodiment as described above, a memory space is divided into blocks having n+1 sectors (n=3 in this example) so that there is one additional sector in excess of the number of logical addresses.

In FIG. 21A, when writing data with a logical address of 1, the sectors 1-to-3A, . . . , and 1-to-3D are examined to find if a sector of the same logical address already exists. If it does, that sector is erased. Since there is at least one free sector, data is written into a free sector while erasing the above sector.

If an error occurs at the time of writing, one of the backup blocks is used as an alternate block. For example, if the sector 1-to-3A becomes defective, the backup block 1 is assigned to an alternate block as shown in FIG. 21B. At the same time, the ROM of the sector conversion unit 261 is rewritten so as to use the backup block 1 as an alternate for the block 1 suffering an error.

As far as there is a backup block, the process described above is carried out. When the backup blocks are used up, all data are evacuated to an external memory such as the SRAM 23 of FIG. 18, and the ROM of the sector conversion unit 261 is rewritten so as to newly divide the memory space into a data space and a backup space. In doing so, sectors are allocated successively in a descending order or an ascending order of the address depending on the type of the system with, defective sectors being excluded.

The sector conversion unit 261 is structured for converting a logical address into a physical address in such a way that there are n+1 available sectors in one block by making blocks in the unit of n+1 sectors.

When some sectors become defective, the conversion table of the sector conversion unit 261 is rewritten as described above so that there are always n+1 sectors in one block.

In this embodiment as described above, one block has n+1 sectors, i.e., n sectors plus one excess sector, and erasing a sector can be done at the same time as writing data. Thus, the time lag at the time of writing is eliminated to enhance the writing speed. Also, since backup areas are provided to substitute for defective sectors, the development of defective sectors is not a problem.

(4) Fourth Embodiment

Figure 22A:
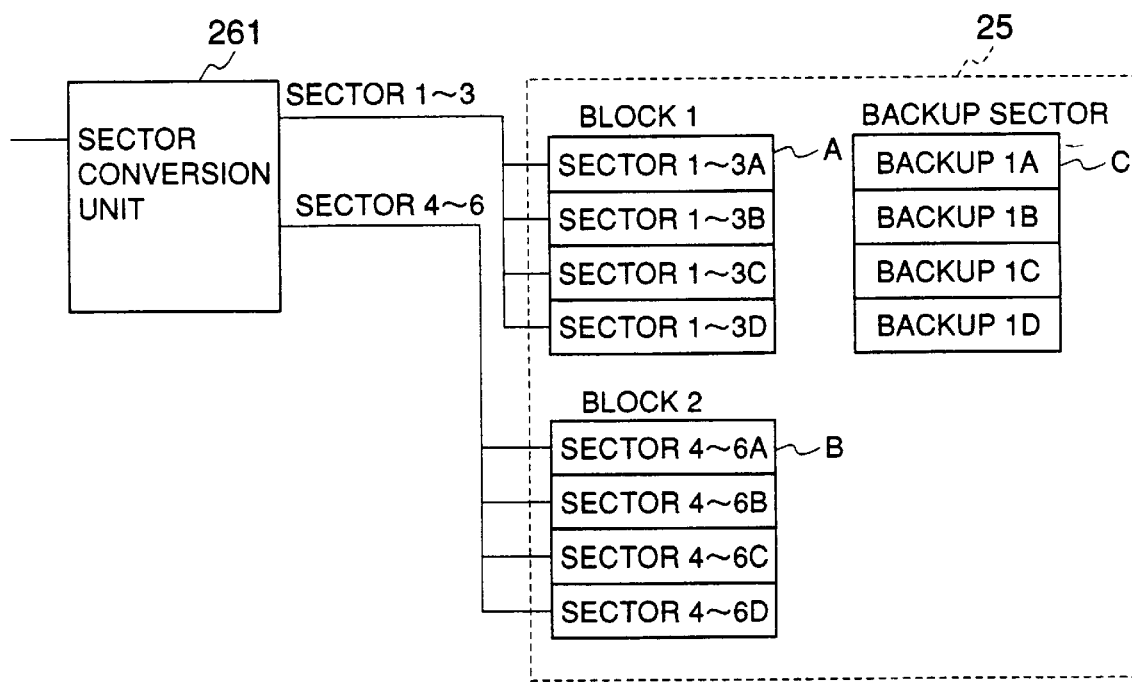
FIGS. 22A and 22B are illustrative drawings showing a fourth embodiment of enhancing a writing speed according to the present invention.
Figure 22B:
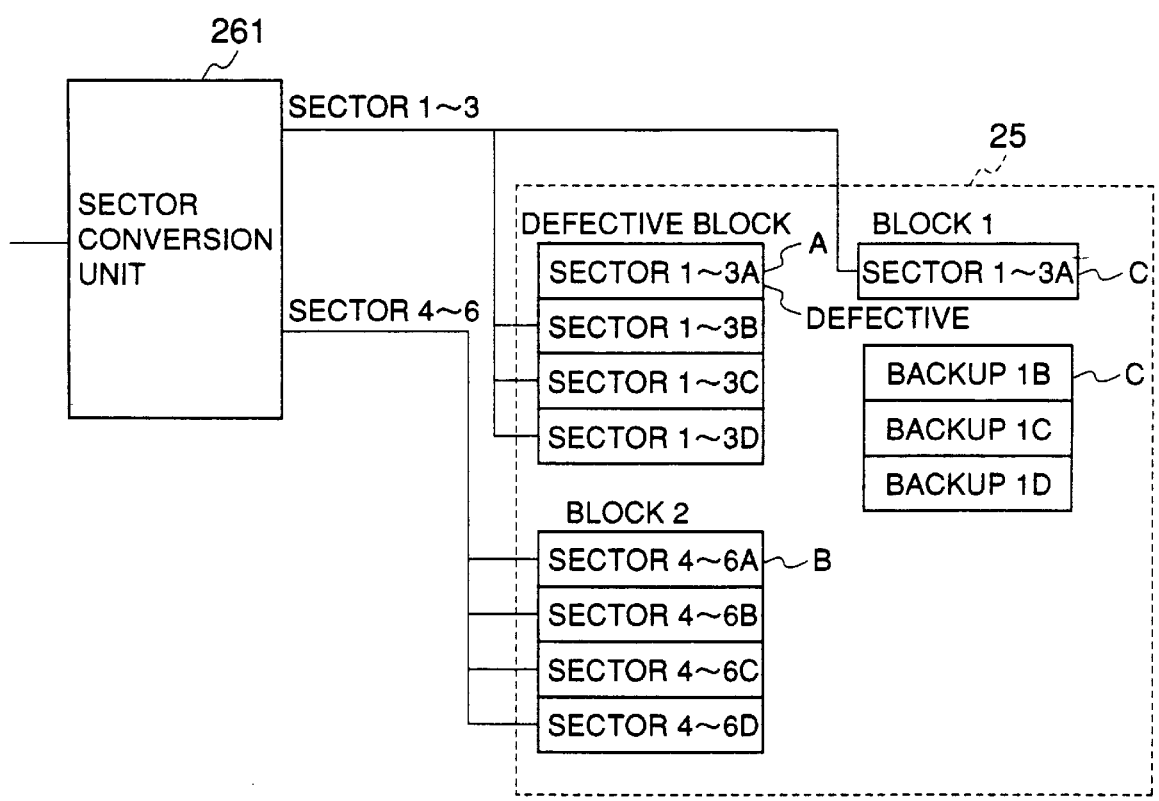

FIGS. 22A and 22B are block diagrams of a system according to a fourth embodiment. In FIG. 22A, a sector conversion unit 261 includes an EEPROM or other ROM capable of rewrite, e.g., a flash memory. A flash memory 25 includes a block 1, a block 2, and backups 1A to 1D. The blocks 1 and 2 are provided with sectors 1-to-3A to 1-to-3D and sectors 4-to-6A to 4-to-6D, respectively.

In this embodiment, there are n+1 sectors (n=3 in this example) in one block as in the third embodiment so that there is at least one free sector at anytime.

In FIG. 22A, when writing data with a logical address of 1, the sectors 1-to-3A, . . . , and 1-to-3D are examined to find if a sector of the same logical address already exists. If it does, that sector is erased. Since there is at least one free sector, data is written into a free sector while erasing the above sector.

If an error occurs at the time of writing, one of the backups 1A to 1D is used as an alternate sector. For example, if the sector 1-to-3A becomes defective, the backup 1A is newly included in the block 1 as shown in FIG. 22B. At the same time, the ROM of the sector conversion unit 261 is rewritten so as to use the backup 1A as an alternate for the sector 1-to-3A. Thus, the backup 1A becomes a sector 1-to-3A while leaving the backups 1B to 1D for further use.

As far as there is a backup, the process described above is carried out. When the backups are used up, all data are evacuated to an external memory such as the SRAM 23 of FIG. 18, and the ROM of the sector conversion unit 261 is rewritten so that the memory space is newly divided into a data space and a backup space. In doing so, sectors are allocated successively in a descending order or an ascending order of the address depending on the type of the system, with defective sectors being excluded.

The sector conversion unit 261 has an address conversion table for converting a logical address into a physical address such that there are n+1 sectors available for writing one sector by making blocks in the unit of n+1 sectors. When some sectors become defective, the conversion table of the sector conversion unit 261 is rewritten so that there are always n+1 sectors in one block.

In this embodiment as described above, one block has n+1 sectors, i.e., n sectors plus one excess sector, and erasing a sector can be done at the same time as writing data. Thus, same as the first, second, and third embodiments, the time lag at the time of writing is eliminated to enhance a writing speed. Also, since backup areas are provided to substitute for defective sectors, the development of defective sectors is not a problem.

(5) Fifth Embodiment

Figure 23A:
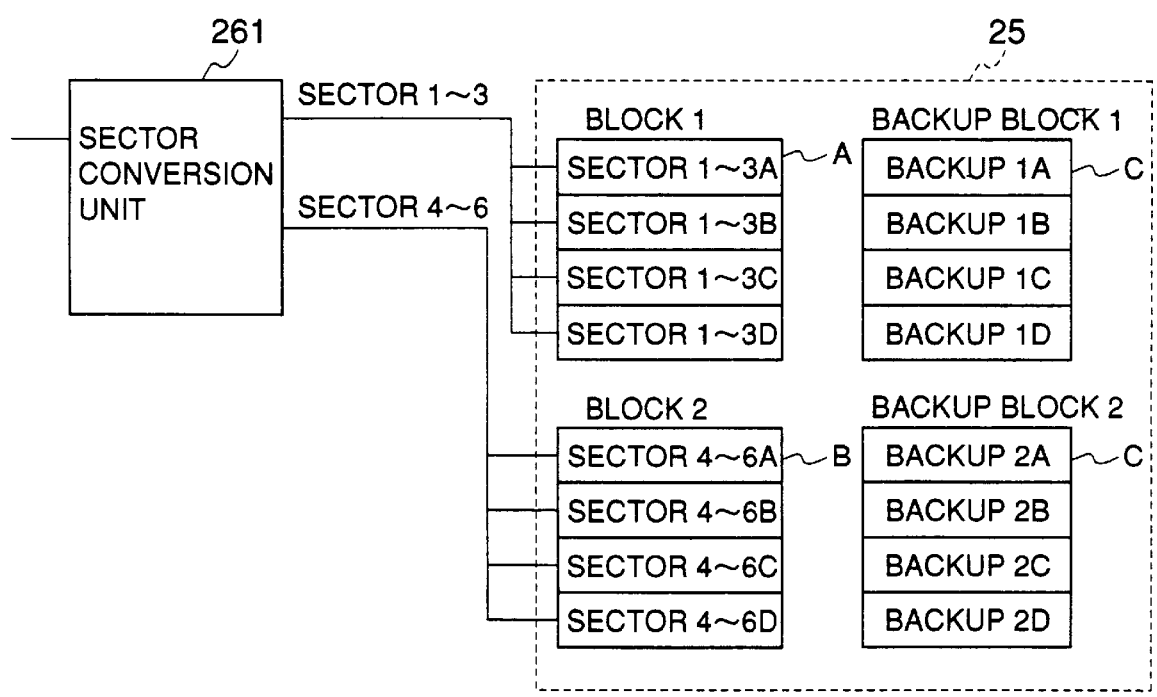
FIGS. 23A and 23B are illustrative drawings showing a fifth embodiment of enhancing a writing speed according to the present invention.
Figure 23B:
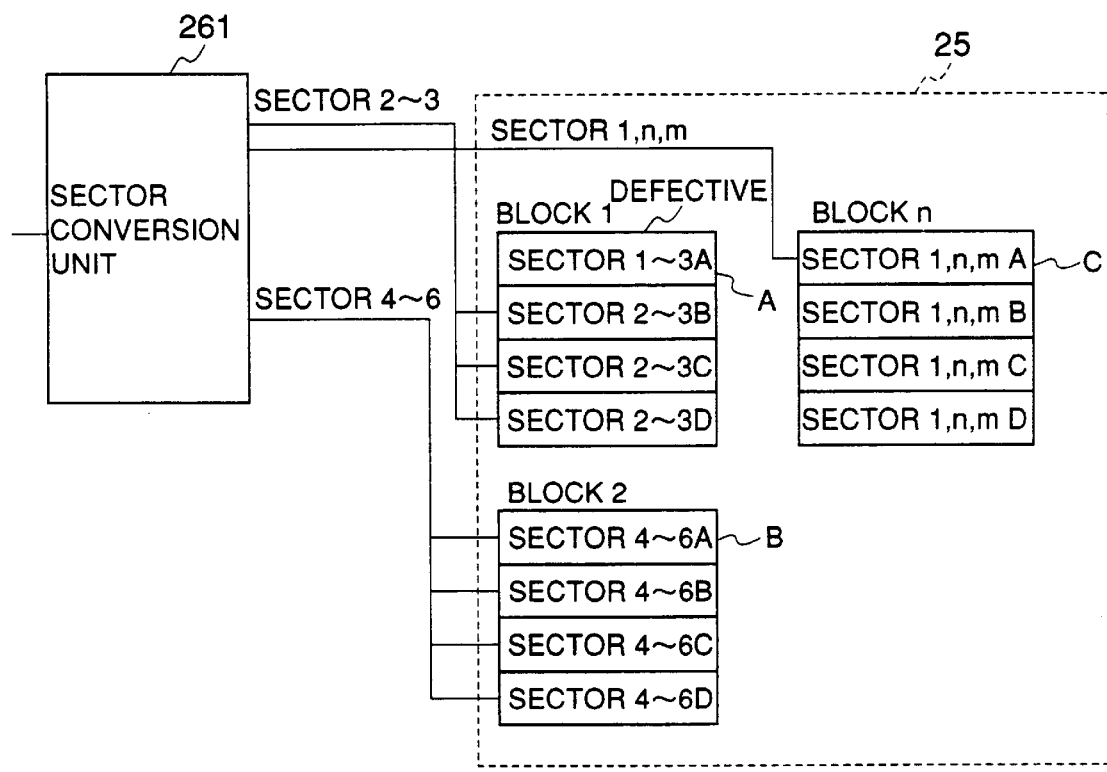

FIGS. 23A and 23B are block diagrams of a system according to a fifth embodiment. In FIGS. 23A and 23B, which have the same references as do FIGS. 22A and 22B for the same elements, a sector conversion unit 261 includes an EEPROM or other ROM capable of rewrite, e.g., a flash memory. A flash memory 25 includes a block 1, a block 2, a backup block 1, and a backup block 2. The blocks 1 and 2 are provided with sectors 1-to-3A to 1-to-3D and sectors 4-to-6A to 4-to-6D, respectively.

In this embodiment, there are n+1 sectors (n=3 in this example) in one block as in the third embodiment so that there is at least one free sector at anytime.

In FIG. 23A, when writing data with a logical address of 1, the sectors 1-to-3A, ..., and 1-to-3D are examined to find if a sector of the same logical address already exists. If it does, that sector is erased. Since there is at least one free sector, data is written into a free sector while erasing the above sector.

If an error occurs at the time of writing, one of the backup sectors is used as an alternate sector. For example, if the sector 1-to-3A becomes defective, the ROM of the sector conversion unit 261 is rewritten so as to use one of the sectors of the backup block 1 as an alternate for the sector 1-to-3A. In doing so, the backup block 1 is assigned to a block n in a memory space. As shown in FIG. 23B, a sector 1, n, mA of the block n becomes a sector 1, i.e., the sector 1 is included in the block n while leaving the sectors 2 and 3 in the block 1.

In other words, a block need not have sectors of successive addresses, and the number of sectors in a block is changed when there is a defective sector.

As long as there is a backup, the process described above is carried out. When the backups are used up, all data are evacuated to an external memory such as the SRAM 23 of FIG. 18, and the ROM of the sector conversion unit 261 is rewritten so that the memory space is newly divided into a data space and a backup space. In doing so, sectors are allocated successively in a descending order or an ascending order of the address depending on the type of the system with defective sectors being excluded.

In this embodiment, as described above, one block has n+1 sectors, i.e., n sectors plus one excess sector, and erasing a sector can be done at the same time as writing data. Thus, same as the first, second, third, and fourth embodiments, the time lag at the time of writing is eliminated to enhance the writing speed. Also, since backup areas are provided to substitute for defective sectors, the development of defective sectors is not a problem.

Figure 24A:
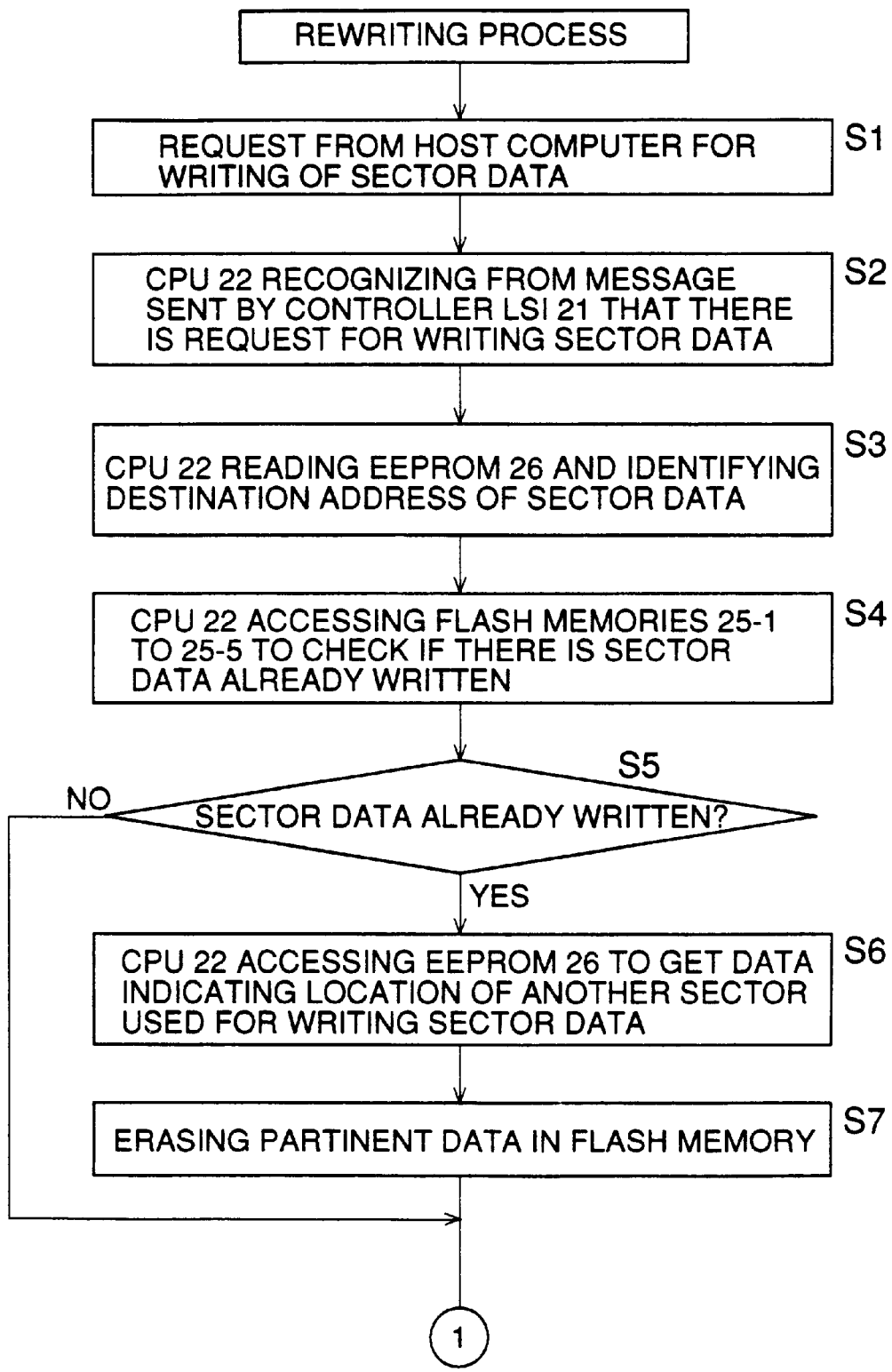
FIGS. 24A to 24C are a flow chart showing a process of enhancing a writing speed.
Figure 24B:
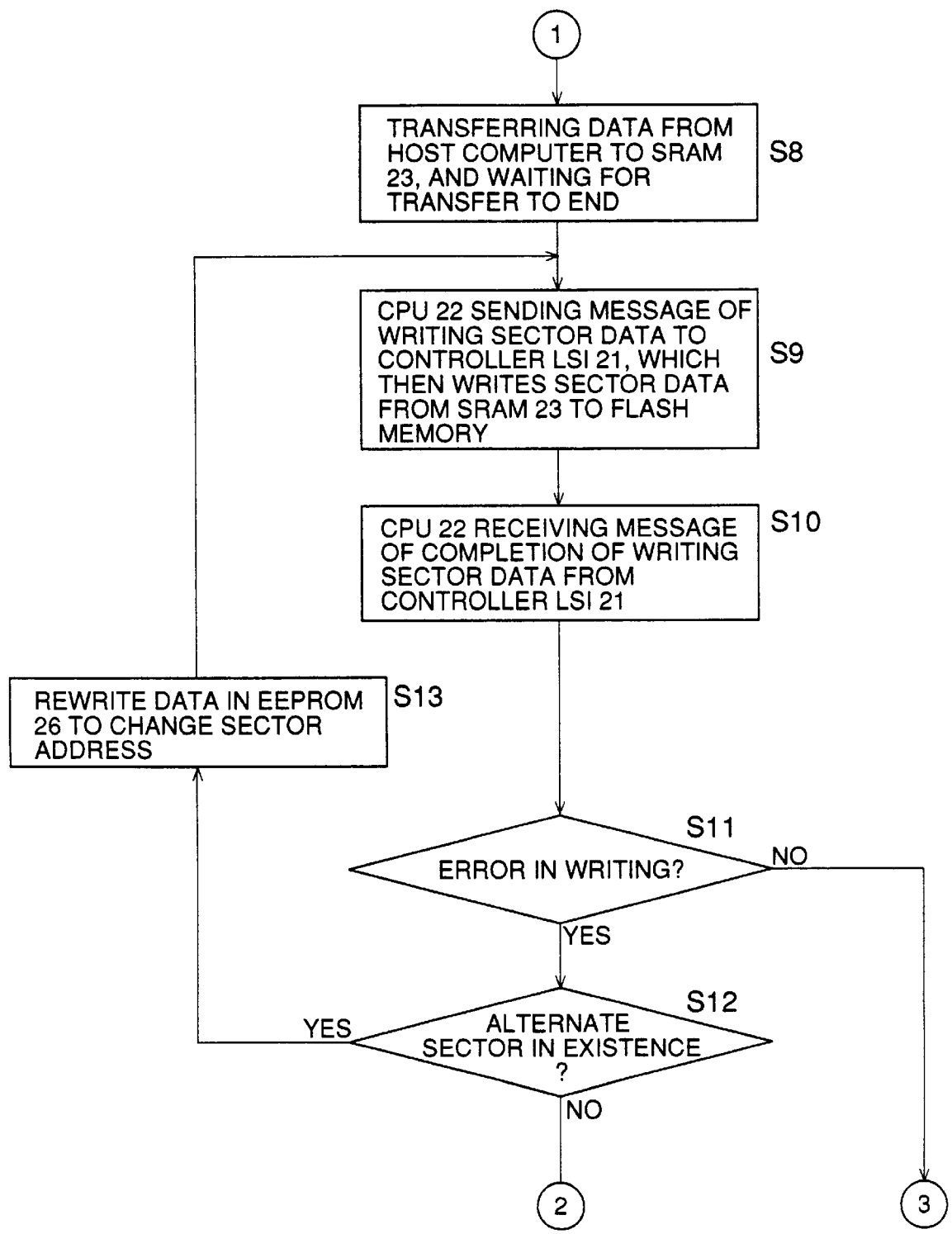
Figure 24C:
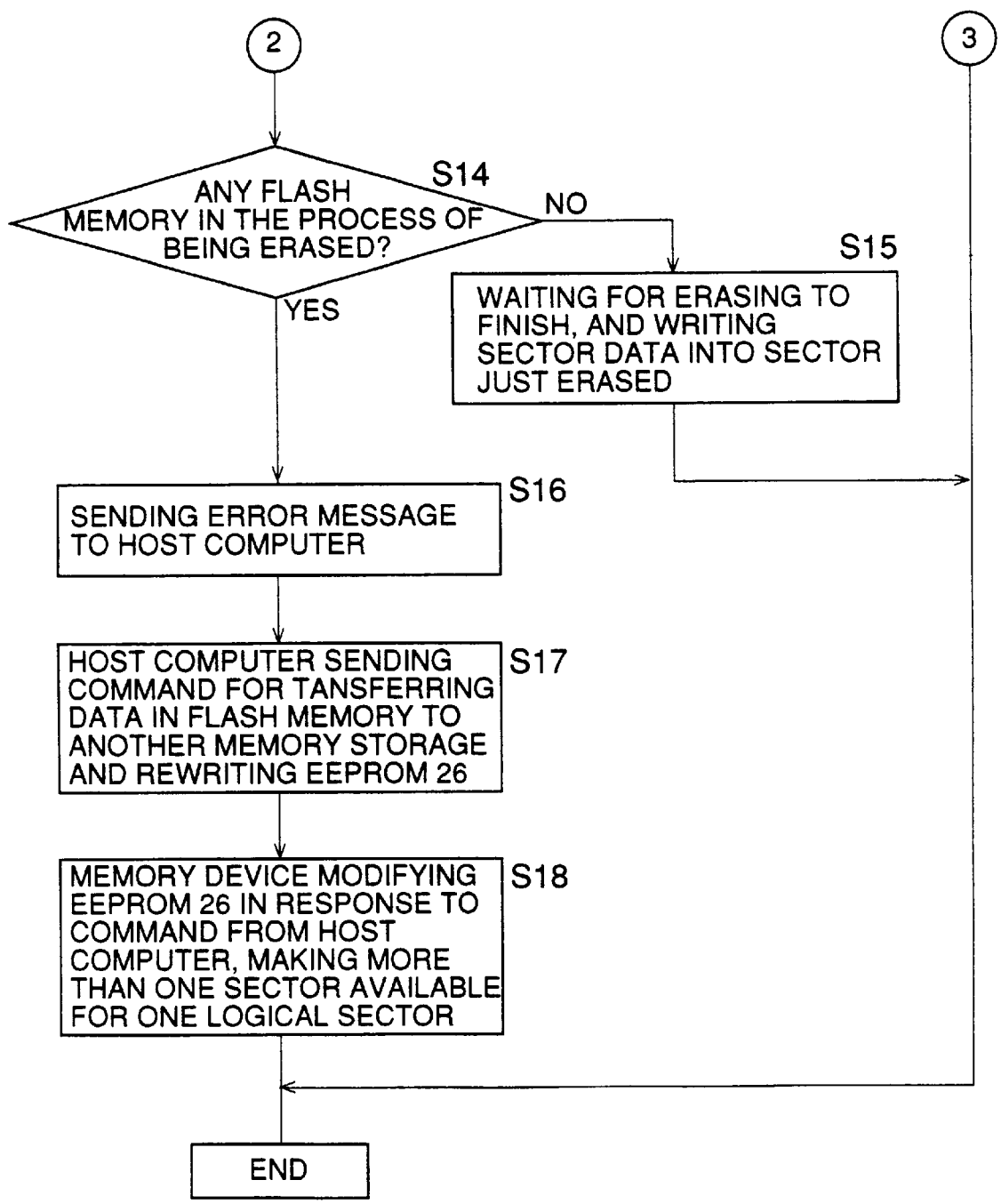

FIGS. 24A to 24C show a flow chart of a process common in all the above embodiments. With reference to FIGS. 24A to 24C, a process of the embodiments shown in FIG. 18 will be described below.

At a step S1, a host computer requests the writing of sector data. At a step S2, the CPU 22 of FIG. 18 recognizes from the message sent by the controller LSI 21 that there is a request for the writing of sector data. Here, it may be instead that the controller LSI 21 interrupts the CPU 22 to send thereto a request for the writing of sector data.

At a step S3, the CPU 22 reads the EEPROM 26, and identifies the destination address of the sector data. Also, the CPU 22 accesses the flash memories 25-1 to 25-5 to look up management information and that sort in order to check if there is sector data already written. At a step S5, a check is made whether there is sector data already written, and if there is not, go to a step S8 of FIG. 24B. If there is sector data already written, the CPU 22 accesses the EEPROM 26 at a step S6 to get data indicating the location of another sector used for writing the sector data. Then, at a step S7, pertinent data in the flash memories is erased (an error check is performed later for a process efficiency), and the step S8 of FIG. 24B is the next step to proceed.

At a step S8, data is transferred from a host computer to the SRAM 23, and proceeding to the next step waits until the completion of the data transfer. At a step S9, the CPU 22 sends a message of the writing of the sector data to the controller LSI 21, so that the controller writes the sector data into the flash memories. At a step S10, the CPU 22 receives a message of the completion of the writing of the sector data from the controller LSI 21. At a step S11, a check is made whether an error occurred in writing the sector data.

If no error occurred, this is the end of the process. If an error occurred, a check is made at a step S12 whether there is an alternate sector. If there is, go to a step S13, where data in the EEPROM 26 is rewritten to change the sector address. Then, go back to the step S9.

If there is no alternate sector, go to a step S14 of FIG. 24C, where a check is made whether there is a flash memory in the process of being erased at that moment of time. If there is, go to a step S15, where the sector data, after waiting until the completion of erasing, is written into a sector which has been just erased. This is the end of the process.

If no flash memories turns out to be in the process of being erased at a step S14, an error message is sent to the host computer at a step S16.

Then, at a step S17, the host computer send a command for transferring data in the flash memories into another memory storage and rewriting the EEPROM 26. The memory device 20 modifies the EEPROM 26 in response to the command from the host computer in such a way that more than one sector are available for one logical sector sent from the host computer. By doing this, the memory device 20 can be used again, although it has a less memory volume.

In the above, a process has been described for the case that data is transferred to the SRAM 23 and, then, written into the flash memories. However, it can be instead that data is written directly into the flash memories without having the SRAM 23 provided (in this case, the steps S8 and S9 become one step in the flow chart described above).

E. Enhancement of Reliability of Decoding Unit for Address Conversion

ROMs are sometimes used for storing a conversion table to convert a logical address into a physical address. Although flash EEPROMs, EEPROMs, and the like can be used instead of ROMs, the use of those ROMs is rare because there is usually no need to change the contents of the decoding unit.

As described above, flash memories by its nature cannot be erased more than its limiting times so that an address of a sector cannot be used once the sector becomes defective. Accordingly, as described in the above embodiments 1 to 5, flash EEPROMs, EEPROMs, and the like are used for a decoding unit for storing a conversion table to convert a logical address into a physical address, so that a conversion table can be rewritten to exclude sectors once those sectors become defective.

However, when using flash EEPROMs, EEPROMs, and the like for storing a conversion table, those memories also have a limit in the number of erasures, and defective sectors will develop after erasing those memories more times than their limit.

For the case that such memories able to be rewritten as flash EEPROMs, EEPROMs, and the like are used for a decoding unit, this embodiment makes the decoding unit double in order to extend life of the decoding unit and increase its reliability.

Figure 25A:
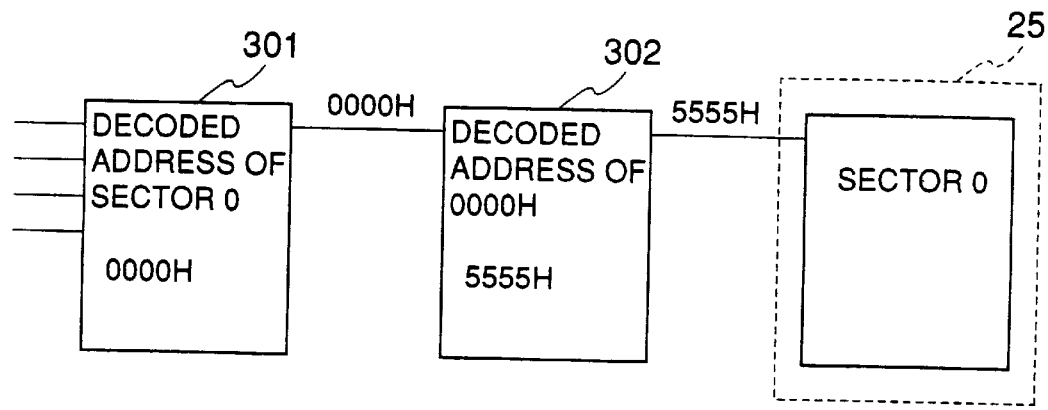
FIGS. 25A to 25C are block diagrams showing embodiments of doubling a decoding unit for address conversion according to the present invention.
Figure 25B:
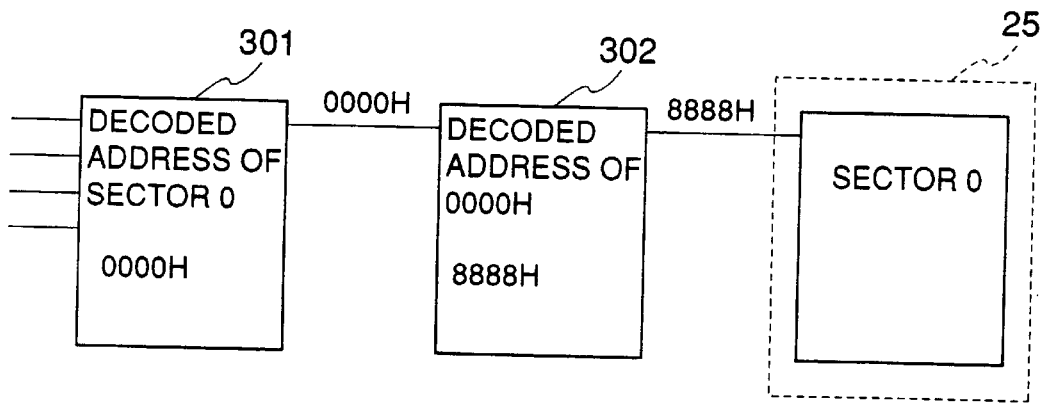
Figure 25C:
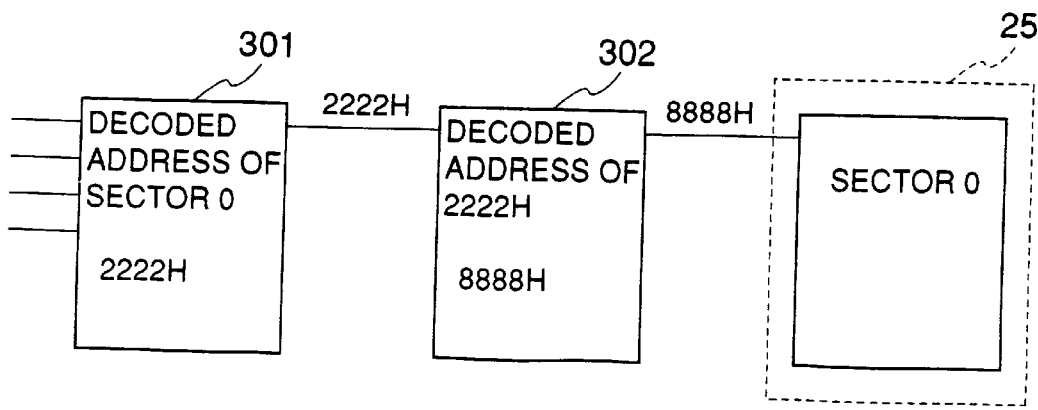

FIGS. 25A, 25B, and 25C show block diagrams of a decoding unit according to this embodiment. FIG. 25A shows a situation without a defective sector. FIG. 25B shows a situation with a defective sector. FIG. 25C shows a situation with the decoding unit having a defect. In FIGS. 25A, 25B, and 25C, a first decoding unit is referred to as 301, a second decoding unit as 302, and a flash memory as 25.

As shown in FIG. 25A, when a sector 0 of the flash memory 25 is functioning, the first decoding unit 301 generates an address of 0000h as a decoded address of the sector 0, and the second decoding unit 302 generates a physical address of 5555h as a decoded address of 0000h. This physical address indicates the sector 0 in the flash memory 25.

When the sector 0 becomes defective after erasing the flash memory 25 more than its limiting times, the physical address of the sector 0 is switched from 5555h to 8888h. This is shown in FIG. 25B by rewriting the second decoding unit 302 and switching a decoded physical address of 0000h from 5555h to 8888h.

When the second decoding unit 302 develops a defect therein after experiencing rewrite a number of times in the same manner, the first decoding unit 301 is rewritten to change a decoded address. That is, as shown in FIG. 25C, the first decoding unit 301 is rewritten to generate 2222h as a decoded address which is fed into the second decoding unit 302 to generate 8888h. Thus, even if the second decoding unit 302 develops a defect, a physical address of 8888h can be generated as a decoded address for the sector 0.

Making a decoding unit double, as described above, can extend life of the decoding unit by the power of two by rewriting one of the decoding units when the other decoding unit develops a defect.

Let the number of erasures for a sector to become defective be L, the number of erasures for the second decoding unit to develop a defect be M, and the number of erasures for the first decoding unit to develop a defect be N. Then, the number of erasures for an address error to occur is (N) (M) (L).

In general, a limiting number of erasures for flash EEPROMs is from a hundred thousand times to a million times, and a ten thousand times for EEPROM. In practice, thus, doubling a decoding unit is enough to ensure the reliability of the decoding unit.

F. Process of Estimating Writing Time

When writing data into flash memories, there is a need for an evacuation process and the like so that it takes a longer time to write data than when using conventional semiconductor memories.

In this embodiment, the length of time required for writing data is estimated so that estimation of consumed electric power and detection of a malfunction can be carried out.

Figure 26:
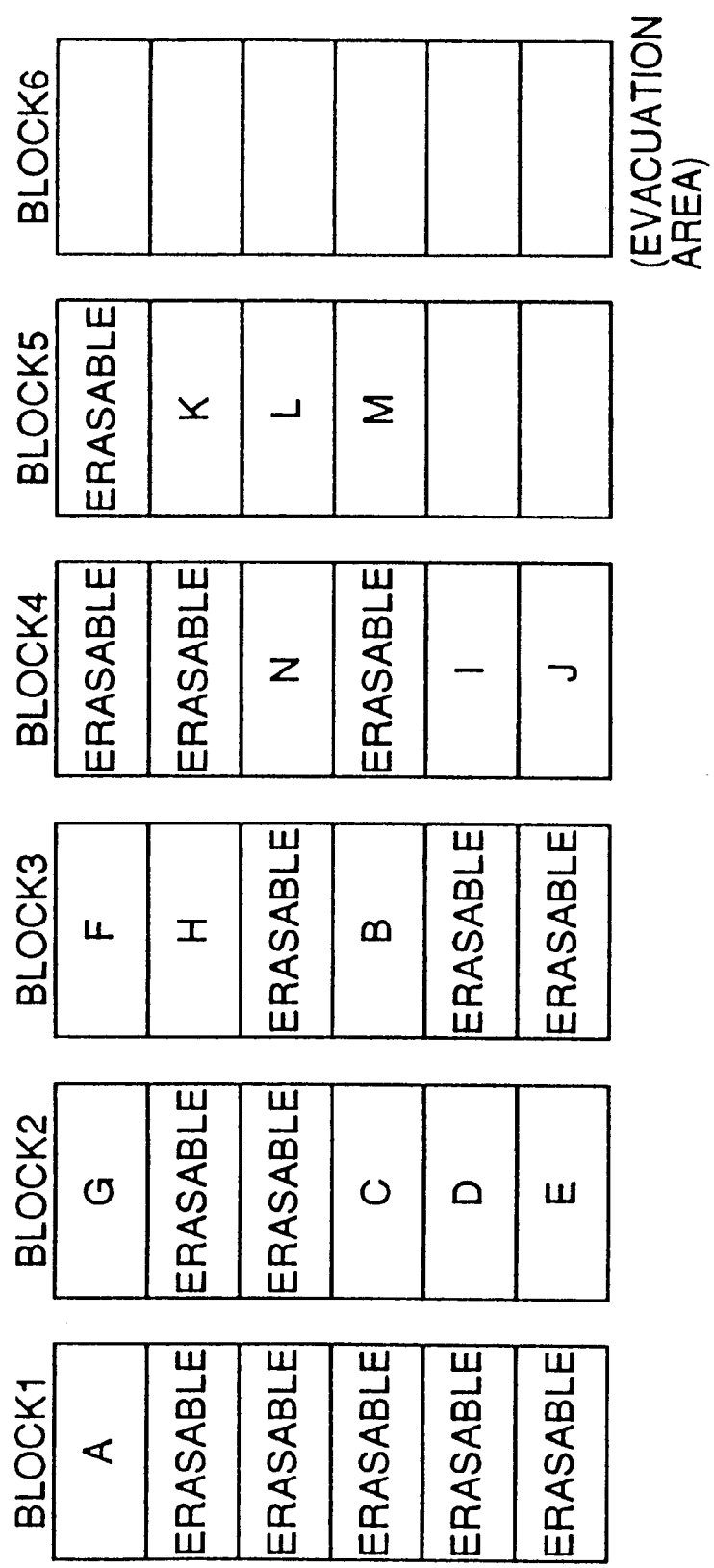
FIG. 26 is an illustrative drawing used for describing an embodiment of estimating the length of time required for writing data.

This embodiment will be described by using FIG. 26. FIG. 26 shows a memory in which data of three sectors is about to be written.

The host computer of FIG. 1 first sends to the CPU 22 the number of sectors to be written, and, then, the CPU 22 determines the length of time necessary for writing the data. When there are not enough free sectors as in FIG. 26, an evacuation process is carried out, and the necessary time for writing data can be obtained as follows.

$$t(\text{sec}) = 3 \times (\text{time length for writing one sector}) + (\text{time length for evacuating data})$$

The CPU 22 calculates the time length necessary for writing data by using the above equation, and returns the result to the host computer. The host computer calculates electric power W1 consumed during the time of writing by using t obtained above. W1 can be obtained by $$W1(W) = t / 3600 \times (\text{electric power at time of writing})$$

Also, the host computer reads available electric power W2 from a power supply, and writes data into the memory.

Furthermore, the host computer checks whether writing data into the memory is taking a longer time than t obtained above. If writing data does not finish exceeding t, the host computer concludes that there is a malfunction in the memory device, and notifies the user or takes a measure such as stopping the writing process.

Figure 27:
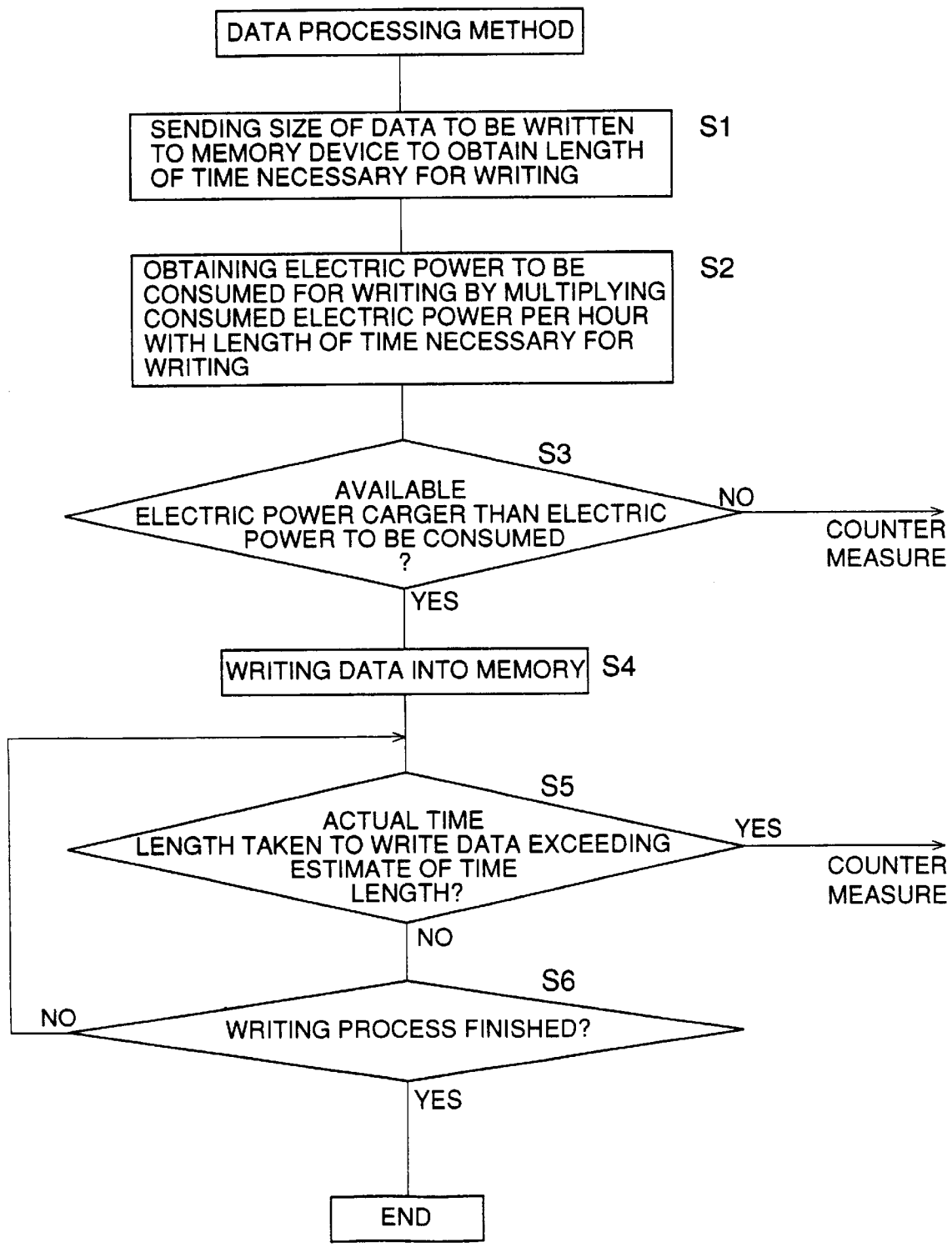
FIG. 27 is a flow chart showing a process of estimating the length of time required for writing data.

FIG. 27 shows a flow chart of a process carried out by the host computer in this embodiment. With reference to FIG. 27, this embodiment will be described below.

At a step S1, the size of the data to be written is sent to the memory device to obtain the length of time necessary for writing the data.

At a step S2, electric power to be consumed is obtained by multiplying consumed electric power per hour with the length of time necessary for writing. At a step S3, available electric power is compared with the electric power to be consumed, and, then, if available electric power is smaller, a counter measure is taken. If available electric power is larger, go to a step S4, where data is written into the memory. Then, at a step S5, a check is made whether the actual time length taken to write data is exceeding the estimate of that time length. If it is exceeding, a counter measure is taken. If it is not exceeding, go to a step S6, where it is checked if the writing process is finished. If it is not finished, go back to the step S5. If it is finished, this is the end of the process.

In this embodiment, as described above, electric power to be consumed during the time of writing data is estimated by obtaining the length of time necessary for writing, so that it can be determined whether available electric power is enough to carry out the writing process. Thus, termination of a writing process due to the lack of power supply can be avoided to enhance the reliability of the system.

Also, a malfunction of the memory device can be detected by comparing an estimate of the length of time necessary for writing data with the actual time length. The time length necessary for writing may be displayed to be shown to the user so that the user can decide if there is a malfunction in the memory device.

G. Enhancement of Reliability of Flag Check Process

Usually, one bit is allocated for one function of one flag, and the status of the flag is determined by a value of this one bit. However, the flash memory by its nature has a downside that the flash memory cannot be erased after experiencing excessive erasing. A memory cell suffering a defect becomes a permanent high level so as to be unable to return to a low level.

Accordingly, when one bit which is allocated for one function of one flag becomes defective, this flag cannot perform its designed role.

This embodiment prepares more than one bit for each of Erase Flag, Defect Flag, Parity Flag, etc. so as to enhance the reliability of the flag.

(1) First Embodiment

FIGS. 28A, 28B, and 28C are illustrations of a first embodiment. FIG. 28A shows a flag register, FIG. 28B a logical product circuit for obtaining a flag status, and FIG. 28C a truth table.

In this embodiment, for example, bits b0 and b4 are used for one function as shown in FIG. 28A. In order to check a flag status, a logical product of these two flags is obtained as shown in FIG. 28B.

Checking a flag status as described above makes it possible that a correct result for a flag status is obtained even if the bit b0 is fixed to a high level as shown in FIG. 28C. Similarly, a correct result is obtained when the bit b4 becomes a permanent high level.

(2) Second Embodiment

Figure 29A:
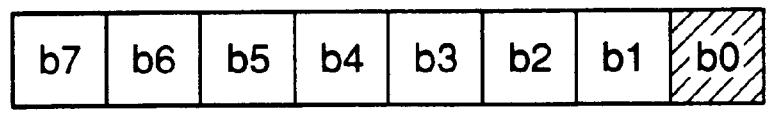
FIGS. 29A to 29C are illustrative drawings showing a second embodiment of a flag check process.
Figure 29B:
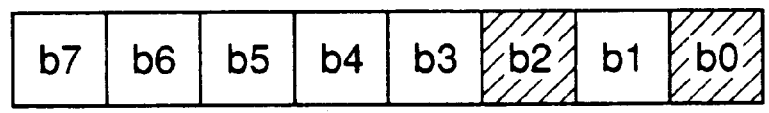
Figure 29C:
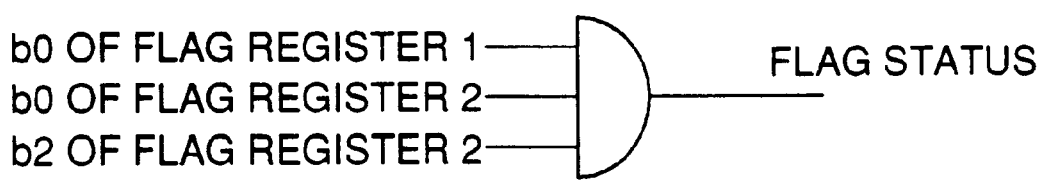

FIGS. 29A, 29B, and 29C are illustrations of a second embodiment.

FIG. 29A shows a first flag resister, FIG. 29B a second flag register, and FIG. 29C a logical product circuit for obtaining a flag status.

This embodiments assigns to one function a plurality of bits which are stored in different flag registers. For example, a bit b0 of the flag register of FIG. 29A is used for one function of one flag, and bits b0 and b2 of the flag register of FIG. 29B are also used for the same function as above.

In order to check a flag status, a logical product of those three flags is obtained by a logical product circuit of FIG. 29C.

Similarly to the first embodiment, this second embodiment can obtain a correct result even if some of the flags are fixed to a high level.

In the second embodiment, a check of a flag status is made by using a plurality of bits so that a correct result is obtained unless all the bits become defective. This leads to an enhancement on the reliability of a check result.

H. Memory Management Method of Reducing Size of Management Table

This embodiment shows a method that can simplify a management table and can use each block evenly in a flash memory system whose memory is comprised of a plurality of chips each with a plurality of blocks.

Also, in this embodiment, a data space in one chip is made smaller than the total memory space of the chip, and the remaining space is used for work blocks and backup blocks for a defective block. The data arrangement in a block is fixed. When rewriting data which already exists in a block, data in the block is evacuated to the SRAM 23 of FIG. 1, and the evacuated data along with the new data is written into a free block. The original block with the old data is erased upon the completion of writing.

Figure 30:
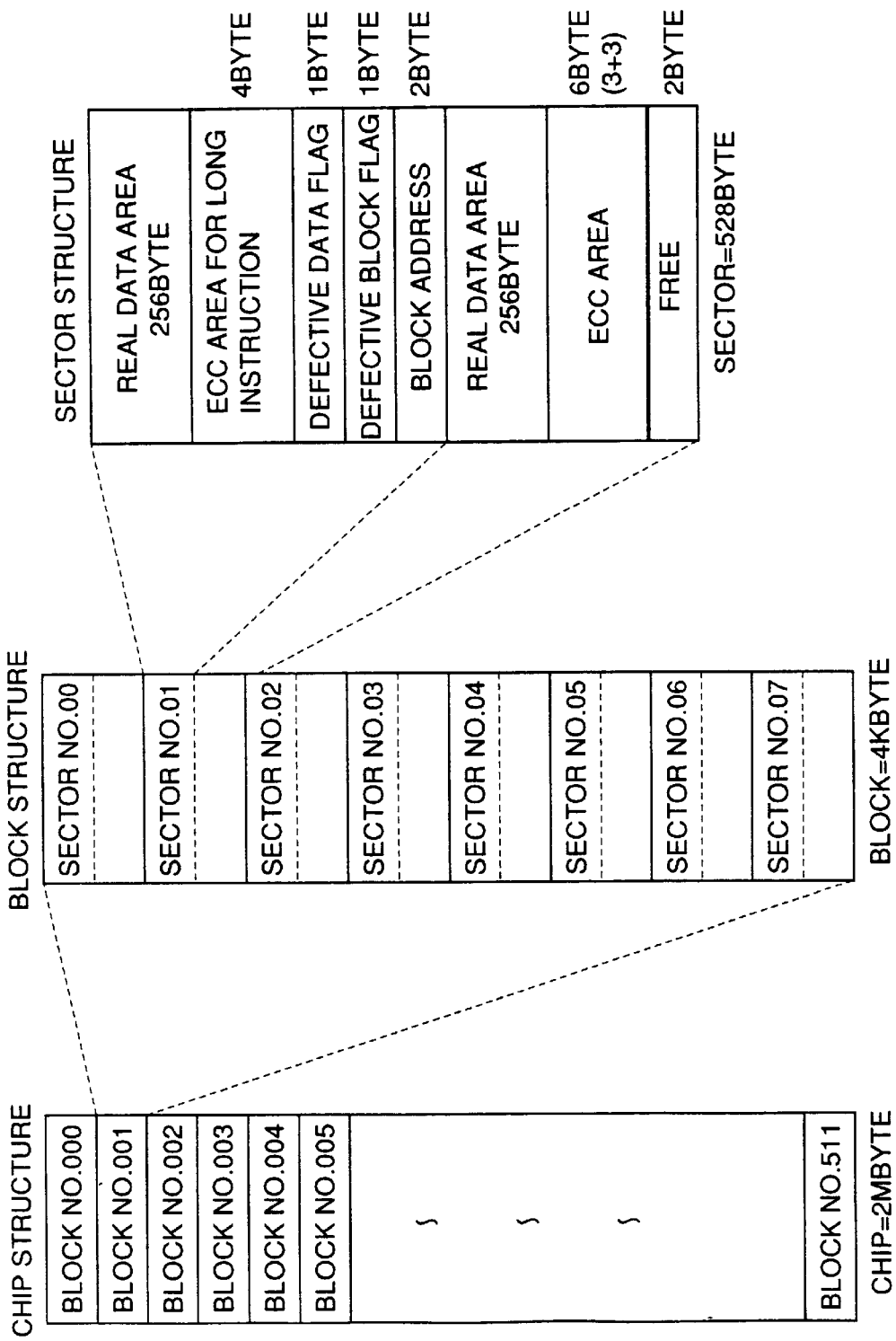
FIG. 30 is an illustration showing a structure of a memory area for an embodiment of reducing the size of a management table according to the present invention.

FIG. 30 shows a block diagram of a chip, a block, and a sector according to this embodiment. As shown in FIG. 30, the chip is 2 Mbytes which is divided into 512 blocks No.000 to No.511. Each block is 4 kbytes and is provided with eight 526 byte sectors No.00 to No.07. Here, a block No. and a sector No. in FIG. 30 indicate a physical address.

As shown in FIG. 30, each sector has a real data area of 256 byte, an ECC area for a long instruction, a defective data flag, a defective block flag, a block address, and an ECC area of 256 byte for the real data area.

The block address stores an address value in a block pointer stored in the SRAM 23, and the block address is written even when a sector is concluded not to have real data. By doing this, it can be decided that one with a larger number of sector addresses is correct data when putting leads in and out. When sector addresses are the same, it is decided by a true or false value of the ECC checksum.

The defective block flag shows the condition of the block. FFh means a normal block, and any value other than FFh means a defective block.

The defective data flag shows the condition of the data. FFh means normal data, and any value other than FFh means defective data.

The ECC area for a long instruction is 4 byte at the maximum. The ECC area for the real data area shows the condition of real data, and a value of this area is used for data correction and error detection.

FIGS. 31A to 31E show a writing process of this embodiment. This example of the embodiment shows a method of writing and managing data when there are five chips ranging from No.00 to No.04 each with four work blocks.

FIG. 31A shows chips with all the blocks erased. As shown in FIG. 31A, each chip has four work blocks Work01 to Work04, into which data is written. Although writing can be done by the unit of sector, it is impossible to write into a sector after writing into a higher sector like writing into a sector 004 after writing into a sector 005.

Also, it is impossible for data to be moved across chips, and a sector arrangement in a block is fixed. When the amount of data written does not fill 8 sectors as when sectors 00 to 05 are written into a logical block address 00, only the block address is written for the remaining sectors (sectors 06 and 07).

When writing data of a logical address n into a chip, the chip No. of the chip to write into is such integer k as in n=(8)((5)m+k)+l, where k, l, m, and n are all integers with K<5 and l<8. For example, when n is equal to 121, 121 is (8)((5)(3)+0)+1 so that k is equal to 0. Thus, data of a logical address 121 is written into the chip of No.0.

The writing process of this embodiment is as follows. When forty of sectors No.000 to No.039 (logical address) are written into the chips whose blocks are all erased as in FIG. 31A, the result is that Work01 of each chip contains the data as shown in FIG. 31B.

First, data is sent from the host computer to the SRAM 23. Since the sectors No.000 to 007 have logical block address 0, writing data starts from Work01 of the chip No.00, which Work01 is indicated by the write pointer. Here, logical block addresses are managed independently from chip to chip.

In this case, logical block address 00 does not exist prior to writing, Work01 of the chip No.00 is moved to a free block next to Work04.

When finishing writing 8 sectors, the write pointer is moved to indicate wok01 of the chip No.01. Then, the sectors No.008 to No.015 are written into Work01 of the chip No.01.

When the chip No.04 is finished to be written, the write pointer is moved to indicate Work02 of the chip No.00.

Then, the sectors No.120 to 191 (logical address) are written as shown in FIG. 31C.

First, data is sent from the host computer to the SRAM 23. Since the sector No.120 to 127 has logical block address 03, writing data starts from Work02 of the chip No.00, which is indicated by the write pointer. In the same manner as above, Work02 of the chip No.00 is moved to a free block next to Work01.

Then, the sectors No.128 to 191 are written into the chips No.00 to No.04 in the same manner as above.

FIG. 31D shows a result of writing the sector No.002 and 003 again into the memory shown in FIG. 31C.

First, data of the sector No.002 and 003 is sent to the SRAM 23. Since the sectors No.002 and No.003 have logical block address 00 already in existence, evacuation of old data is necessary. Since the sectors No.002 and 003 cannot be written into the first two sectors of logical block address 00, data of the old logical block address 00 is evacuated to the SRAM 23.

If data to be written corresponds to the first two sectors of a logical block address, the data is first written into a free block, and, then, data of the old logical block address is evacuated to be moved to the free block.

In this case, the old data 000, 001, 004, 005, 006, and 007 are evacuated to the SRAM 23, and, then, the new data 002 and 003 and the old data 000, 001, 004, 005, 006, and 007 are written into Work04 of the chip No.00 which is indicated by the write pointer. Writing order is 000, 001, 002, 003, 004, 005, 006, and 007.

Then, the old logical block 00 is erased, and Work4 is allocated to the old logical block 00 as shown in FIG. 31D.

Suppose that after writing two sectors as described above, power is turned off, and, then, turned on. The result is shown in FIG. 31E, where work blocks are allocated to blocks following the blocks in use. When allocating work blocks as in the above, if all the work blocks cannot be allocated after searching for free blocks by starting from a block following the block currently in use, a search for free blocks is made again by starting from the first block.

In the above process, if an error occurs at the time of erasing, the defective data flag is set to 00h so that the block is not used for reading or writing any more. That is, a counter measure in this case is to eliminate one work block. If there is no more work block, then the system becomes unable to write.

If an error occurs at the time of evacuating data, the defective block flag is put up, and, then, the data is written. Even if an error occurs at the time of reading a block, this block is treated as a defective block.

If an error occurs at the time of writing, the block is marked as a defective block. Data written in the block is evacuated, and defective block flags are put up. As in the case of writing data, defective block flags are put up for all the sectors of the block.

If an error occurs at the time of erasing, the block is marked as a defective block. In this case, not only defective block flags are set but also all areas including real data are change to 0 in the block. This process is applied to all the sectors of the block.

As described above, a chip which is used for writing is always the same chip for a given data, and data is written into blocks by shifting a designated block within the chip. Thus, data management is localized within a chip so that there is no need for a centralized management system to take care of all the memory space. This means that the size of a management table can be reduced and a writing speed can be increased.

Also, in this embodiment, data is written into a work block which is moved within a chip, so that each block can be used evenly.

Further, the present invention is not limited to these embodiments, but various variations and modifications may be made without departing from the scope of the present invention.

What is claimed is:

1. A method of writing and erasing data in a memory device with a memory area having a plurality of blocks each of said blocks having a plurality of sectors, said memory device erasing data by a unit of one block, writing data to said memory area by a unit of one sector once after erasing and invalidating erasable data of said memory area, said method comprising steps of:

assigning a main area to ones of said blocks of said memory area;

assigning a backup area to at least one block of said memory area other than said main area;

selecting a block from said main area;

evacuating necessary data in the selected block to said backup area;

erasing data in the selected block; and moving said necessary data in said backup area to said main area excluding the selected block.

2. The method as claimed in claim 1, wherein said predetermined order is a descending order of a number of sectors containing necessary data in one of said blocks.

3. The method as claimed in claim 2, wherein the blocks of said main area are arranged sequentially and said step of moving said necessary data moves said necessary data in said backup area to said main area by searching for a free sector from a block arranged immediately after the selected block in a data writing direction.

4. The method as claimed in claim 1, wherein the blocks of said main area are arranged sequentially and said step of moving said necessary data moves said necessary data in said backup area to said main area by searching for a free sector from a block arranged immediately after the selected block in a data writing direction.

5. The method as claimed in claim 1, further comprising a step of detecting lack of free sectors in an attempt to write data, which is performed before said step of evacuating necessary data.

6. The method as claimed in claim 1, further comprising a step of determining that a process of said steps is terminated during said step of moving said necessary data, when there is erasable data in said backup area after resuming said steps once terminated.

7. The method as claimed in claim 1, further comprising a step of determining that a process of said steps is terminated during said step of erasing data, when there is data and no erasable data in said backup area after resuming said steps once terminated.

8. The method as claimed in claim 1, further comprising a step of reconstructing an arrangement of said sectors by rewriting a decode table for managing said sectors when said backup area becomes unusable.

9. A method of writing and erasing data in a memory device with a memory area having a plurality of blocks, each of said blocks having a plurality of sectors, said memory device erasing data by a unit of one block, writing data to said memory area by a unit of one sector once after erasing and invalidating erasable data of said memory area, said method comprising the steps of:

assigning a main area to at least two blocks of said memory area;

assigning a backup area to one block other than said main area;

assigning an evacuation area to a block selected from said main area;

moving necessary data in said evacuation area to said backup area;

erasing data in said evacuation area;

moving necessary data in said backup area to said main area other than said evacuation area; and erasing data in said backup area.

10. The method as claimed in claim 9, wherein the blocks of said main area are arranged sequentially and said step of moving said necessary data moves said necessary data in said backup area to said main area by searching for a free sector from a block arranged immediately after the selected block in a data writing direction.

11. A method of writing and erasing data in a memory device with a memory area having a plurality of blocks, each of said blocks having a plurality of sectors, said memory device erasing data by a unit of one block and writing data to said memory area by a unit of one sector once after erasing and invalidating erasable data of said memory area, said method comprising steps of:

assigning a main area to at least two blocks of said memory area;

assigning a backup area to one block other than said main area;

assigning an evacuation area to a block selected from said main area;

detecting said evacuation area being defective;

reassigning said evacuation area to the other block of said main area;

moving necessary data in said evacuation area to said backup area;

erasing data in said evacuation area;

moving necessary data in said backup area to said main area other than said evacuation area; and erasing data in said backup area.

12. The method as claimed in claim 11, wherein the blocks of said main area are arranged sequentially and said step of moving said necessary data moves said necessary data in said backup area to said main area by searching for a free sector from a block arranged immediately after the selected block in a data writing direction.

13. A method of writing and erasing data in a memory device having a memory area including a plurality of blocks, a main area assigned to ones of said blocks of said memory area and a backup area assigned to at least one block of said memory area other than said main area, each of said blocks having a plurality of sectors, said memory device erasing data by a unit of one block and writing data by a unit of one sector, said method comprising the steps of:

assigning a block of said memory area as an evacuation area and assigning blocks of said memory area other than said evacuation area as writing area;

evacuating necessary data in a desired block of said writing area to said evacuation area;

reassigning said evacuation area as a writing area;

erasing data in said desired block; and reassigning said desired block as a new evacuation area.

14. The method as claimed in claim 13, further comprising steps of:

detecting said evacuation area being defective;

reassigning said evacuation area to the other block of said writing area;

moving necessary data in said evacuation area to said backup area;

erasing data in said evacuation area;

moving necessary data in said backup area to said main area other than said evacuation area; and erasing data in said backup area.

15. The method as claimed in claim 14, wherein the blocks of said main area are arranged sequentially and said step of moving said necessary data moves said necessary data in said backup area to said main area by searching for a free sector from a block arranged immediately after the selected block in a data writing direction.

16. A memory controller for controlling a memory device having a memory area including a plurality of blocks, a main area assigned to ones of said blocks of said memory area and a backup area assigned to at least one block of said memory area other than said main area, each of said blocks having a plurality of sectors, said memory controller comprising:

evacuating means for evacuating necessary data in a selected block of said main area to said backup area;

erasing means for erasing data in the selected block by a unit of one block; and moving means for moving said necessary data in said backup area to said main area excluding the selected block.

17. The memory controller as claimed in claim 16, wherein the blocks of said main area are arranged sequentially and said moving means moves said necessary data in said backup area to said main area by searching for a free sector from a block arranged immediately after the selected block in a data writing direction.

18. The memory controller as claimed in claim 16, wherein said memory device is a flash memory device.

19. A memory device comprising:

a memory area having a plurality of blocks, each of said blocks having a plurality of sectors;

a main area assigned to ones of said blocks of said memory area;

a backup area assigned to at least one block of said memory area other than said main area;

evacuating means for evacuating necessary data in a selected block of said main area to said backup area;

erasing means for erasing data in the selected block by a unit of one block; and moving means for moving said necessary data in said backup area to said main area excluding the selected block.

20. The memory device claim in claim 19, wherein the blocks of said main area are arranged sequentially and said moving means moves said necessary data in said backup area to said main area by searching for a free sector form a block arranged immediately after the selected block in a data writing direction.

21. The memory device as claimed in claim 19, wherein said memory device is a flash memory device.

22. A memory controller for controlling a memory device having a memory area including a plurality of blocks, a main area assigned to ones of said blocks of said memory area and a backup area assigned to at least one block of said memory area other than said main area, each of said blocks having a plurality of sectors, said controller comprising:

assigning means for assigning a block of said main area as an evacuation area and for assigning blocks of said main area other than said evacuation area as a writing area;

writing means for writing data to said writing area by a unit of one sector;

evacuating means for evacuating necessary data in a desired block of said writing area to said evacuation area;

erasing means for erasing data in said desired block by a unit of one block; and reassigning means for reassigning said evacuation area to which said necessary data is evacuated as a writing area and for reassigning said desired block as a new evacuation area.

23. The memory controller as claimed in claim 22, wherein said evacuation means evacuates data in said desired block to said backup area when said evacuation area is defective.

24. The memory controller as claimed in claim 23, further comprising moving means for moving said necessary data in said backup area to said writing area.

25. The memory controller as claimed in claim 24, wherein the blocks of said main area are arranged sequentially and said moving means moves said necessary data to said writing area by searching a free sector from a block arranged immediately after said desired block in a data writing direction.

26. A memory device comprising:
- a memory area including a plurality of blocks each of said blocks having a plurality of sectors;
- a main area assigned to ones of said blocks of said memory area;
- a backup area assigned to at least one block of said memory area other than said main area;
- assigning means for assigning a block of said memory area as an evacuation area and for assigning blocks of said memory area other than said evacuation area as writing area;
- writing means for writing data to said writing area by a unit of one sector;
- evacuating means for evacuating necessary data in a desired block of said writing area to said evacuation area;
- erasing means for erasing data in said desired block by a unit of one block; and
- reassigning means for reassigning said evacuation area to which said necessary data is evacuated as a writing area and for reassigning said desired block as a new evacuation area.

27. The memory device as claimed in claim 26, wherein said evacuation means evacuates data in said desired block to said backup area when said evacuation area is defective.

28. The memory device as claimed in claim 27, further comprising moving means for moving said necessary data in said backup area to said writing area.

29. The memory device as claimed in claim 28, wherein the blocks of said main area are sequentially and said moving means moves said necessary data to said writing area by searching a free sector from a block arranged immediately after said desired block in a data writing direction.

* * * * *

UNITED STATES PATENT AND TRADEMARK OFFICE
CERTIFICATE OF CORRECTION

PATENT NO. : 6,125,424
DATED : September 26, 2000
INVENTOR(S) : Shinpei KOMATSU et al.

It is certified that error appears in the above-identified patent and that said Letters Patent is hereby corrected as shown below:

Col. 28,      line 34, change "claim" (first occurrence) to --claimed--;
               line 37, change "form" to --from--.

Signed and Sealed this

First Day of May, 2001

Attest:

NICHOLAS P. GODICI

Attesting Officer      Acting Director of the United States Patent and Trademark Office